(12) United States Patent
Suzuki et al.

(10) Patent No.: US 10,234,976 B2
(45) Date of Patent: Mar. 19, 2019

(54) FORCE DETECTION APPARATUS

(71) Applicant: Japan Display Inc., Tokyo (JP)

(72) Inventors: Takafumi Suzuki, Tokyo (JP); Shota Hosaka, Tokyo (JP); Yosuke Nakamori, Tokyo (JP)

(73) Assignee: JAPAN DISPLAY INC., Tokyo (JP)

( * ) Notice: Subject to any disclaimer, the term of this patent is extended or adjusted under 35 U.S.C. 154(b) by 0 days.

(21) Appl. No.: 15/658,956

(22) Filed: Jul. 25, 2017

(65) Prior Publication Data

US 2018/0032198 A1 Feb. 1, 2018

(30) Foreign Application Priority Data

Jul. 29, 2016 (JP) .................. 2016-150607

(51) Int. Cl.
| | | |
|---|---|---|
| *G06F 3/041* | (2006.01) | |
| *G02F 1/1343* | (2006.01) | |
| *G02F 1/1333* | (2006.01) | |
| *G06F 3/044* | (2006.01) | |
| *H01L 27/32* | (2006.01) | |

(Continued)

(52) U.S. Cl.
CPC ......... *G06F 3/0414* (2013.01); *G02B 6/0046* (2013.01); *G02B 6/0055* (2013.01); *G02F 1/134363* (2013.01); *G06F 3/044* (2013.01); *G06F 3/0412* (2013.01); *G06F 3/0416* (2013.01); *H01L 27/323* (2013.01); *G02F 1/13338* (2013.01); *G02F 2001/134372* (2013.01); *G06F 2203/04105* (2013.01); *G06F 2203/04108* (2013.01); *H01L 51/5206* (2013.01); *H01L 51/5221* (2013.01)

(58) Field of Classification Search
CPC ...... G06F 3/0414; G06F 3/044; G06F 3/0416; G06F 2203/04108; G02F 1/134363; G02F 1/13338; G02F 2001/134372; H01L 27/323; H01L 51/5206; H01L 51/5221; G02B 6/0055
See application file for complete search history.

(56) References Cited

U.S. PATENT DOCUMENTS

2014/0055702 A1* 2/2014 Park ................ G02F 1/136286
349/43
2016/0098110 A1* 4/2016 Choi .................... G06F 3/0416
345/173

(Continued)

FOREIGN PATENT DOCUMENTS

JP 2015-127657 A 7/2015

*Primary Examiner* — Andrew Sasinowski
(74) *Attorney, Agent, or Firm* — K&L Gates LLP

(57) ABSTRACT

According to an aspect, a force detection apparatus includes: a first electrode facing an input surface to which an object to be detected applies a force; a second electrode facing the first electrode across a first layer deformable by the force; a conductor facing the second electrode across a second layer deformable by the force; and a force detection controller calculates a force signal value indicating the force, based on a first influence amount and a second influence amount, the first influence amount being an amount of influence added by the force to first capacitance between the first electrode and the second electrode, and the second influence amount being an amount of influence added by the force to second capacitance between the second electrode and the conductor.

13 Claims, 31 Drawing Sheets

(51) Int. Cl.
*F21V 8/00* (2006.01)
*H01L 51/52* (2006.01)

(56) References Cited

U.S. PATENT DOCUMENTS

| | | | |
|---|---|---|---|
| 2016/0170535 A1* | 6/2016 | Iwamoto | G06F 3/044 345/174 |
| 2016/0202800 A1* | 7/2016 | Itaya | G06F 3/044 345/174 |
| 2016/0320914 A1 | 11/2016 | Tachikawa et al. | |
| 2017/0262112 A1* | 9/2017 | Noguchi | G06F 3/0414 |
| 2017/0315003 A1* | 11/2017 | Lai | G01L 1/2268 |

* cited by examiner

FORCE DETECTION APPARATUS

CROSS-REFERENCE TO RELATED APPLICATIONS

This application claims priority from Japanese Application No. 2016-150607, filed on Jul. 29, 2016, the contents of which are incorporated by reference herein in its entirety.

BACKGROUND

1. Technical Field

The present invention relates to a force detection apparatus capable of detecting force.

2. Description of the Related Art

In recent years, touch detection apparatuses, what are called touch panels, capable of detecting an external in-proximity object, have attracted attention. A touch panel is mounted on a display apparatus such as a liquid crystal display apparatus or integrated with the display apparatus, and the apparatus is used as a display apparatus with a touch detection function. The display apparatus with a touch detection function displays various button images and the like in the display apparatus to enable an information input, using the touch panel as a substitute for typical mechanical buttons.

Force detection apparatuses capable of detecting force, in addition to touch, have also been used.

As a related technology, Japanese Patent Application Laid-open No. 2015-127657 describes an input apparatus that linearizes an output characteristic of a pressure sensor, using an inverse function of an output characteristic function of the pressure sensor.

There is a force detection apparatus that detects force on the basis of change of capacitance between a first conductor and a second conductor, the first conductor being provided on an input surface side of a touch panel, and the second conductor being provided on a back surface side of the touch panel. When force is applied to the input surface of the detection apparatus, the touch panel is bent, an air layer between the first conductor and the second conductor becomes thin, a distance between the first conductor and the second conductor becomes short, and the capacitance between the first conductor and the second conductor is increased. The force detection apparatus outputs a force signal value on the basis of the change of the capacitance.

By the way, if only the air layer exists between the first conductor and the second conductor, the thickness of the air layer reaches zero when strong force is applied to the input surface, and thus the detection apparatus cannot detect the strong force. Therefore, providing a cushion layer between the first conductor and the second conductor, in addition to the air layer, can be considered. In doing so, when weak force is applied to the input surface, only the air layer becomes thin and the cushion layer is not deformed. Therefore, the force detection apparatus can favorably detect the weak force. When the strong force is applied to the input surface, the thickness of the air layer reaches zero and the cushion layer is elastically deformed according to the force. Therefore, the force detection apparatus can favorably detect the strong force.

In a first range in which only the air layer becomes thin and the cushion layer is not deformed, a relationship between the force and the force signal value becomes linear. Similarly, even in a second range in which the thickness of the air layer reaches zero and the cushion layer is elastically deformed according to the force, the relationship between the force and the force signal value becomes linear. However, permittivity of the air layer and permittivity of the cushion layer are different. Further, the degree of change of the thickness of the air layer with respect to the force and the degree of change of the thickness of the cushion layer with respect to the force are different. Therefore, an inflection point occurs in the relationship between the force and the force signal value in a boundary between the first range and the second range. Therefore, the relationship between the force and the force signal value is not linear in the entire range that is a combination of the first range and the second range. Therefore, the force detection apparatus cannot favorably detect the force.

For the foregoing reasons, there is a need for a force detection apparatus that can favorably detect force.

SUMMARY

According to an aspect, a force detection apparatus includes: a first electrode facing an input surface to which an object to be detected applies a force; a second electrode facing the first electrode across a first layer deformable by the force; a conductor facing the second electrode across a second layer deformable by the force; and a force detection controller calculates a force signal value indicating the force, based on a first influence amount and a second influence amount, the first influence amount being an amount of influence added by the force to first capacitance between the first electrode and the second electrode, and the second influence amount being an amount of influence added by the force to second capacitance between the second electrode and the conductor.

DETAILED DESCRIPTION

Embodiments of the present invention will be described in detail with reference to the drawings. The present invention is not limited by content described in the embodiments below. Configuration elements described below include elements easily arrived at by a person skilled in the art and elements substantially the same. Further, the configuration elements described below can be appropriately combined. What is disclosed herein is merely an example, and appropriate modifications which maintain the points of the invention, and which can be easily conceived by a person skilled in the art, are obviously included in the scope of the present invention. To make description more clear, the drawings may be schematically illustrated in the width, thickness, shapes, and the like of respective portions, compared with actual forms. However, such illustration is merely an example, and does not limit the construction of the present invention. In the present specification and drawings, elements similar to those described with respect to the drawings that have already been mentioned are denoted with the same reference signs, and detailed description may be appropriately omitted.

In this disclosure, when an element is described as being "on" another element, the element can be directly on the other element, or there can be one or more elements between the element and the other element.

Embodiment

Figure 1:
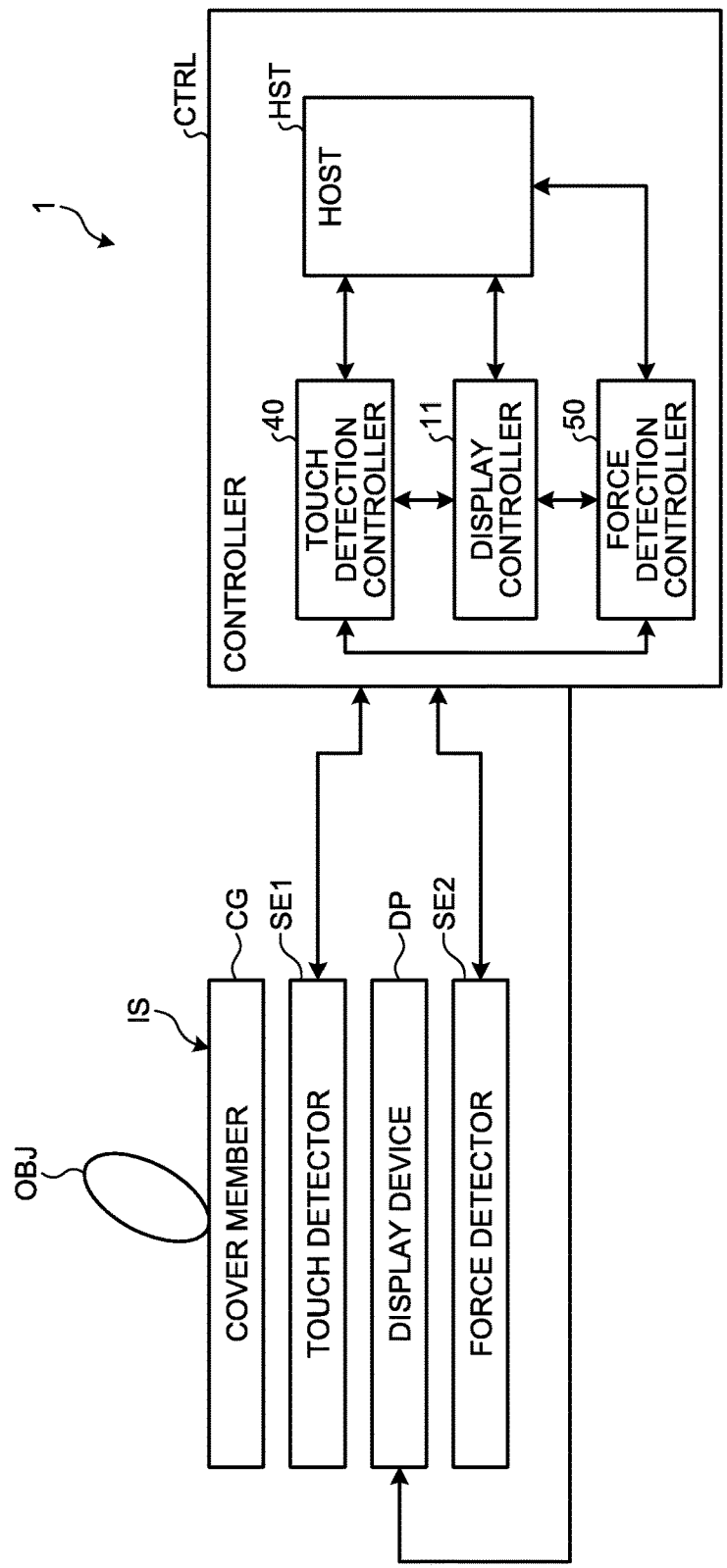
FIG. 1 is a block diagram illustrating a configuration of a display apparatus with a touch detection function according to an embodiment.

FIG. 1 is a block diagram illustrating a configuration of a display apparatus with a touch detection function according to an embodiment of the present invention.

A display apparatus 1 with a touch detection function according to the present embodiment includes a touch detector SE1, a display device DP, a force detector SE2, and a controller CTRL. A combination of the force detector SE2 and the controller CTRL in the display apparatus 1 with a touch detection function is an example of a force detection apparatus of the present invention.

The touch detector SE1 detects contact or proximity of an object to be detected OBJ with or to an input surface IS of a cover member CG. To be specific, the touch detector SE1 outputs a signal value according to the contact with or proximity to a region in the input surface IS, with which the object to be detected OBJ overlaps, in a direction perpendicular to the input surface IS, to the controller CTRL.

The object to be detected OBJ may be a first-type object that is deformed when coming in contact with the input surface IS, or may be a second-type object that is not deformed or has less deformation than the first-type object when coming in contact with the input surface IS. Examples of the first-type object include, but are not limited to, a finger. Examples of the second-type object include, but are not limited to, a resin or metal stylus pen.

The number of the objects to be detected that are detectable by the touch detector SE1 is not limited to one. The touch detector SE1 may be configured to detect two or more objects to be detected.

Examples of the touch detector SE1 include, but are not limited to, a capacitive sensor and a resistive film sensor. Examples of the capacitive sensor include a mutual-capacitive sensor and a self-capacitive sensor.

The display device DP displays an image toward an input surface IS side. Examples of the display device DP include, but are not limited to, a liquid crystal display device and an organic electro-luminescence display device.

The touch detector SE1 and the display device DP may be integrated into an in-cell-type or hybrid-type device. The touch detector SE1 and the display device DP may make up an on-cell-type device having the touch detector SE1 mounted on the display device DP.

The force detector SE2 detects force applied by the object to be detected OBJ to the input surface IS. To be specific, the force detector SE2 outputs a signal according to the force applied by the object to be detected OBJ to the input surface IS, to the controller CTRL.

Examples of the force detector SE2 include a capacitive sensor.

The controller CTRL calculates a force signal value that indicates force on the basis of the signal output from the force detector SE2.

The controller CTRL includes a display controller 11, a touch detection controller 40, a force detection controller 50, and a host HST.

Examples of the display controller 11 include an IC chip mounted on a glass substrate of the display device DP. Examples of the touch detection controller 40 include an IC chip mounted on a printed substrate (for example, a flexible printed substrate) coupled with the glass substrate of the display device DP. Examples of the force detection controller 50 include an IC chip mounted on the printed substrate coupled with the glass substrate of the display device DP. Examples of the host HST include a central processing unit (CPU). The display controller 11, the touch detection controller 40, the force detection controller 50, and the host HST control the touch detector SE1, the display device DP, and the force detector SE2 in cooperation with one another.

Processing for calculating the force signal value, executed by the controller CTRL, may be executed by the display controller 11, by the touch detection controller 40, by the force detection controller 50, by the host HST, or by two or more of the display controller 11, the touch detection controller 40, the force detection controller 50, and the host HST in cooperation with one another.

Hereinafter, specific configuration examples of the touch detector SE1, the display device DP, and the force detector SE2 will be described. However, the embodiments are not limited to these configuration examples.

1. Configuration Examples of Touch Detector and Display Device

Figure 2:
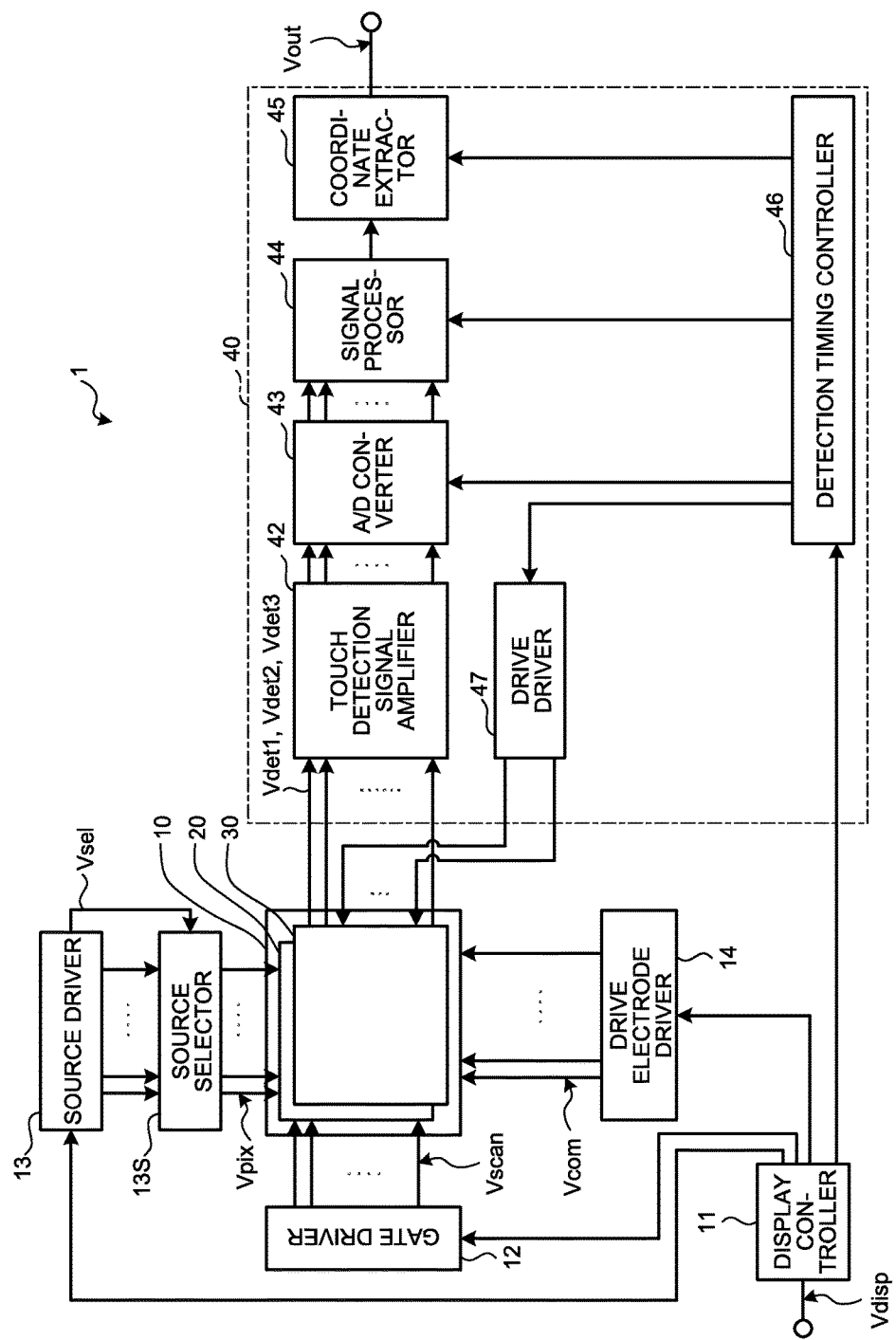
FIG. 2 is a block diagram illustrating configuration examples of a touch detector and a display device of the display apparatus with a touch detection function according to the embodiment.

FIG. 2 is a block diagram illustrating configuration examples of the touch detector and the display device of the display apparatus with a touch detection function according to the embodiment. The display apparatus 1 with a touch detection function illustrated in FIG. 2 is an apparatus that detects coordinates and a contact area of the object to be detected OBJ by mutual-capacitive detection or self-capacitive detection.

The display apparatus 1 with a touch detection function includes a display device 10 with a touch detection function, the display controller 11, a gate driver 12, a source driver 13, a source selector 13S, a drive electrode driver 14, and the touch detection controller 40.

The display device 10 with a touch detection function is an in-cell-type or hybrid-type device obtained by incorporating a capacitive touch detection device 30 into a liquid crystal display device 20 such that the liquid crystal display device 20 and the capacitive touch detection device 30 are integrated. The liquid crystal display device 20 is a device that uses a liquid crystal display element as a display element. Incorporating the capacitive touch detection device 30 into the liquid crystal display device 20 such that the liquid crystal display device 20 and the capacitive touch detection device 30 are integrated includes, for example, using several members such as a substrate and electrodes for both the liquid crystal display device 20 and the touch detection device 30.

The liquid crystal display device 20 corresponds to the display device DP of FIG. 1. The touch detection device 30 corresponds to the touch detector SE1 of FIG. 1.

The display device 10 with a touch detection function may be an on-cell-type device having the capacitive touch detection device 30 mounted on the upper side of the liquid crystal display device 20 that uses a liquid crystal display element as a display element. In a case of the on-cell-type device, the touch detection device 30 may be provided directly on the liquid crystal display device 20, or the touch detection device 30 may be provided above the liquid crystal display device 20 and an intervening layer, instead of directly on the liquid crystal display device 20.

In the present configuration example, the liquid crystal display device 20 is employed as the display device DP. However, the display device DP may employ an organic EL element. In this case, one of an anode and a cathode that form the organic EL element may be used as a drive electrode COML related to touch detection described below.

The liquid crystal display device 20 is a device that sequentially scans one horizontal line at a time and performs display, according to a scanning signal Vscan supplied from the gate driver 12, as described below.

The display controller 11 is a circuit that respectively supplies control signals to the gate driver 12, the source driver 13, the drive electrode driver 14, and the touch detection controller 40 on the basis of a video signal Vdisp supplied from the host HST, and controls the aforementioned drivers and controller to be operated in synchronization with one another. The display controller 11 generates an image signal Vsig from the video signals Vdisp of one horizontal line. The image signal Vsig is obtained by time-division multiplexing pixel signals Vpix for sub-pixels SPix of the liquid crystal display device 20. The display controller 11 supplies the generated image signal Vsig to the source driver 13.

The controller CTRL in the present disclosure includes the display controller 11, the gate driver 12, the source driver 13, and the drive electrode driver 14.

The gate driver 12 has a function to sequentially select one horizontal line to be displayed and driven, of the display device 10 with a touch detection function, on the basis of the control signal supplied from the display controller 11.

The source driver 13 is a circuit that supplies the pixel signal Vpix to pixels Pix (sub-pixels SPix) of the display device 10 with a touch detection function, on the basis of the control signal supplied from the display controller 11. For example, six-bit image signals Vsig of red (R), green (G), and blue (B) are provided to the source driver 13.

The source driver 13 receives the image signal Vsig from the display controller 11, and supplies the image signal Vsig to the source selector 13S. The source driver 13 generates a switch control signal Vsel, which is necessary to separate the pixel signals Vpix multiplexed into the image signal Vsig, and supplies the generated switch control signal Vsel together with the pixel signals Vpix to the source selector 13S. The source selector 13S can reduce the number of wires between the source driver 13 and the display controller 11. The source selector 13S may not be included. A part of control of the source driver 13 may be performed by the display controller 11, and only the source selector 13S may be arranged.

The drive electrode driver 14 is a circuit that supplies drive signals Vcom to the drive electrode COML described below of the display device 10 with a touch detection function, on the basis of the control signal supplied from the display controller 11. The drive signals Vcom include a drive signal (touch drive signal) Vcomtm for mutual-capacitive touch detection, a drive signal Vcomts2 for self-capacitive touch detection, and a display drive voltage VcomDC as a display voltage.

The touch detection controller 40 includes a drive driver 47 that supplies a drive signal Vcomts1 to a touch detection electrode TDL described below in performing a self-capacitive touch detection operation.

The touch detection device 30 is operated on the basis of a basic principle of mutual-capacitive touch detection, and the touch detection electrode TDL outputs a detection signal Vdet1. The touch detection device 30 is operated on the basis of a basic principle of self-capacitive touch detection, and the touch detection electrode TDL outputs a detection signal Vdet2. The touch detection device 30 is operated on the basis of the basic principle of self-capacitive touch detection, and the drive electrode COML outputs a detection signal Vdet3.

The touch detection device 30 can be configured to perform touch detection only using mutual-capacitive touch detection technology. However, to favorably reduce an influence of moisture beads and the like adhering to the input surface IS and to favorably detect a stylus pen or the like, the touch detection device 30 executes both the mutual-capacitive touch detection and the self-capacitive touch detection in the present configuration example. Note that the embodiments are not limited to the case of executing both the mutual-capacitive touch detection and the self-capacitive touch detection.

The basic principle of mutual-capacitive touch detection of the display apparatus 1 with a touch detection function of the present configuration example will be described with reference to FIGS. 3 to 5.

Figure 3:
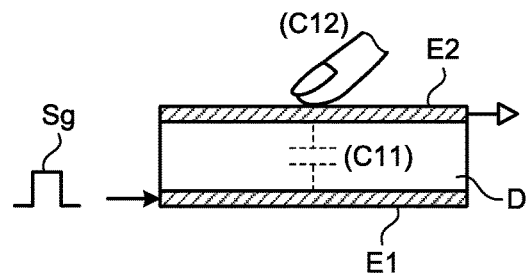
FIG. 3 is an explanatory diagram illustrating a state in which an object to be detected is in contact with or in proximity to a touch detection electrode, for describing a basic principle of mutual-capacitive touch detection.

FIG. 3 is an explanatory diagram illustrating a state in which an object to be detected is in contact with or in proximity to a touch detection electrode, for describing the basic principle of mutual-capacitive touch detection. FIG. 4 is an explanatory diagram illustrating an example of an equivalent circuit of mutual-capacitive touch detection. FIG. 5 is a diagram illustrating an example of waveforms of the drive signal and the detection signal of mutual-capacitive touch detection. FIG. 4 also illustrates a detection circuit.

For example, as illustrated in FIG. 3, a capacitance element C11 includes a drive electrode E1 and a touch detection electrode E2 that are a pair of electrodes arranged to face each other across a dielectric D. As illustrated in FIG. 4, the capacitance element C11 has one end coupled with an alternating-current signal source (drive signal source) S and the other end coupled with a voltage detector (touch detector) DET. The voltage detector DET is an integrated circuit included in a touch detection signal amplifier 42 illustrated in FIG. 2, for example.

When an alternating-current rectangular wave Sg of a predetermined frequency (a frequency on the order of several kHz to several hundreds of kHz, for example) is applied from the alternating-current signal source S to the drive electrode E1 (one end of the capacitance element C11), an output wave form (detection signal Vdet1) appears through the voltage detector DET coupled with the touch detection electrode E2 (the other end of the capacitance element C11). This alternating-current rectangular wave Sg corresponds to the drive signal Vcomtm, described below.

In a state in which the object to be detected is not in contact with or in proximity to the touch detection electrode E2 (non-contact state), a current $I_0$ according to a capacitance value of the capacitance element C11 flows with charge and discharge from/to the capacitance element C11. As illustrated in FIG. 5, the voltage detector DET converts variation of the current $I_0$ according to the alternating-current rectangular wave Sg into variation of voltage (a waveform $V_0$ in the solid line).

Meanwhile, in a state in which the object to be detected is in contact with (or in proximity to) the touch detection electrode E2 (in a contact state), capacitance C12 formed with a finger is in contact with or in proximity to the touch detection electrode E2, as illustrated in FIG. 3, so that fringe capacitance between the drive electrode E1 and the touch detection electrode E2 is interrupted. Due to this, the capacitive element functions as a capacitance element C11' having a smaller capacitance value than the capacitance element C11. Then, as seen in the equivalent circuit illustrated in FIG. 4, a current $I_1$ flows in the capacitance element C11'.

Figure 5:
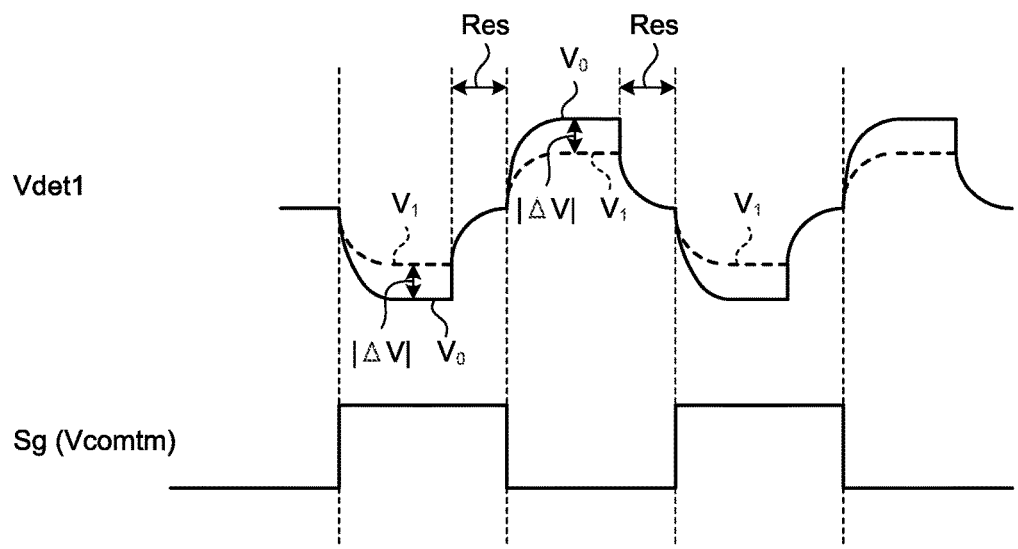
FIG. 5 is a diagram illustrating an example of waveforms of a drive signal and a detection signal of mutual-capacitive touch detection.

As illustrated in FIG. 5, the voltage detector DET converts variation of the current $I_1$ according to the alternating-current rectangular wave Sg into variation of voltage (the waveform $V_1$ in the dotted line). In this case, the waveform $V_1$ has smaller amplitude than the above-described waveform $V_0$. Accordingly, an absolute value $|\Delta V|$ of a voltage difference between the waveform $V_0$ and the waveform $V_1$ is changed according to an influence of the object to be detected. To accurately detect the absolute value $|\Delta V|$ of a voltage difference between the waveform $V_0$ and the waveform $V_1$, it is more favorable that the voltage detector DET performs an operation provided with a period Res to reset charge and discharge of a capacitor in accordance with the frequency of the alternating-current rectangular wave Sg by switching in the circuit.

Referring back to FIG. 2, the touch detection device 30 sequentially scans one detection block at a time according to the drive signal Vcomtm supplied from the drive electrode driver 14, and outputs the detection signal Vdet1.

Next, the basic principle of self-capacitive touch detection of the display apparatus 1 with a touch detection function of the present configuration example will be described with reference to FIGS. 6 to 9.

Figure 6:
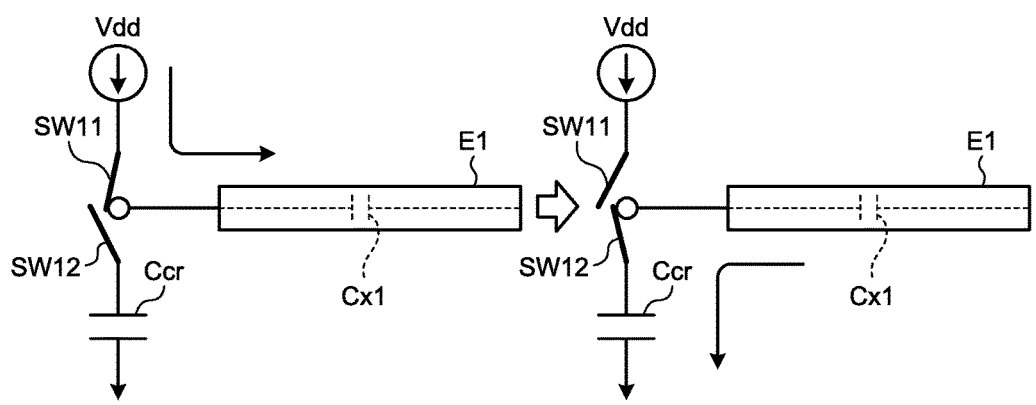
FIG. 6 is an explanatory diagram illustrating a state in which an object to be detected is neither in contact with nor in proximity to a detection electrode, for describing a basic principle of self-capacitive touch detection.
Figure 7:
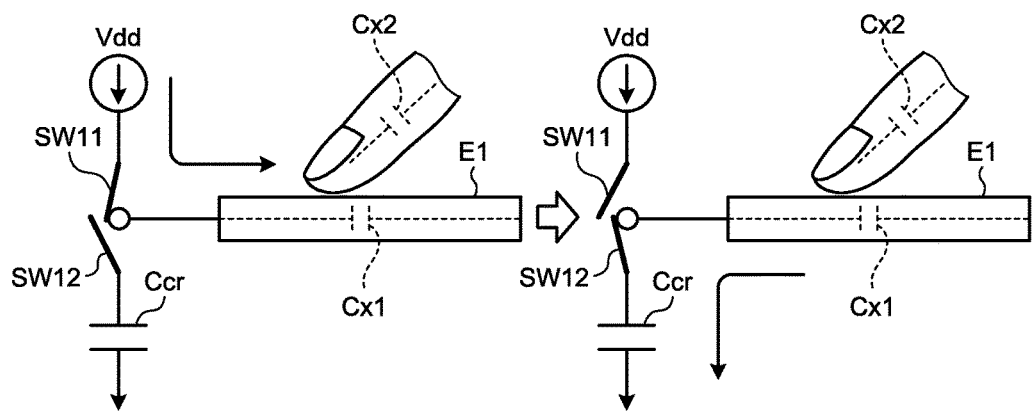
FIG. 7 is an explanatory diagram illustrating a state in which an object to be detected is in contact with or in proximity to the detection electrode, for describing the basic principle of self-capacitive touch detection.
Figure 8:
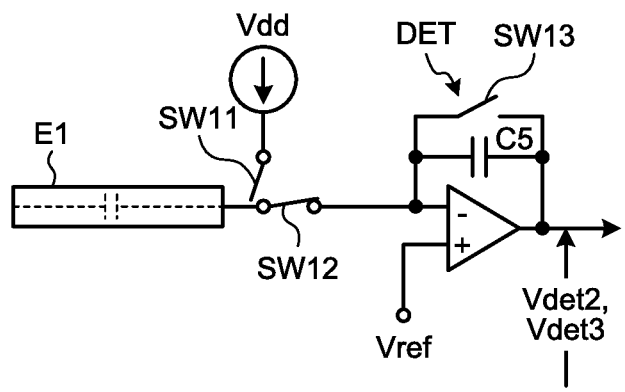
FIG. 8 is an explanatory diagram illustrating an example of an equivalent circuit of self-capacitive touch detection.
Figure 9:
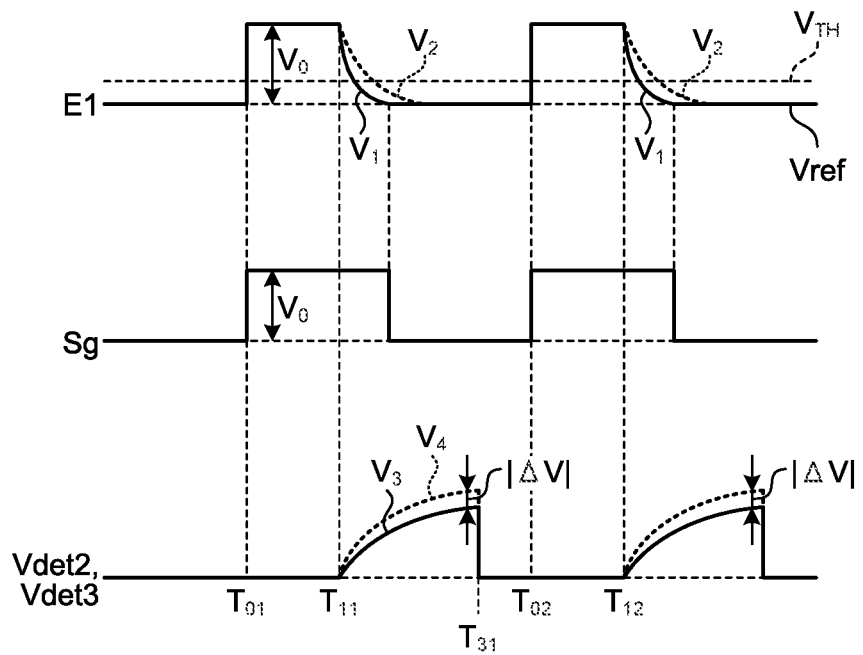
FIG. 9 is a diagram illustrating an example of waveforms of a drive signal and a detection signal of self-capacitive touch detection.

FIG. 6 is an explanatory diagram illustrating a state in which an object to be detected is neither in contact with nor in proximity to a detection electrode, for describing the basic principle of self-capacitive touch detection. FIG. 7 is an explanatory diagram illustrating a state in which an object to be detected is in contact with or in proximity to the detection electrode, for describing the basic principle of self-capacitive touch detection. FIG. 8 is an explanatory diagram illustrating an example of an equivalent circuit of self-capacitive touch detection. FIG. 9 is a diagram illustrating an example of waveforms of the drive signal and the detection signal of self-capacitive touch detection.

The left diagram in FIG. 6 illustrates a state in which a power source Vdd is coupled with the detection electrode E1 by a switch SW11, and the detection electrode E1 is not coupled with a capacitor Ccr by a switch SW12, in a state in which the object to be detected is neither in contact with nor in proximity to the detection electrode E1. In this state, a capacitance Cx1 included in the detection electrode E1 is charged. The right diagram in FIG. 6 illustrates a state in which the power source Vdd is decoupled from the detection electrode E1 by the switch SW11, and the detection electrode E1 is coupled with the capacitor Ccr by the switch SW12. In this state, an electric charge of the capacitance Cx1 is discharged through the capacitor Ccr.

The left diagram in FIG. 7 illustrates a state in which the power source Vdd is coupled with the detection electrode E1 by the switch SW11, and the detection electrode E1 is not coupled with the capacitor Ccr by the switch SW12, in a state in which the object to be detected is in contact with or in proximity to the detection electrode E1. In this state, capacitance Cx2 caused by the object to be detected in proximity to the detection electrode E1 is also charged, in addition to the capacitance Cx1 included in the detection electrode E1. The right diagram in FIG. 7 illustrates a state in which the power source Vdd is decoupled from the detection electrode E1 by the switch SW11, and the detection electrode E1 is coupled with the capacitor Ccr by the switch SW12. In this state, the electric charge of the capacitance Cx1 and the electric charge of the capacitance Cx2 are discharged through the capacitor Ccr.

A voltage change characteristic of the capacitor Ccr at the time of discharge (in the state in which the object to be detected is in contact with or in proximity to the detection electrode E1) illustrated in the right diagram in FIG. 7 is distinctly different due to existence of the capacitance Cx2, from a voltage change characteristic of the capacitor Ccr at the time of discharge (in the state in which the object to be detected is neither in contact with nor in proximity to the detection electrode E1) illustrated in the right diagram in FIG. 6. Therefore, in the self-capacitive touch detection, existence or non-existence of contact or proximity of the object to be detected is determined using the difference of the voltage change characteristic of the capacitor Ccr between existence and non-existence of the capacitance Cx2.

To be specific, an alternating-current rectangular wave Sg (see FIG. 9) of a predetermined frequency (a frequency on the order of several kHz to several hundreds of kHz, for example) is applied to the detection electrode E1. The voltage detector DET illustrated in FIG. 8 converts variation of current according to the alternating-current rectangular wave Sg into variation (waveforms $V_3$ and $V_4$) of voltage. The voltage detector DET is an integrated circuit included in the touch detection signal amplifier 42 illustrated in FIG. 2, for example.

As described above, the detection electrode E1 can be decoupled from other elements by the switch SW11 and the switch SW12. In FIG. 9, the alternating-current rectangular wave Sg rises to a voltage level equivalent to the voltage $V_0$ at timing of time $T_{01}$. At this time, the switch SW11 is ON and the switch SW12 is OFF. Therefore, the voltage of the detection electrode E1 rises to the voltage $V_0$.

Next, the switch SW11 is turned OFF before timing of time $T_{11}$. At this time, while the detection electrode E1 is in an electrically floating condition, the potential $V_0$ of the detection electrode E1 is maintained by the capacitance Cx1 of the detection electrode E1 (see FIG. 6) or capacitance (Cx1+Cx2, see FIG. 7) that is obtained by adding the capacitance Cx2 due to the contact or proximity of the object to be detected with or to the capacitance Cx1 of the detection electrode E1. Further, a switch SW13 is turned ON before timing of time $T_{11}$ and is turned OFF after a lapse of a predetermined time to reset the voltage detector DET. With this reset operation, the output voltage (detection signal) Vdet of the voltage detector DET becomes substantially equal to a reference voltage Vref.

Next, when the switch SW12 is turned ON at timing of time $T_{11}$, the voltage of an inversion input side of the voltage detector DET becomes the voltage $V_0$ of the detection electrode E1. After that, the voltage of the inversion input side of the voltage detector DET is decreased to the reference voltage Vref according to time constants of the capacitance Cx1 (or Cx1+Cx2) of the detection electrode E1 and capacitance C5 in the voltage detector DET. At this time, the electric charge accumulated in the capacitance Cx1 (or Cx1+Cx2) of the detection electrode E1 is moved to the capacitance C5 in the voltage detector DET. Therefore, the output voltages (detection signals) Vdet2 and Vdet3 of the voltage detector DET are increased.

When the object to be detected is neither in contact with nor in proximity to the detection electrode E1, the output voltage Vdet2 of the voltage detector DET has the waveform $V_3$ illustrated by the solid line and Vdet2=Cx1×V0/C5 is established. Similarly, when the object to be detected is neither in contact with nor in proximity to the detection electrode E1, the output voltage Vdet3 of the voltage detector DET has the waveform $V_3$ illustrated by the solid line and Vdet3=Cx1×V0/C5 is established.

When the capacitance due to an influence of the object to be detected is added, the output voltage Vdet2 of the voltage detector DET has the waveform $V_4$ illustrated by the dotted line and Vdet2=(Cx1+Cx2)×V0/C5 is established. Similarly, when the capacitance due to an influence of the object to be detected is added, the output voltage Vdet3 of the voltage detector DET has the waveform $V_4$ illustrated by the dotted line and Vdet3=(Cx1+Cx2)×V0/C5 is established.

After that, the switch SW12 is turned off at timing of time $T_{31}$ after the electric charge of the capacitance Cx1 (or Cx1+Cx2) of the detection electrode E1 is sufficiently moved to the capacitance C5, and the switch SW11 and the switch SW13 are turned ON. Due to this, the potential of the detection electrode E1 becomes a low level, which is the same potential as the alternating-current rectangular wave Sg, and the voltage detector DET is reset. The timing to turn ON the switch SW11 may be any timing after the switch SW12 is turned OFF and before a time $T_{02}$. The timing to reset the voltage detector DET may be any timing after the switch SW12 is turned OFF and before a time $T_{12}$.

The above operation is repeated at a predetermined frequency (a frequency on the order of several kHz to several hundreds of kHz, for example). Existence or non-existence of the object to be detected (existence or non-existence of touch) can be detected on the basis of an absolute value $|\Delta V|$ of a difference between the waveform $V_3$ and the waveform $V_4$. As illustrated in FIG. 9, the potential of the detection electrode E1 has the waveform $V_1$ when the object to be detected is not in proximity, and has the waveform $V_2$ when the capacitance Cx2 due to an influence of the object to be detected is added. Existence or non-existence of an external proximity object (existence or non-existence of touch) can be determined by measurement of time until the waveform $V_1$ and the waveform $V_2$ go down to a predetermined threshold voltage $V_{TH}$.

In the present configuration example, in the touch detection device 30, the electric charge is supplied to the touch detection electrodes TDL according to the drive signal Vcomts1 supplied from the drive driver 47 illustrated in FIG. 2 such that the self-capacitive touch detection is performed, and the touch detection electrodes TDL outputs the detection signals Vdet2. In the touch detection device 30, the electric charge is supplied to the drive electrodes COML according to the drive signal Vcomts2 supplied from the drive electrode driver 14 illustrated in FIG. 2 such that the self-capacitive touch detection is performed, and the drive electrodes COML outputs the detection signals Vdet3.

Referring back to FIG. 2, the touch detection controller 40 is a circuit that detects existence or non-existence of touch (the above-described contact state) to the touch detection device 30 on the basis of the control signal supplied from the display controller 11 and the detection signals Vdet1, Vdet2, and Vdet3 supplied from the touch detection device 30 of the display device 10 with a touch detection function, and obtains coordinates and a contact area of a touch detection region when there is the touch.

The touch detection controller 40 includes the touch detection signal amplifier 42, an analog/digital (A/D) converter 43, a signal processor 44, a coordinate extractor 45, and a detection timing controller 46.

In the mutual-capacitive touch detection, the touch detection device 30 outputs and supplies the detection signals Vdet1 to the touch detection signal amplifier 42 of the touch detection controller 40 from a plurality of the touch detection electrodes TDL described below through the voltage detector DET illustrated in FIG. 4.

In the self-capacitive touch detection, the touch detection device 30 outputs and supplies the detection signal Vdet2 to the touch detection signal amplifier 42 of the touch detection controller 40 from the plurality of touch detection electrodes TDL described below through the voltage detector DET illustrated in FIG. 8. In the self-capacitive touch detection, the touch detection device 30 outputs and supplies the detection signal Vdet3 to the touch detection signal amplifier 42 of the touch detection controller 40 from a plurality of the drive electrodes COML described below through the voltage detector DET illustrated in FIG. 8.

The touch detection signal amplifier 42 amplifies the detection signals Vdet1, Vdet2, and Vdet3 supplied from the touch detection device 30. The touch detection signals amplified by the touch detection signal amplifier 42 are supplied to the A/D converter 43. The touch detection signal amplifier 42 may include a low-pass analog filter that removes a high-frequency component (noise component) included in the detection signals Vdet1, Vdet2, and Vdet3, extracts touch components, and outputs the touch components. The touch detection controller 40 may not include the touch detection signal amplifier 42. That is, the detection signals Vdet1, Vdet2, and Vdet3 from the touch detection device 30 may be supplied to the A/D converter 43.

The A/D converter 43 is a circuit that samples analog signals output from the touch detection signal amplifier 42 and converts the analog signals into digital signals at timing in synchronization with the drive signals Vcomtm, Vcomts1, and Vcomts2.

The signal processor 44 includes a digital filter that decreases frequency components (noise components) other than the frequency at which the drive signals Vcomtm, Vcomts1, and Vcomts2 are sampled, the frequency components being included in the output signals of the A/D converter 43.

The signal processor 44 is a logic circuit that detects existence or non-existence of touch to the touch detection device 30 on the basis of the output signals of the A/D converter 43. The signal processor 44 performs processing of extracting only a signal of a difference caused by a finger. This signal of a difference caused by a finger is the above-described absolute value $|\Delta V|$ of a difference between the waveform $V_0$ and the waveform $V_1$.

The signal processor 44 may perform calculation to average absolute values $|\Delta V|$ per one detection block to obtain an average value of the absolute values $|\Delta V|$. With this calculation, the signal processor 44 can decrease the influence due to noise.

The signal processor 44 compares the detected signal of a difference due to a finger with a predetermined threshold voltage Vth and determines the con-contact state of the external proximity object when the detected signal of a difference is equal to or greater than the threshold voltage Vth.

The signal processor 44 compares the detected signal of a difference with the predetermined threshold voltage Vth and determines the contact state of the external proximity object when the detected signal of a difference is less than the threshold voltage Vth. In this way, the touch detection controller 40 can detect touch.

The coordinate extractor 45 is a logic circuit that obtains touch panel coordinates of touch when the touch is detected by the signal processor 44. The detection timing controller 46 controls the A/D converter 43, the signal processor 44, and the coordinate extractor 45 to be operated in synchronization with one another. The coordinate extractor 45 outputs the touch panel coordinates as a signal Vout.

Figure 10:
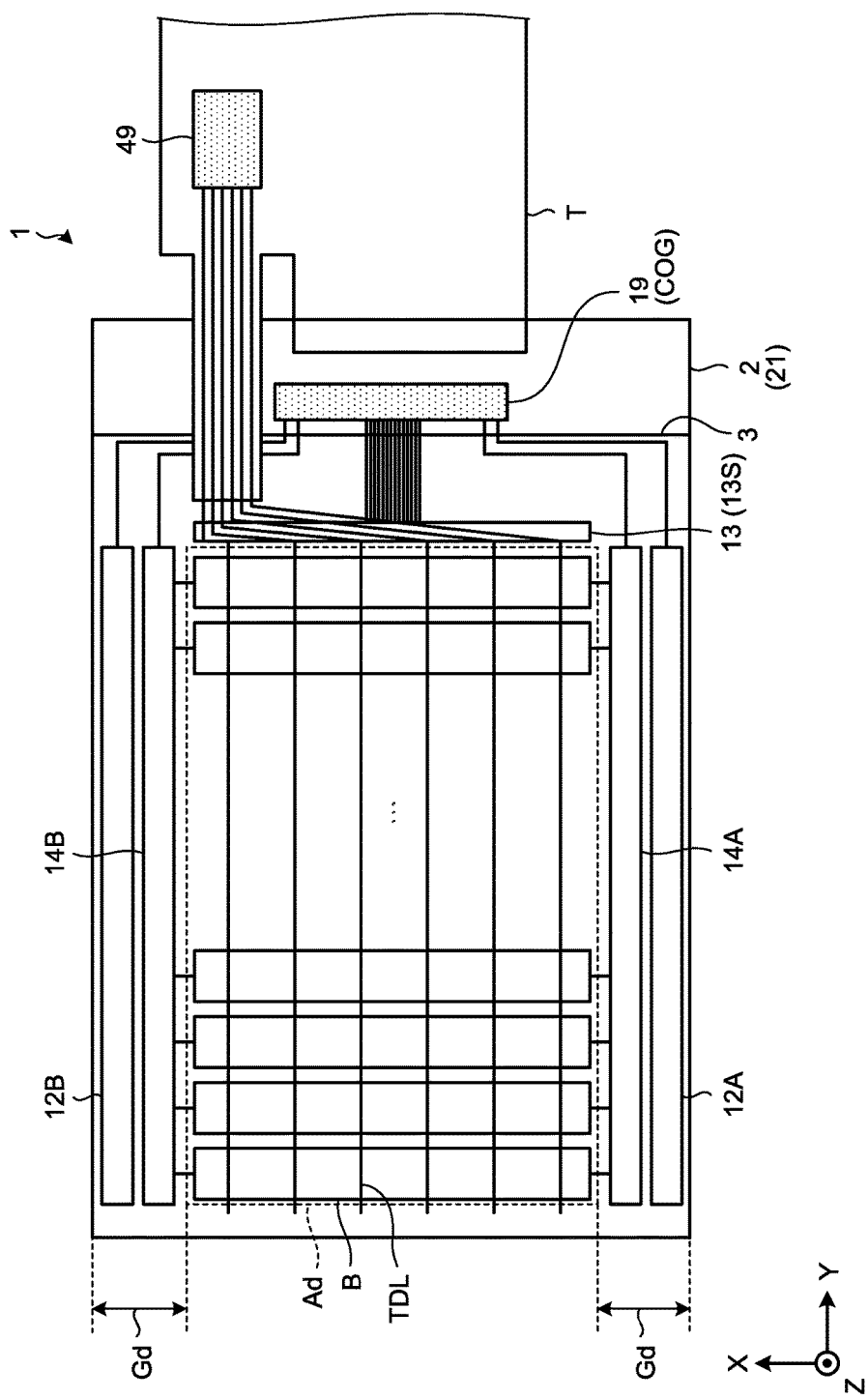
FIG. 10 is a diagram illustrating an example of a module on which the display apparatus with a touch detection function according to the embodiment is mounted.

FIG. 10 is a diagram illustrating an example of a module on which the display apparatus with a touch detection function according to the embodiment is mounted. The display apparatus 1 with a touch detection function includes a first substrate (for example, a pixel substrate 2) and a printed substrate (for example, a flexible printed substrate) T.

The pixel substrate 2 includes a first insulating substrate (for example, a TFT substrate 21). The TFT substrate 21 is, for example, a glass substrate or a film substrate. A drive IC chip (for example, a chip on glass (COG) 19) is mounted on the TFT substrate 21. A display region Ad of the liquid crystal display device 20 and a frame Gd are arranged on the pixel substrate 2 (TFT substrate 21).

The COG 19 is an IC chip that is a driver mounted on the TFT substrate 21, and is a control device including circuits necessary for a display operation, such as the display controller 11 illustrated in FIG. 2.

In the present configuration example, the source driver 13 and the source selector 13S are arranged on the TFT substrate 21. The source driver 13 and the source selector 13S may be included in the COG 19.

Drive electrode scanners 14A and 14B that are a part of the drive electrode driver 14 are arranged on the TFT substrate 21.

The gate driver 12 is provided as gate drivers 12A and 12B on the TFT substrate 21.

The COG 19 of the display apparatus 1 with a touch detection function may include the circuits of the drive electrode scanners 14A and 14B and the gate driver 12. The COG 19 is merely one embodiment of mounting and the embodiment is not limited thereto. For example, a configuration having a function similar to the COG 19 may be mounted on the flexible printed substrate T as a chip on film or a chip on flexible (COF).

As illustrated in FIG. 10, drive electrode blocks B of the drive electrodes COML and the touch detection electrodes TDL are arranged to three-dimensionally intersect with each other in a direction perpendicular to a surface of the TFT substrate 21.

The drive electrodes COML are divided into a plurality of stripe electrode patterns extending in one direction. In performing the touch detection operation, the drive signal VcomAC is sequentially supplied by the drive electrode driver 14 to the electrode patterns. The plurality of stripe electrode patterns, each of which is made up of one or more drive electrodes COML to which the drive signal VcomAC is supplied at the same time, correspond to the drive electrodes block B illustrated in FIG. 10.

The drive electrode blocks B (drive electrodes COML) are arranged in a direction parallel to a short side of the display device 10 with a touch detection function. The touch detection electrodes TDL described below are arranged in a direction intersecting with the extending direction of the drive electrode blocks B and are arranged in a direction parallel to a long side of the display device 10 with a touch detection function, for example.

The touch detection electrodes TDL are coupled with a touch IC 49 mounted on the flexible printed substrate T coupled with the short side of the display device 10 with a touch detection function. The touch IC 49 is an IC chip that is a driver mounted on the flexible printed substrate T, and is a control device including circuits necessary for a touch operation, such as the touch detection controller 40 illustrated in FIG. 2. Thus, the touch IC 49 is mounted on the flexible printed substrate T and is coupled with the touch detection electrodes TDL arranged in parallel. The flexible printed substrate T is not limited to a substrate as long as it is a terminal. In this case, the touch IC 49 is provided outside the module. The touch IC 49 is arranged on the flexible printed substrate T, but the arrangement of the touch IC 49 is not limited thereto. The touch IC 49 may be arranged on the TFT substrate 21 or a second insulating substrate 31.

In the present configuration example, the touch IC 49 is a control device that functions as the touch detection controller 40. However, a part of the function of the touch detection controller 40 may be provided as a function of another MPU.

To be specific, a part (for example, noise removal) of various functions such as A/D conversion and the noise removal, which can be provided as functions of an IC chip as a touch driver, may be performed in a circuit of an MPU or the like separately provided from the IC chip as a touch driver. In a case where one IC chip as a driver (one chip configuration) is employed, the detection signal may be transmitted to the IC chip as a touch driver on an array substrate through wiring of the flexible printed substrate T or the like.

The source selector 13S is arranged near the display region Ad on the TFT substrate 21, using a TFT element. A plurality of pixels Pix described below are arranged in the display region Ad in a matrix (row-column configuration). The frame Gd is a region where no pixel Pix is arranged as the surface of the TFT substrate 21 is viewed in a perpendicular direction. The gate driver 12 and the drive electrode scanners 14A and 14B, of the drive electrode driver 14, are arranged in the frame Gd.

The gate driver 12 includes, for example, the gate drivers 12A and 12B, and is arranged on the TFT substrate 21, using a TFT element. The gate drivers 12A and 12B are arranged on opposite sides of the display region Ad where the sub-pixels SPix (pixels) described below are arranged in a matrix (row-column configuration), and configured to drive the pixels from both sides. Scanning lines are arrayed between the gate driver 12A and the gate driver 12B. Therefore, the scanning lines extend in the direction parallel to the extending direction of the drive electrode COML, in the direction perpendicular to the surface of the TFT substrate 21.

In the present configuration example, the gate driver 12 includes the two circuits: the gate drivers 12A and 12B. However, this is an example of a specific configuration of the gate driver 12 and the embodiment is not limited thereto. For example, the gate driver 12 may be one circuit provided at only one end of each of the scanning lines.

The drive electrode driver 14 includes, for example, the drive electrode scanners 14A and 14B, and is arranged on the TFT substrate 21, using a TFT element. The drive electrode scanners 14A and 14B are configured to receive the display drive voltage VcomDC from the COG 19, and receive the drive signals Vcomtm and Vcomts2. The drive electrode scanners 14A and 14B can drive the plurality of drive electrode blocks B arranged in parallel, from both sides.

In the present configuration example, the drive electrode driver 14 includes the two circuits: the drive electrode scanners 14A and 14B. However, this is an example of a specific configuration of the drive electrode driver 14 and the embodiment is not limited thereto. For example, the drive electrode driver 14 may be one circuit provided at only one end of each of the drive electrode blocks B.

The display apparatus 1 with a touch detection function outputs the above-described detection signals Vdet1, Vdet2, and Vdet3 from the short side of the display device 10 with a touch detection function. This configuration facilitates routing of wiring in the display apparatus 1 with a touch detection function, when the wiring is coupled with the touch detection controller 40 through the flexible printed substrate T as a terminal.

Figure 11:
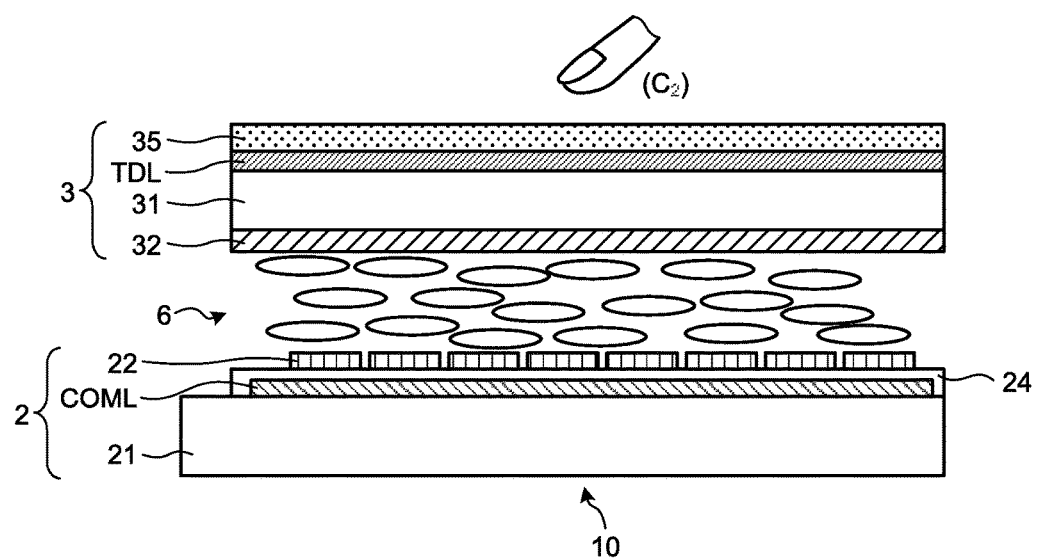
FIG. 11 is a sectional view illustrating a schematic section structure of a display device with a touch detection function.
Figure 12:
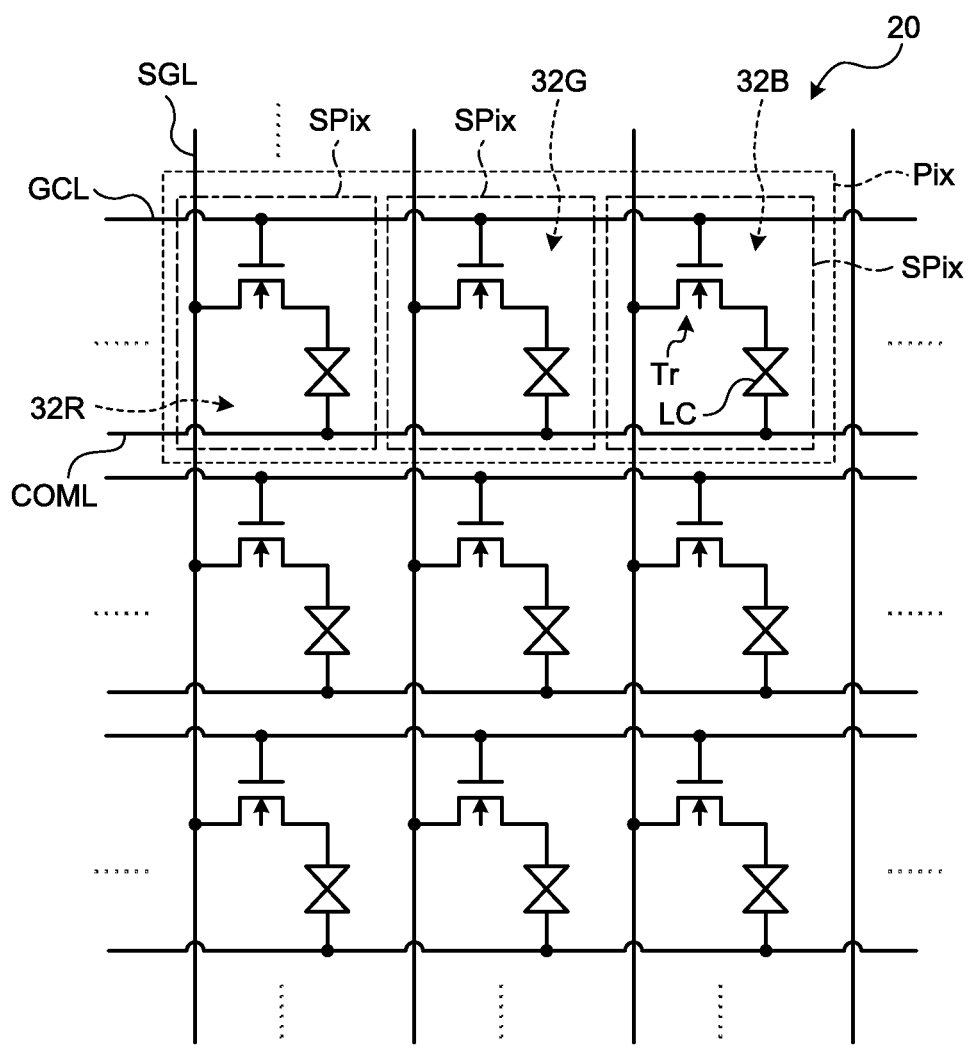
FIG. 12 is a circuit diagram illustrating a pixel arrangement of the display device with a touch detection function.

FIG. 11 is a sectional view illustrating a schematic section structure of the display device with a touch detection function. FIG. 12 is a circuit diagram illustrating a pixel arrangement of the display device with a touch detection function. The display device 10 with a touch detection function includes the pixel substrate 2, a second substrate (a counter substrate 3, for example) and a display function layer (a liquid crystal layer 6, for example). The counter substrate 3 is arranged to face the pixel substrate 2 in the direction perpendicular to the surface of the pixel substrate 2, and the liquid crystal layer 6 is arranged between the pixel substrate 2 and the counter substrate 3.

The pixel substrate 2 includes a TFT substrate 21 as a circuit substrate, a plurality of pixel electrodes 22, the drive electrodes COML, and an insulating layer 24. The pixel electrodes 22 are arranged in a matrix (row-column configuration) on the TFT substrate 21. The drive electrodes COML are arranged between the TFT substrate 21 and the pixel electrode 22. The insulating layer 24 insulates the pixel electrodes 22 and the drive electrodes COML.

As illustrated in FIG. 12, thin film transistor (TFT) elements Tr of the sub-pixels SPix, and wiring such as pixel signal lines SGL and scanning signal lines GCL are arranged on the TFT substrate 21. The pixel signal lines SGL supply the pixel signals Vpix to the pixel electrodes 22. The scanning signal lines GCL drive the TFT elements Tr. The pixel signal line SGL extends in a plane parallel to the surface of the TFT substrate 21, and supplies the pixel signal Vpix for displaying an image to the sub-pixels SPix. The sub-pixel SPix corresponds to a configuration unit that is controlled with the pixel signal Vpix. The sub-pixel SPix is a region surrounded by the pixel signal lines SGL and the scanning signal lines GCL, and corresponds to a configuration unit that is controlled by the TFT element Tr.

As illustrated in FIG. 12, the liquid crystal display device 20 includes a plurality of the sub-pixels SPix arranged in a matrix (row-column configuration). The sub-pixels SPix each include the TFT element Tr and the liquid crystal element LC. The TFT element Tr is fabricated from a thin film transistor material. The TFT element Tr in this example is fabricated from an n-channel metal oxide semiconductor (MOS) TFT material.

One of a source and a drain of the TFT element Tr is coupled with the pixel signal line SGL, a gate is coupled with the scanning signal line GCL, and the other of the source and the drain is coupled with one end of the liquid crystal element LC. The liquid crystal element LC has one end coupled with the drain of the TFT element Tr and the other end coupled with the drive electrode COML, for example. In FIG. 11, the pixel electrodes 22, the insulating layer 24, and the drive electrode COML are layered in this order on the TFT substrate 21. However, the embodiment is not limited thereto. The drive electrode COML, the insulating layer 24, and the pixel electrodes 22 may be layered in this order on the TFT substrate 21, or the drive electrode COML and the pixel electrodes 22 may be arranged on the same layer through the insulating layer 24.

The sub-pixel SPix is coupled with other sub-pixels SPix belonging to the same row of the liquid crystal display device 20, by the scanning signal line GCL. The scanning signal line GCL is coupled with the gate driver 12, and is supplied with the scanning signal Vscan from the gate driver 12.

The sub-pixel SPix is coupled with other sub-pixels SPix belonging to the same column of the liquid crystal display device 20, by the pixel signal line SGL. The pixel signal line SGL is coupled with the source driver 13, and is supplied with the pixel signal Vpix from the source driver 13.

Further, the sub-pixel SPix is coupled with other sub-pixels SPix belonging to the same row of the liquid crystal display device 20, by the drive electrode COML. The drive electrode COML is coupled with the drive electrode driver 14, and is supplied with the drive signal Vcom from the drive electrode driver 14. That is, in this example, the sub-pixels SPix belonging to the same row share one drive electrode COML.

The direction in which the drive electrode COML of the present configuration example extends is parallel to the direction in which the scanning signal line GCL extends. The direction in which the drive electrode COML extends is not limited thereto. For example, the direction in which the drive electrode COML extends may be a direction parallel to the direction in which the pixel signal line SGL extends. The direction in which the touch detection electrode TDL extends is not limited to the direction in which the pixel signal line SGL extends. The direction in which the touch detection electrode TDL extends may be direction parallel to the direction in which the scanning signal line GCL extends.

The gate driver 12 illustrated in FIG. 2 applies the scanning signal Vscan to the gate of the TFT elements Tr of the pixels Pix through the scanning signal line GCL illustrated in FIG. 12, to sequentially select one row (one horizontal line) as a target to be driven and displayed, of the sub-pixels SPix arranged in a matrix (row-column configuration) in the liquid crystal display device 20.

The source driver 13 illustrated in FIG. 2 supplies, through the pixel signal lines SGL illustrated in FIG. 12, the pixel signals Vpix to the corresponding sub-pixels SPix included in the one horizontal line sequentially selected by the gate driver 12. Then, these sub-pixels SPix allow display of the one horizontal line according to the supplied pixel signals Vpix.

The drive electrode driver 14 illustrated in FIG. 2 applies the drive signal Vcom to each block that includes a predetermined number of drive electrodes COML to drive the drive electrodes COML in units of blocks.

As described above, in the liquid crystal display device 20, the gate driver 12 drives the scanning signal lines GCL to sequentially linearly scan the scanning signal lines GCL in a time division manner, such that one horizontal line is sequentially selected. In the liquid crystal display device 20, one horizontal line performs display at a time when the source driver 13 supplies the pixel signals Vpix to the sub-pixels SPix belonging to the one horizontal line. In this display operation, the drive electrode driver 14 applies the drive signal Vcom to the block including one or more drive electrodes COML corresponding to the one horizontal line.

The liquid crystal layer 6 modulates light that passes through the liquid crystal layer 6 according to conditions of the electric field. At time of driving the drive electrode COML, a voltage according to the pixel signal Vpix supplied to the pixel electrode 22 is applied to the liquid crystal layer 6, and the electric field is caused. Then, the liquid crystal of the liquid crystal layer 6 exhibits orientation according to the electric field and modulates the light that passes through the liquid crystal layer 6.

In this way, the pixel electrode 22 and the drive electrode COML function as a pair of electrodes causing the electric field in the liquid crystal layer 6. That is, the liquid crystal display device 20 functions as the display device DP in which the display image is changed according to the electric charge provided for the pair of electrodes. One of the pixel electrodes 22 is arranged in at least every pixel Pix or sub-pixel SPix, and one of the drive electrodes COML is arranged in at least every plurality of pixels Pix or sub-pixels SPix.

In the present configuration example, as the liquid crystal display device 20, a liquid crystal display device using horizontal field-mode liquid crystal such as in-plane switching (IPS) including fringe field switching (FFS) is used, for example. Oriented films may be respectively arranged between the liquid crystal layer 6 and the pixel substrate 2, and between the liquid crystal layer 6 and the counter substrate 3, illustrated in FIG. 11.

The liquid crystal display device 20 has a configuration for the horizontal field mode. However, the liquid crystal display device 20 may have a configuration for another display mode. For example, the liquid crystal display device 20 may have a configuration for a mode mainly using a vertical field caused between principal planes of the substrate, such as a twisted nematic (TN) mode, an optically compensated bend (OCB) mode, or a vertical aligned (VA) mode. As the display mode using the vertical field, a configuration in which the pixel electrodes 22 are provided at the pixel substrate 2 and the drive electrodes COML are provided at the counter substrate 3 is applicable.

The counter substrate 3 includes the second insulating substrate 31, and a color filter 32 arranged on one surface of the second insulating substrate 31. The touch detection electrode TDL as the detection electrode of the touch detection device 30 is arranged on the other surface of the second insulating substrate 31, and a polarizing plate 35 is arranged on the touch detection electrode TDL.

A mounting method of the color filter 32 may be a color-filter on array (COA) method in which the color filter 32 is arranged on the pixel substrate 2 as an array substrate.

The color filter 32 illustrated in FIG. 11 is configured such that color regions colored in three colors of red (R), green (G), and blue (B) of the color filter are periodically arranged. The three color regions 32R, 32G, and 32B colored in R, G, and B correspond to the sub-pixels SPix, and one set of three color regions 32R, 32G, and 32B corresponds to one pixel Pix.

The pixels Pix are arranged in a matrix (row-column configuration) along a direction parallel to the scanning signal lines GCL and a direction parallel to the pixel signal lines SGL to form the display region Ad described below. The color filter 32 faces the liquid crystal layer 6 in a direction perpendicular to the TFT substrate 21. In this way, each sub-pixel SPix can display a single color.

The color filter 32 may have a combination of other colors as long as the filter is colored in different colors. The color filter 32 may not be included. In this way, there may be a region where no color filter 32 exists, that is, there may be sub-pixels SPix that are not colored. The number of the sub-pixels SPix included in each pixel Pix may be four or more.

Figure 13:
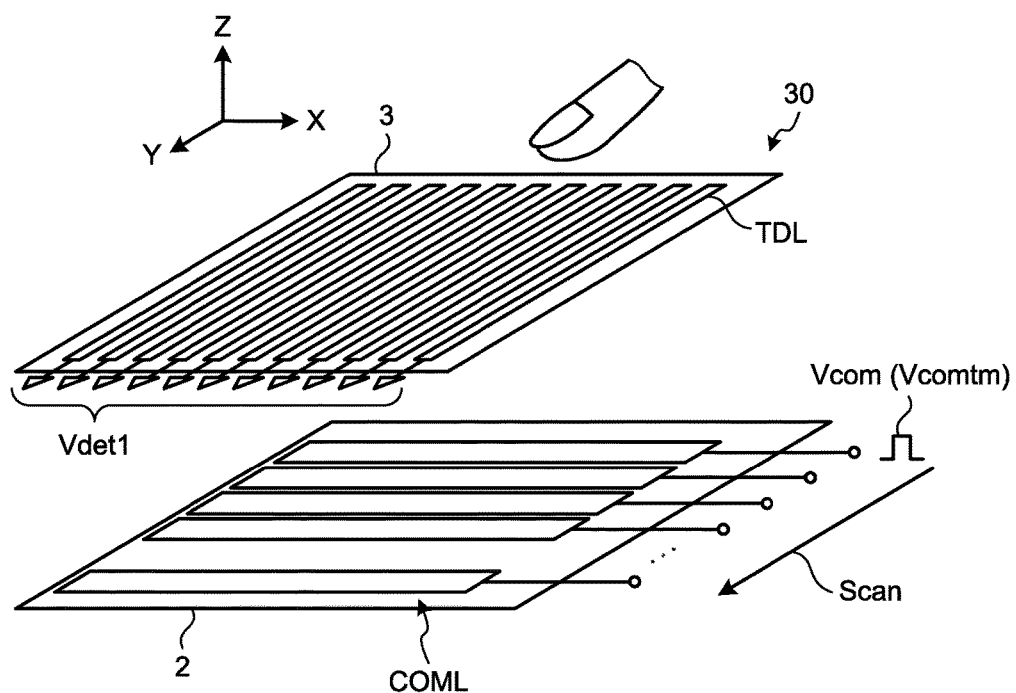
FIG. 13 is a perspective view illustrating a configuration example of drive electrodes and touch detection electrodes of the display device with a touch detection function.

FIG. 13 is a perspective view illustrating a configuration example of the drive electrodes and the touch detection electrodes of the display device with a touch detection function. The drive electrode COML according to the present configuration example functions as a drive electrode of the liquid crystal display device 20 and also functions as a drive electrode of the touch detection device 30.

The drive electrode COML faces the pixel electrode 22 in the direction perpendicular to the surface of the TFT substrate 21. The touch detection device 30 is made up of the drive electrode COML provided in the pixel substrate 2 and the touch detection electrode TDL provided in the counter substrate 3.

The touch detection electrodes TDL are configured such that stripe electrode patterns extend in a direction intersecting with the extending direction of the electrode patterns of the drive electrodes COML. The touch detection electrodes TDL face the drive electrodes COML in the direction perpendicular to the surface of the TFT substrate 21. The electrode patterns of the touch detection electrodes TDL are coupled with an input side of the touch detection signal amplifier 42 of the touch detection controller 40.

The electrode patterns in which the drive electrodes COML and the touch detection electrodes TDL intersect with each other cause capacitance in an intersecting portion. In the touch detection device 30, when the drive electrode driver 14 applies the drive signal Vcomtm to the drive electrode COML, the touch detection electrode TDL outputs the detection signal Vdet1, and the touch detection is performed.

Figure 4:
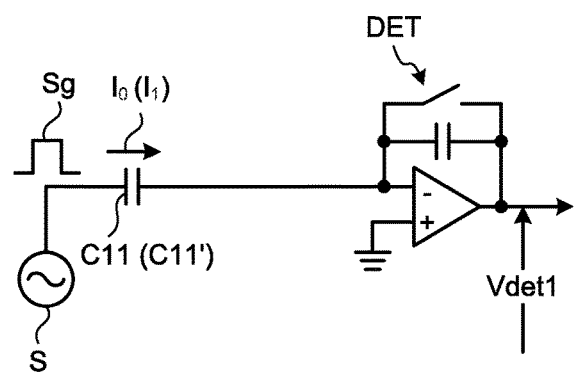
FIG. 4 is an explanatory diagram illustrating an example of an equivalent circuit of mutual-capacitive touch detection.

That is, the drive electrode COML corresponds to the drive electrode E1 in the basic principle of the mutual-capacitance touch detection illustrated in FIGS. 3 to 5, and the touch detection electrode TDL corresponds to the touch detection electrode E2. Then, the touch detection device 30 detects the touch according to the basic principles.

In this way, the touch detection device 30 includes the touch detection electrode TDL that forms mutual-capacitance with one (for example, the drive electrode COML) of the pixel electrode 22 and the drive electrode COML, and performs the touch detection on the basis of change of the mutual-capacitance.

The electrode patterns in which the drive electrodes COML and the touch detection electrodes TDL intersect with each other form a mutual-capacitance touch sensor in a matrix (row-column configuration). Therefore, the touch detection controller 40 can detect a position and a contact area where the object to be detected OBJ is in contact with or in proximity to, by scanning the entire input surface IS of the touch detection device 30.

That is, in the touch detection device 30, the drive electrode driver 14 drives the drive electrode blocks B to sequentially linearly scan the drive electrodes block B illustrated in FIG. 10 in a time division manner, in performing the touch detection operation. With this operation, the drive electrode block B (one detection block) of the drive electrode COML is sequentially selected in a scanning direction Scan. Then, the touch detection device 30 outputs the detection signal Vdet1 from the touch detection electrode TDL. In this way, the touch detection device 30 performs the touch detection of one detection block.

The number of lines in the display output with respect to the detection block is arbitrary. However, in the present embodiment, a touch detection region corresponding to the display region Ad of two lines is the one detection block. In other words, although the relationship between the detection block and any of the pixel electrode, the scanning signal line, and the pixel signal line facing the detection block is arbitrary, two pixel electrodes or two scanning signal lines face one drive electrode COML in the present embodiment.

The shape of the touch detection electrodes TDL or the drive electrodes COML (drive electrode block B) is not limited to a shape with which the touch detection electrodes TDL or the drive electrodes COML are divided into the plurality of stripe patterns. For example, each of the touch detection electrodes TDL or the drive electrodes COML (drive electrode block B) may be formed into a comb teeth shape. Alternatively, each of the touch detection electrodes TDL or the drive electrodes COML (drive electrode block B) may have any shape that just enables the touch detection electrodes TDL or the drive electrodes COML to be divided into a plurality of patterns, and the shape of the slit that divides the drive electrodes COML may be a straight line or a curved line.

As an example of a method of operating the display apparatus 1 with a touch detection function, the display apparatus 1 with a touch detection function performs the touch detection operation (touch detection period) and the display operation (display operation period) in a time division manner. The touch detection operation and the display operation can be performed in any division manner.

2. Configuration Example of Force Detector

Figure 14:
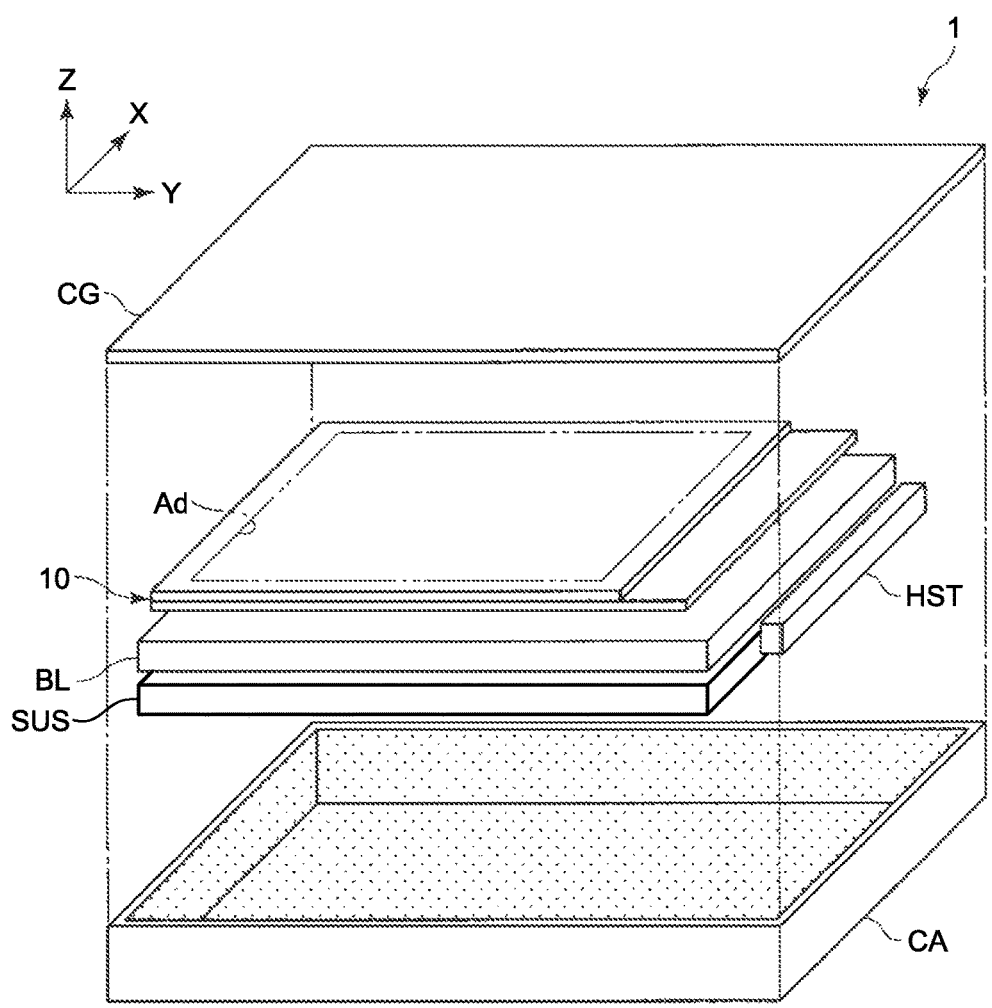
FIG. 14 is an exploded perspective view illustrating a configuration example of the display apparatus with a touch detection function according to the embodiment.

FIG. 14 is an exploded perspective view illustrating a configuration example of the display apparatus with a touch detection function according to the embodiment. As illustrated in FIG. 14, the display apparatus 1 with a touch detection function includes the display device 10 with a touch detection function, a lighting apparatus (for example, a backlight apparatus BL), an electrode SUS, the host HST, a casing CA, and the cover member CG. The lighting apparatus illuminates the display device 10 with a touch detection function. The host HST controls the display device 10 with a touch detection function and the backlight apparatus BL.

The display device 10 with a touch detection function includes a plane parallel to an X-Y plane defined by an X direction as a first direction and a Y direction as a second direction, the first direction and the second direction being perpendicular to each other. In the present configuration example, the X direction as the first direction and the Y direction as the second direction are perpendicular to each other. However, the first direction and the second direction may intersect with each other at an angle other than 90°. A Z direction as a third direction is perpendicular to the X direction as the first direction and the Y direction as the second direction. The Z direction as the third direction is a thickness direction of the display device 10 with a touch detection function.

The casing CA has a box shape having an opening in an upper portion, and houses the display device 10 with a touch detection function, the backlight apparatus BL, and the host HST. The casing CA may be formed of a conductor such as metal. Alternatively, the casing CA may be formed of a resin and a surface layer of the casing CA is formed of a conductor such as metal.

The cover member CG blocks the opening of the casing CA, and covers the display device 10 with a touch detection function, the backlight apparatus BL, and the host HST.

A dimension of the cover member CG is larger than a dimension of the second substrate and a dimension of the first substrate in X-Y plane view. Examples of the cover member CG include substrates having light transmission properties such as a glass substrate and a resin substrate. When the cover member CG is the glass substrate, the cover member CG may be referred to as cover glass.

The display device 10 with a touch detection function, the backlight apparatus BL, and the electrode SUS are positioned between a bottom surface of the casing CA and the cover member CG, and the backlight apparatus BL and the electrode SUS are positioned between the casing CA and the display device 10 with a touch detection function, in the Z direction as the third direction. The backlight apparatus BL and the electrode SUS may be arranged with a space from the display device 10 with a touch detection function. The backlight apparatus BL and the electrode SUS may be arranged with a space from the casing CA.

A force detection region where the force detector SE2 detects force may be the same as the display region Ad.

Figure 15:
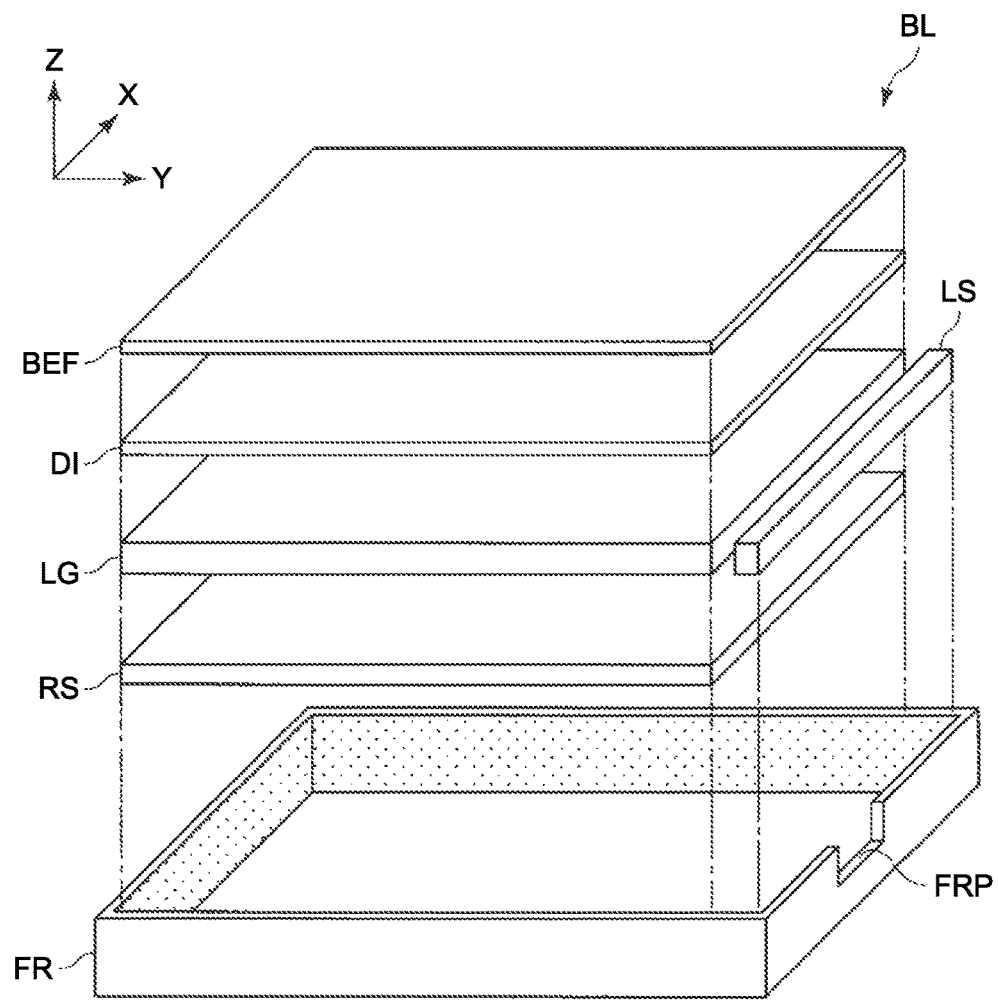
FIG. 15 is an exploded perspective view illustrating a backlight apparatus.

FIG. 15 is an exploded perspective view illustrating a backlight apparatus. The backlight apparatus BL includes a light guide LG, a light source LS, a light reflector RS, a light diffusion sheet DI, a brightness enhancement film BEF, and a frame FR. The backlight apparatus BL has shape and size corresponding to the display device 10 with a touch detection function.

The light guide LG is arranged between the display device 10 with a touch detection function and the casing CA. In the present configuration example, the light guide LG is formed into a flat rectangular shape. The light source LS emits light to the light guide LG. In the present configuration example, a light-emitting diode (LED) is used as the light source LS, and is arranged to face one side surface of the light guide LG.

The light reflector RS is arranged between the light guide LG and the casing CA. The light reflector RS reflects the light emitted from a first side of the light guide LG to cause the light to travel toward the display device 10 with a touch detection function. The first side of the light guide LG is a side opposite to a second side of the light guide LG facing the display device 10 with a touch detection function. The light reflector RS can decrease a loss of light to improve a brightness level of a display image. In the present configuration example, the light reflector RS is formed into a rectangular sheet shape. The area of the light reflector RS is substantially the same as the area of the light guide LG in the X-Y plane. For example, the light reflector RS may have a multilayer film structure using a polyester-based resin.

The light diffusion sheet DI is arranged between the light guide LG and the display device 10 with a touch detection function. The light diffusion sheet DI diffuses the light incident from the light guide LG side and causes the diffused light to travel toward the display device 10 with a touch detection function. That is, the light that passes through the light diffusion sheet DI is diffused. Therefore, the light diffusion sheet DI can reduce unevenness in brightness in the X-Y plane of the light emitted from the backlight apparatus BL. In the present configuration example, the light diffusion sheet DI is formed into a rectangular sheet shape. The area of the light diffusion sheet DI is substantially the same as the area of the light guide LG in the X-Y plane.

The brightness enhancement film BEF is arranged between the light diffusion sheet DI and the display device 10 with a touch detection function. The brightness enhancement film BEF has a function to improve the brightness level of the light emitted from the backlight apparatus BL. In the present configuration example, the brightness enhancement film BEF is formed into a rectangular film shape. The area of the brightness enhancement film BEF is substantially the same as the area of the light guide LG in the X-Y plane.

The frame FR is used for modularization of the backlight apparatus BL. The light guide LG, the light source LS, the light reflector RS, the light diffusion sheet DI, and the brightness enhancement film BEF are attached to the frame FR. With this modularization, relative positions of the light guide LG and the light source LS are fixed.

In the present configuration example, the frame FR is formed into a rectangular frame shape. The frame FR surrounds aggregate of the light guide LG and the light source LS in whole in the X-Y plane. A path FRP, through which the flexible printed substrate T coupled with the light source LS passes, is arranged in the frame FR. The frame FR may be formed of a conductive material such as metal.

The frame FR in the X-Y plane can be deformed into any shape that does not disturb the illumination of the display device 10 with a touch detection function. For example, examples of the shape of the frame FR in the X-Y plan include an L shape in which the frame FR faces two adjacent sides of the light guide LG, an Π shape in which the frame FR faces three adjacent sides of the light guide LG, and a II shape in which the frame FR faces two facing sides of the light guide LG.

Although the backlight apparatus BL is exemplarily illustrated in FIG. 15, various forms are applicable as the backlight apparatus BL. For example, the backlight apparatus BL may be formed excluding at least a part of the light reflector RS, the light diffusion sheet DI, and the brightness enhancement film BEF. Alternatively, the backlight apparatus BL may be formed adding an optical member not illustrated in FIG. 15. The backlight apparatus BL may just be configured to emit light to the display device 10 with a touch detection function.

Figure 16:
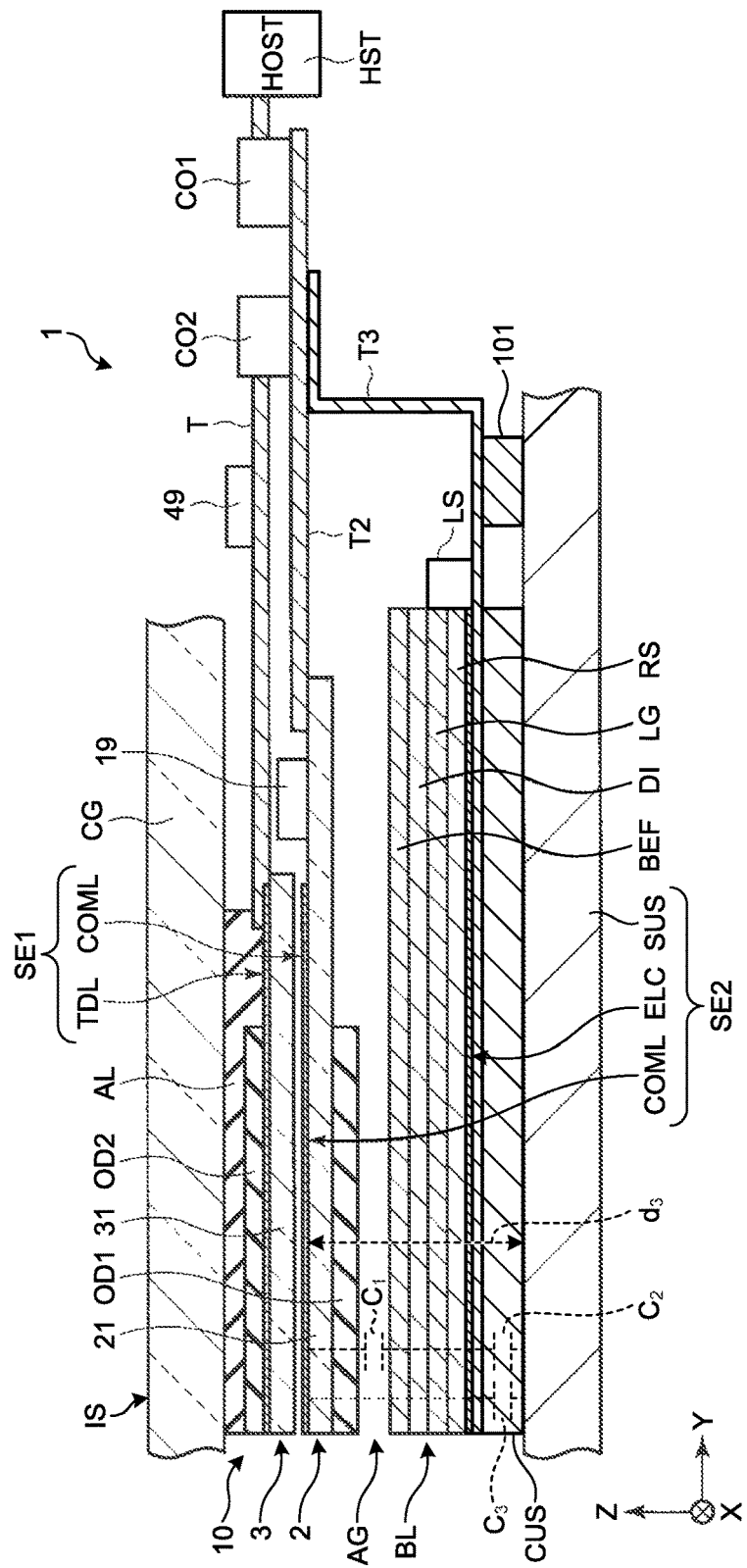
FIG. 16 is a sectional view illustrating a configuration example of the display apparatus with a touch detection function according to the embodiment.

FIG. 16 is a sectional view illustrating a configuration example of the display apparatus with a touch detection function according to the embodiment. As illustrated in FIG. 16, the display apparatus 1 with a touch detection function includes the display device 10 with a touch detection function, the COG 19, the cover member CG, a first optical element OD1, a second optical element OD2, the touch IC 49, the backlight apparatus BL, a first printed substrate, a second printed substrate, and a third printed substrate (for example, flexible printed substrates T, T2, and T3), a cushion layer CUS, and the electrode SUS.

An air layer (air gap) AG is provided between the display device 10 with a touch detection function and the backlight apparatus BL.

The COG 19 is mounted on the pixel substrate 2 of the display device 10 with a touch detection function. The flexible printed substrate T2 is coupled with the pixel substrate 2. A connector CO1 and a connector CO2 are mounted on the flexible printed substrate T2. The flexible printed substrate T2 is coupled with the host HST through the connector CO1.

The flexible printed substrate T couples the touch detection electrode TDL with the connector CO2. The COG 19 is coupled with the touch IC 49 through the flexible printed substrate T2, the connector CO2, and the flexible printed substrate T. Exemplarily illustrating an arrangement of the touch IC 49, the touch IC 49 may be mounted on any one of the flexible printed substrates T, T2, and T3, and the counter substrate 3, or may be divided and mounted on any two of the aforementioned substrates.

The flexible printed substrate T3 couples the light source LS with the flexible printed substrate T2. The host HST is coupled with the light source LS through the connector CO1 and the flexible printed substrate T3, supplies power to the light source LS, and controls driving of the light source LS. The light source LS may be coupled with the COG 19 through the flexible printed substrate T3 and the flexible printed substrate T2, and controlled by the COG 19. In other words, the display controller 11 may include a light source controller that controls the light source.

The flexible printed substrate T3 extends to a back surface side (a side in a direction opposite to the Z direction) of the backlight apparatus BL and covers the back surface side of the backlight apparatus BL. An intermediate electrode ELC is arranged on the flexible printed substrate T3. The intermediate electrode ELC is arranged in a portion corresponding to the display region Ad. The intermediate electrode ELC may have the same shape and the same size as the display region Ad.

The cushion layer CUS is provided between the flexible printed substrate T3 and the electrode SUS. The cushion layer CUS is a nonconductor and may be made of polyurethane.

When weak force is applied to the input surface IS, only the air layer AG becomes thin and the cushion layer CUS is not deformed, and thus the display apparatus 1 with a touch detection function can favorably detect the weak force. When strong force is applied to the input surface IS, the thickness of the air layer AG reaches zero and the cushion layer CUS is elastically deformed according to the force, and thus the display apparatus 1 with a touch detection function can favorably detect the strong force.

The intermediate electrode ELC is coupled with the touch IC 49 through the flexible printed substrate T3, the connector CO2, and the flexible printed substrate T. The intermediate electrode ELC is caused to have a reference potential (for example, a ground potential) or high impedance by the touch IC 49, or is supplied with a signal having the same phase and the same amplitude as the drive signal Vcomts2. The COG 19 or the host HST may cause the intermediate electrode ELC to have the reference potential or high impedance, or may supply the signal having the same phase and the same amplitude as the drive signal Vcomts2 to the intermediate electrode ELC. In this disclosure, "the same phase" is the same phase or substantially the same phase, and "the same amplitude" is the same amplitude or substantially the same amplitude.

A conductive tape 101 is provided between the electrode SUS and the flexible printed substrate T3. The electrode SUS is coupled with the COG 19, the touch IC 49, or the host HST through the conductive tape 101, the flexible printed substrate T3, the connector CO2, and the flexible printed substrate T. The electrode SUS is caused to have the reference potential by the COG 19, the touch IC 49, or the host HST. The electrode SUS may be caused to have the reference potential through a member other than the flexible printed substrate T3.

Means to couple the host HST, the display device 10 with a touch detection function, the touch detection electrode TDL, the light source LS, the intermediate electrode ELC, and the electrode SUS are not limited to the above, and other means may be employed.

For example, one flexible printed substrate may be used in place of the above-described three independent flexible printed substrates T, T2, and T3 and the connectors CO1 and CO2. In this case, the one flexible printed substrate can be coupled with the host HST, a first branch portion of the one flexible printed substrate can be coupled with the display device 10 with a touch detection function, a second branch portion of the one flexible printed substrate can be coupled with the touch detection electrode TDL, and a third branch portion of the one flexible printed substrate can be coupled with the light source LS, the intermediate electrode ELC, and the electrode SUS. The flexible printed substrates, or the flexible printed substrate and the host HST or the substrate may be coupled with one another through connectors such as the connectors CO1 and CO2, or may be coupled by soldering in place of the connectors.

The host HST, the COG 19, and the touch IC 49 function as the controller CTRL that controls the touch detector SE1 including the drive electrode COML and the touch detection electrode TDL of the display device 10 with a touch detection function.

The host HST, the COG 19, and the touch IC 49 function as the controller CTRL that controls the force detector SE2 including the drive electrode COML, the intermediate electrode ELC, and the electrode SUS of the display device 10 with a touch detection function.

The host HST can be rephrased as application processor. The touch IC 49 can provide a timing signal, which gives drive timing of the touch detector SE1 and the force detector SE2, to the COG 19. Alternatively, the COG 19 can provide a timing signal, which gives drive timing of the drive electrode COML, to the touch IC 49. Alternatively, the host HST can provide a timing signal to the COG 19 and the touch IC 49. With this timing signal, driving of the COG 19 and driving of the touch IC 49 can be synchronized.

The cover member CG is positioned outside the display device 10 with a touch detection function and faces the counter substrate 3. In this configuration example, the input surface IS of the display apparatus 1 with a touch detection function is a surface of the cover member CG. The display apparatus 1 with a touch detection function can detect a position and a contact area of the object to be detected OBJ when the object to be detected OBJ comes in contact with the input surface IS.

The force detector SE2 of the display apparatus 1 with a touch detection function can output a signal according to force to the controller CTRL when the force is applied to the input surface IS by the object to be detected OBJ. The signal according to force is a signal according to force of the object to be detected OBJ that presses the input surface IS, and is a signal changed according to the magnitude of the force.

The first optical element OD1 is arranged between the pixel substrate 2 and the backlight apparatus BL. The first optical element OD1 is bonded to the pixel substrate 2.

The second optical element OD2 is arranged between the display device 10 with a touch detection function and the cover member CG. The second optical element OD2 is bonded to the counter substrate 3 and the touch detection electrode TDL.

Each of the first optical element OD1 and the second optical element OD2 includes at least a polarizing plate and may include a phase difference plate, as needed. An absorption axis of the polarizing plate included in the first optical element OD1 and an absorption axis of the polarizing plate included in the second optical element OD2 intersect with each other. For example, the absorption axis of the polarizing plate included in the first optical element OD1 and the absorption axis of the polarizing plate included in the second optical element OD2 are perpendicular to each other.

The cover member CG is bonded to the second optical element OD2 with an adhesive layer AL. Examples of the adhesive layer AL include an optically clear resin (OCR). The display device 10 with a touch detection function detects force, and thus the adhesive layer AL may be elastically deformed as long as the adhesive layer AL can transfer the force applied from the cover member CG to the second optical element OD2.

The touch detection electrode TDL is arranged between the drive electrode COML and the cover member CG. In this configuration example, the touch detection electrode TDL is provided on the upper side of a surface of the counter substrate 3, the surface facing the second optical element OD2. The touch detection electrode TDL may be in contact with the counter substrate 3 or may be separated from the counter substrate 3. When touch detection electrode TDL is separated from the counter substrate 3, a member such as an insulating film (not illustrated) lies between the counter substrate 3 and the touch detection electrode TDL. The touch detection electrode TDL extends in the Y direction as the second direction.

The drive electrode COML and the touch detection electrode TDL form the mutual-capacitive and self-capacitive touch detectors SE1. The drive electrode COML functions as a display electrode and also functions as a sensor drive electrode. The touch detector SE1 is used to detect the position and the contact area of the object to be detected OBJ.

In the present configuration example, the electrode SUS is formed of a conductor (for example, aluminum). The potential of the electrode SUS is the reference potential. As the reference potential, the ground potential GND is exemplified. Any of the touch IC 49, the COG 19, and the host HST is electrically coupled with the electrode SUS by wiring or the like, and the reference potential may be supplied from any of the touch IC 49, the COG 19, and the host HST to the electrode SUS.

The electrode SUS is arranged with a space from the display device 10 with a touch detection function. In the present configuration example, the cushion layer CUS is provided between the display device 10 with a touch detection function and the electrode SUS. That is, the display apparatus 1 with a touch detection function includes the air layer AG between the display device 10 with a touch detection function and the backlight apparatus BL, and the cushion layer CUS between the backlight apparatus BL and the electrode SUS.

The air layer AG and the cushion layer CUS are provided between the electrode SUS and the drive electrode COML. With the existence of the air layer AG and the cushion layer CUS, the thickness of the space between the electrode SUS and the drive electrode COML is changeable according to the magnitude of the force applied to the input surface IS. When the force applied to the input surface IS is removed, the thickness of the space between the electrode SUS and the drive electrode COML returns to the original thickness as time proceeds.

The drive electrode COML is an example of "first electrode" of the present invention. The intermediate electrode ELC is an example of "second electrode" of the present invention. The electrode SUS is an example of "conductor" of the present invention. The air layer AG is an example of "first layer" of the present invention. The cushion layer CUS is an example of "second layer" of the present invention.

In the present configuration example, the air layer AG is provided between the display device 10 with a touch detection function and the backlight apparatus BL. However, the embodiment is not limited thereto. A resin layer having high transmittance of light emitted from the backlight apparatus BL may be provided between the display device 10 with a touch detection function and the backlight apparatus BL, in place of the air layer AG. In this case, the degree of change of the thickness of the resin layer with respect to the force may be larger than the degree of change of the thickness of the cushion layer CUS with respect to the force. That is, the resin layer may be softer than the cushion layer CUS. In this case, the resin layer is an example of "first layer" of the present invention.

A distance $d_3$ from the electrode SUS to the drive electrode COML is a distance in the Z direction as the third direction, and is a distance from a surface of the electrode SUS to a surface of the drive electrode COML. The surface of the electrode SUS is a surface facing the drive electrode COML, and the surface of the drive electrode COML is a surface facing the electrode SUS. The distance $d_3$ is changed according to the magnitude of the force applied to the cover member CG and the position where the force is applied.

Capacitance $C_3$ exists between the drive electrode COML and the electrode SUS. That is, the drive electrode COML is capacitively coupled with the electrode SUS. The capacitance $C_3$ is series coupling of capacitance $C_1$ between the drive electrode COML and the intermediate electrode ELC and capacitance $C_2$ between the intermediate electrode ELC and the electrode SUS. That is, $C_3=1/(1/C_1+1/C_2)$ is established. The capacitance $C_1$, $C_2$, and $C_3$ are changed corresponding to the distance $d_3$. Therefore, the COG 19 detects the change of the capacitance $C_1$, $C_2$, and $C_3$ to detect force information. A principle of the force detection will be described below in detail.

The capacitance $C_1$ is an example of "first capacitance" of the present invention. The capacitance $C_2$ is an example of "second capacitance" of the present invention.

The force detection controller 50 drives the drive electrode COML to obtain the force information based on the change of the capacitance $C_1$, $C_2$ and $C_3$ from the drive electrode COML. For example, the force detection controller 50 is included in the COG 19, and the COG 19 outputs a signal to the drive electrode COML and reads a signal based on the change of the capacitance $C_1$, $C_2$ and $C_3$ from the drive electrode COML. The force detection controller 50 may be included in the touch IC 49 or the host HST. The display controller 11, the touch detection controller 40, the force detection controller 50, and the host HST may control the touch detector SE1, the display device DP, and the force detector SE2 in cooperation with one another.

In the present configuration example, the drive electrode COML is shared among the touch detector SE1, the display device DP, and the force detector SE2.

Figure 17:
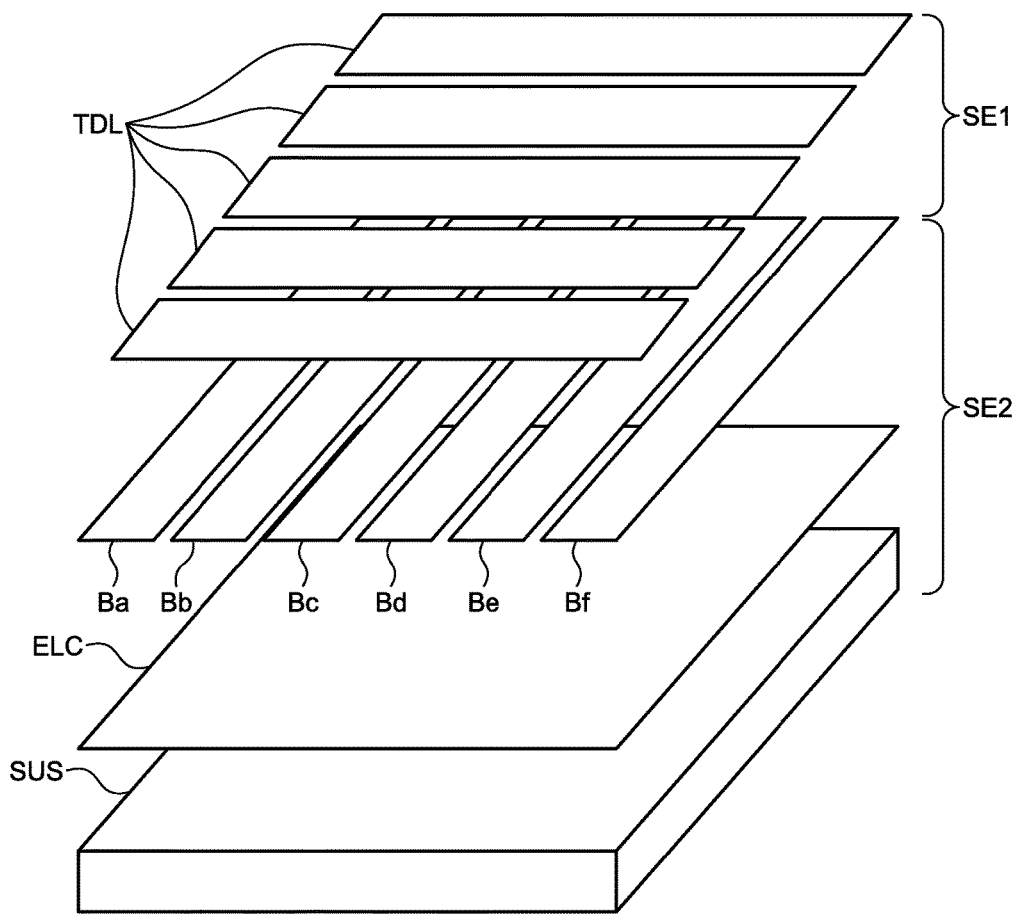
FIG. 17 is a perspective view illustrating the touch detection electrodes, drive electrode blocks, an intermediate electrode, and an electrode of the display apparatus with a touch detection function according to the embodiment.

FIG. 17 is a perspective view illustrating the touch detection electrodes, drive electrode blocks, an intermediate electrode, and an electrode of the display apparatus with a touch detection function according to the embodiment. A plurality of the touch detection electrodes TDL and drive electrode blocks Ba, Bb, Bc, Bd, Be, and Bf form the touch detector SE1 of FIG. 1.

The drive electrode blocks Ba, Bb, Bc, Bd, Be, and Bf, the intermediate electrode ELC, and the electrode SUS form the force detector SE2 of FIG. 1.

In the present embodiment, the unit of the drive blocks driven in the touch detector SE1 and the unit of drive electrode blocks driven in the force detector SE2 are the same. However, the embodiment is not limited thereto. For example, the touch detector SE1 may individually drive the drive electrode blocks, and the force detector SE2 may drive all the drive electrode blocks or two or more drive electrode blocks at the same time.

The intermediate electrode ELC may overlap with the drive electrode blocks Ba, Bb, Bc, Bd, Be, and Bf in plan view. That is, the size of the intermediate electrode ELC may be the same as the touch detection region consisting of the drive electrode blocks Ba, Bb, Bc, Bd, Be, and Bf, or may be larger than the touch detection region.

The electrode SUS may overlap with the intermediate electrode ELC in plan view. That is, the size of the electrode SUS may be the same as the size of the intermediate electrode ELC, or may be larger than the size of the intermediate electrode ELC.

Figure 18:
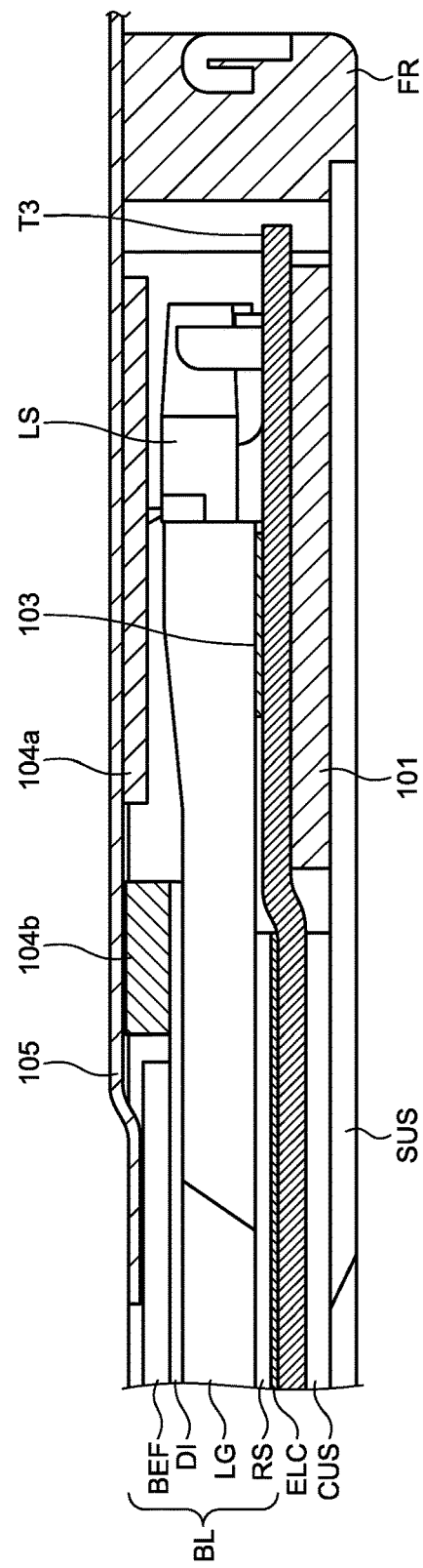
FIG. 18 is a sectional view illustrating an example of a configuration in the vicinity of a light source of the display apparatus with a touch detection function according to the embodiment.

FIG. 18 is a sectional view illustrating an example of a configuration in the vicinity of the light source of the display apparatus with a touch detection function according to the embodiment. In the configuration example illustrated in FIG. 18, the conductive tape 101 and the cushion layer CUS are arranged on the electrode SUS. Further, the flexible printed substrate T3 is arranged on the conductive tape 101 and the cushion layer CUS. The reference potential is supplied from the COG 19, the touch IC 49, or the host HST to the electrode SUS through the conductive tape 101 and the flexible printed substrate T3.

The intermediate electrode ELC is arranged above the cushion layer CUS and on the flexible printed substrate T3. With this configuration, the intermediate electrode ELC is coupled with the COG 19, the touch IC 49, or the host HST through the flexible printed substrate T3.

The light reflector RS of the backlight apparatus BL is arranged on the intermediate electrode ELC. The light guide LG of the backlight apparatus BL is arranged above the conductive tape 101 and on the flexible printed substrate T3 across a tape 103. The light source LS is arranged on the flexible printed substrate T3 to come in contact with a side surface of the light guide LG. A spacer 104a is arranged above the light guide LG and the light source LS, and a spacer 104b is arranged on the light diffusion sheet DI of the backlight apparatus BL. A tape 105 is arranged on the spacers 104a and 104b and the luminance enhancement film BEF of the backlight apparatus BL.

According to the configuration example illustrated in FIG. 18, the flexible printed substrate T3 for supplying the power to the light source LS extends to the back surface side of the backlight apparatus BL, and thus the intermediate electrode ELC can be arranged on the flexible printed substrate T3. With this configuration, simplification and reduction of the parts count of the configuration can be achieved.

Figure 19:
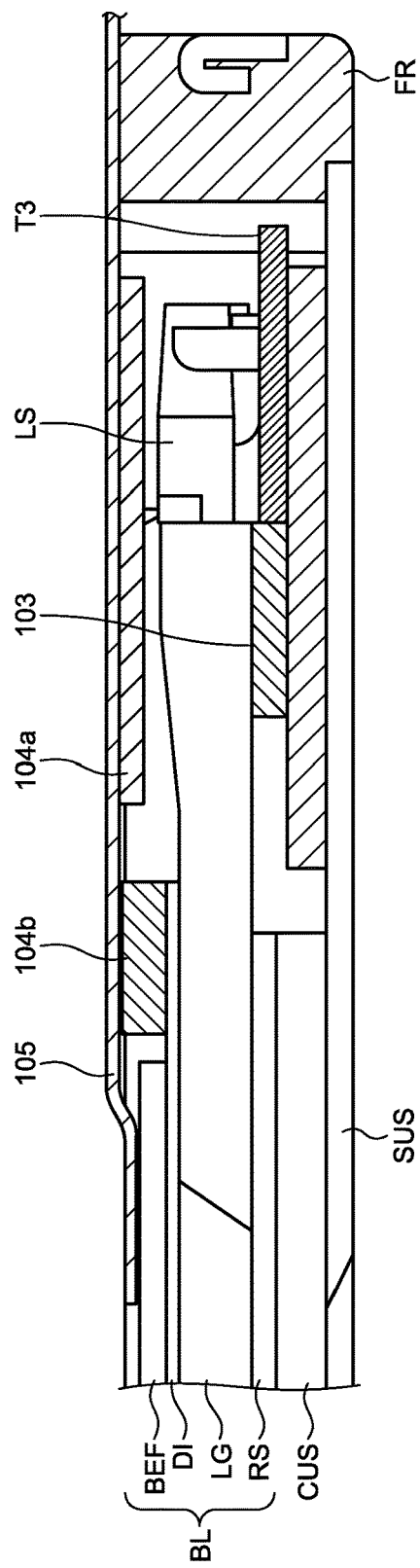
FIG. 19 is a sectional view illustrating an example of a configuration in the vicinity of a light source of a display apparatus with a touch detection function according to a comparative example.

FIG. 19 is a sectional view illustrating an example of a configuration in the vicinity of a light source of a display apparatus with a touch detection function according to a comparative example. Comparing FIG. 19 with FIG. 18, a flexible printed substrate T3 does not extend to a back surface side of a light guide LG in the comparative example.

Figure 20:
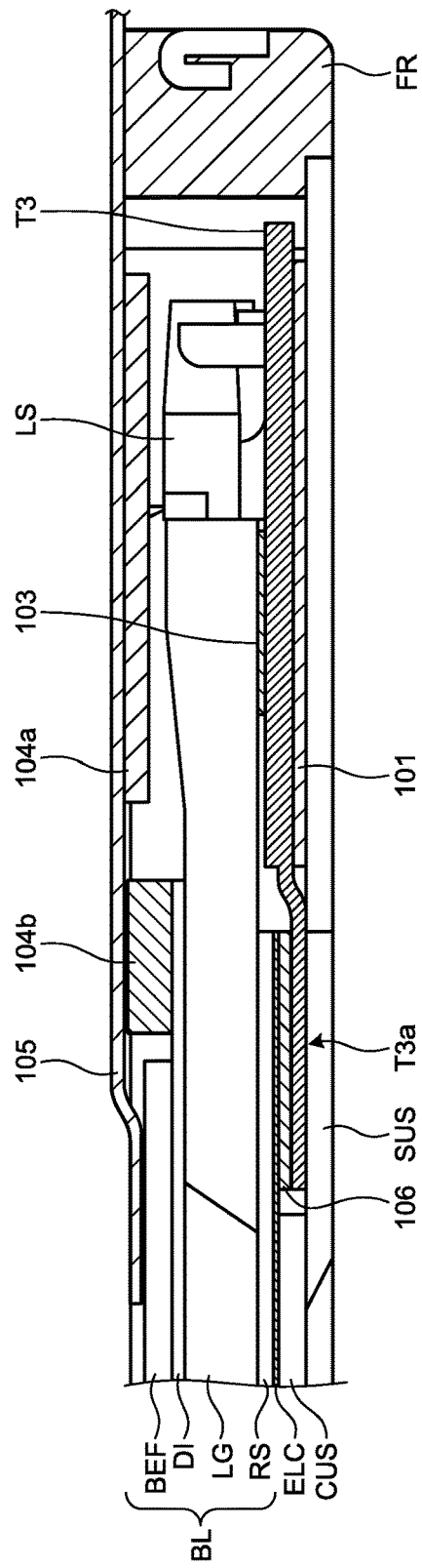
FIG. 20 is a sectional view illustrating another example of the configuration in the vicinity of the light source of the display apparatus with a touch detection function according to the embodiment.

FIG. 20 is a sectional view illustrating another example of the configuration in the vicinity of the light source of the display apparatus with a touch detection function according to the embodiment. In the configuration example illustrated in FIG. 20, the intermediate electrode ELC is arranged on a lower surface of the light reflector RS of the backlight apparatus BL.

A tip end portion T3a of the flexible printed substrate T3 is arranged on the electrode SUS and between the conductive tape 101 and the cushion layer CUS. A conductive tape 106 is arranged on the tip end portion T3a, and is coupled with the intermediate electrode ELC. With this configuration, the intermediate electrode ELC is coupled with the COG 19, the touch IC 49, or the host HST through the conductive tape 106 and the flexible printed substrate T3.

According to the configuration example illustrated in FIG. 20, the flexible printed substrate T3 for supplying the power to the light source LS can be coupled with the intermediate electrode ELC arranged on the lower surface of the light reflector RS. With this configuration, simplification and reduction of the parts count of the configuration can be achieved.

Figure 21:
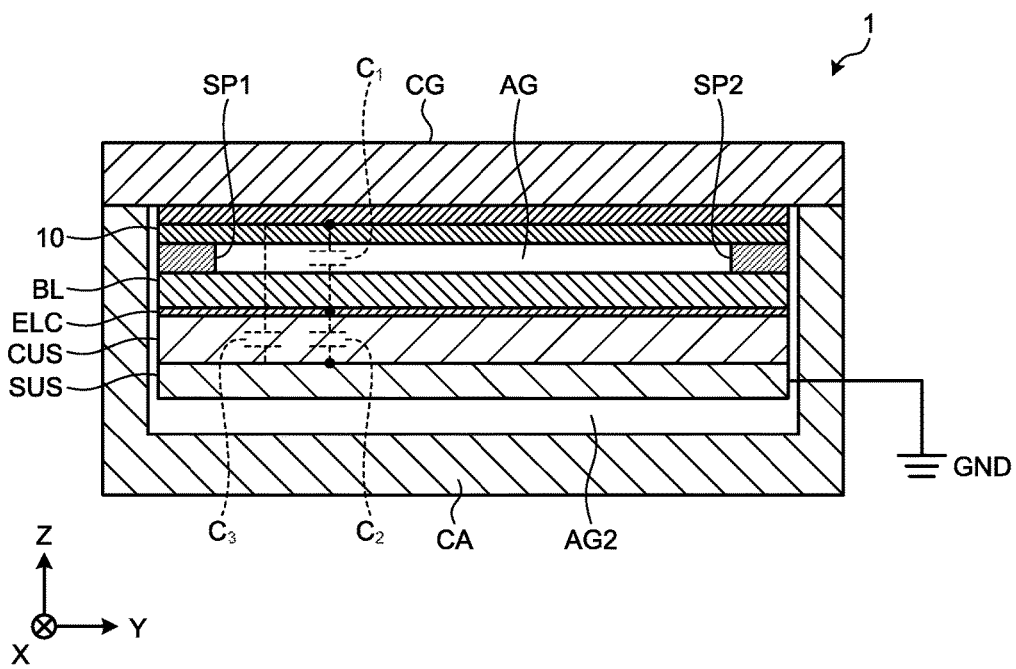
FIG. 21 is a sectional view illustrating an example of an overall configuration of the display apparatus with a touch detection function according to the embodiment.

FIG. 21 is a sectional view illustrating an example of an overall configuration of the display apparatus with a touch detection function according to the embodiment. In the configuration example illustrated in FIG. 21, end portions of the display device 10 with a touch detection function and the backlight apparatus BL are coupled by spacers SP1 and SP2, and the air layer AG is arranged between the display device 10 with a touch detection function and the backlight apparatus BL. The cushion layer CUS is arranged between the backlight apparatus BL and the electrode SUS. The configuration example illustrated in FIG. 21 is not provided with the frame FR illustrated in FIG. 15. An air layer AG2 is arranged between the electrode SUS and the casing CA.

Figure 22:
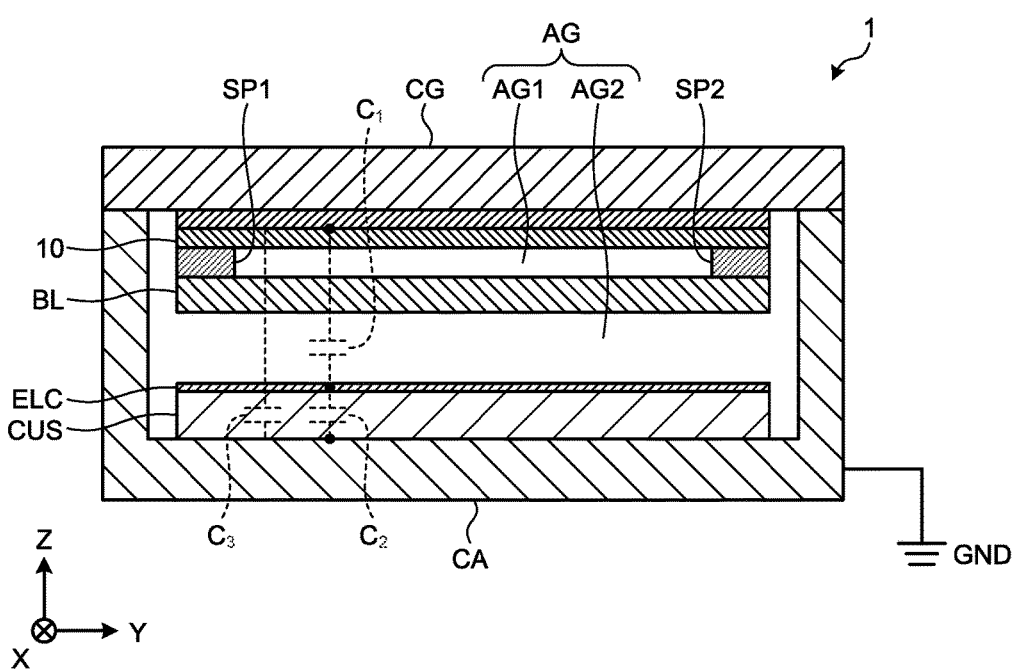
FIG. 22 is a sectional view illustrating another example of the overall configuration of the display apparatus with a touch detection function according to the embodiment.

FIG. 22 is a sectional view illustrating another example of the overall configuration of the display apparatus with a touch detection function according to the embodiment. In the configuration example illustrated in FIG. 22, end portions of the display device 10 with a touch detection function and the backlight apparatus BL are coupled by spacers SP1 and SP2, and the air layer AG1 lies between the display device 10 with a touch detection function and the backlight apparatus BL. The casing CA is caused to have the reference potential. The cushion layer CUS is provided on a bottom surface of the casing CA, and the intermediate electrode ELC is provided on the cushion layer CUS. The air layer AG2 lies between the backlight apparatus BL and the intermediate electrode ELC. The air layers AG1 and AG2 form the air layer AG between the drive electrode COML and the intermediate electrode ELC. In the configuration example illustrated in FIG. 22, the casing CA becomes a substitute for the electrode SUS. Therefore, the configuration example illustrated in FIG. 22 does not include the electrode SUS illustrated in FIGS. 14, 16, and 17.

In the configuration example illustrated in FIG. 22, the casing CA is an example of "conductor" of the present invention.

3. Principle of Force Detection 3-1. Comparative Example

Figure 23:
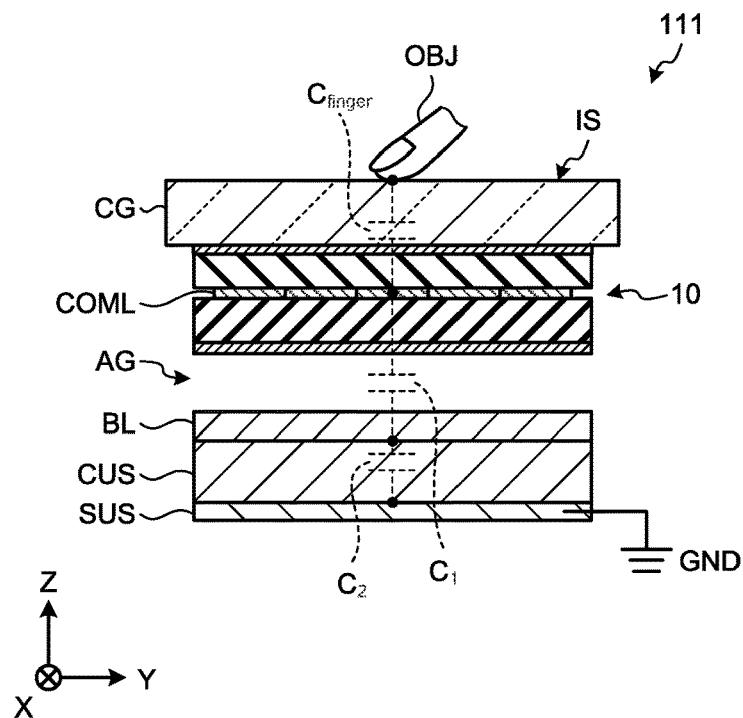
FIG. 23 is a sectional view illustrating a configuration of a display apparatus with a touch detection function according to a comparative example.

FIG. 23 is a sectional view illustrating a configuration of a display apparatus with a touch detection function according to a comparative example. A display apparatus 111 with a touch detection function according to the comparative example does not include an intermediate electrode ELC included in the display apparatus 1 with a touch detection function according to the embodiment (see FIG. 16).

Capacitance $C_1$ exists between the drive electrode COML and the cushion layer CUS, and capacitance $C_2$ exists between the cushion layer CUS and the electrode SUS.

As illustrated in FIG. 23, when the object to be detected (finger) OBJ comes in contact with the input surface IS, capacitance $C_{finger}$ occurs between the drive electrode COML and the object to be detected OBJ.

Figure 24:
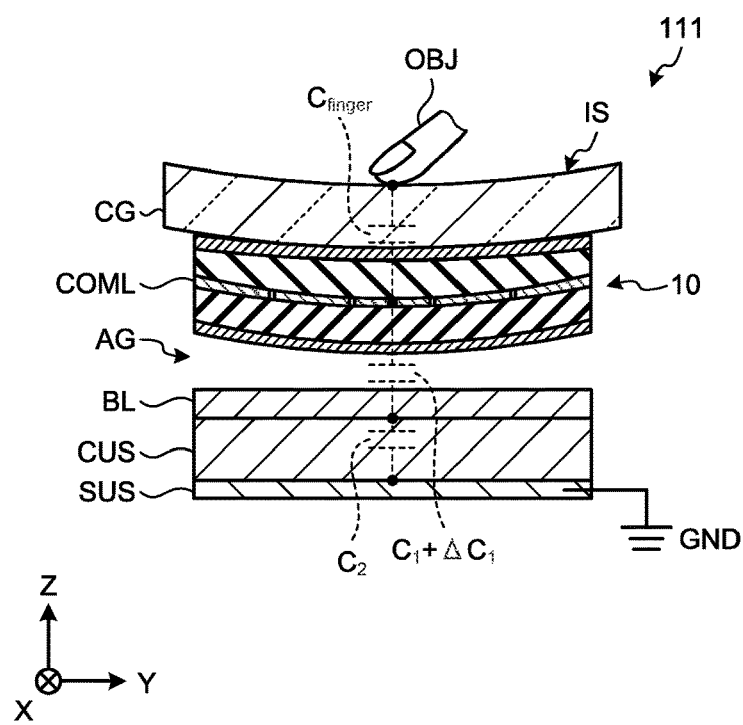
FIG. 24 is a sectional view illustrating the configuration of the display apparatus with a touch detection function according to the comparative example.

FIG. 24 is a sectional view illustrating the configuration of the display apparatus with a touch detection function according to the comparative example. As illustrated in FIG. 24, when the object to be detected OBJ applies force to the input surface IS, the display device 10 with a touch detection function is bent. When the display device 10 with a touch detection function is bent, the air layer AG becomes thin and the distance between the drive electrode COML and the cushion layer CUS becomes short. Therefore, the capacitance between the drive electrode COML and the cushion layer CUS is increased by $\Delta C_1$ to become $(C_1+\Delta C_1)$. Therefore, the capacitance between the drive electrode COML and the electrode SUS becomes the capacitance $C_3=1/(1/(C_1+\Delta C_1)+1/C_2)$. The display apparatus 111 with a touch detection function detects the force on the basis of the capacitance $C_3$ between the drive electrode COML and the electrode SUS.

Figure 25:
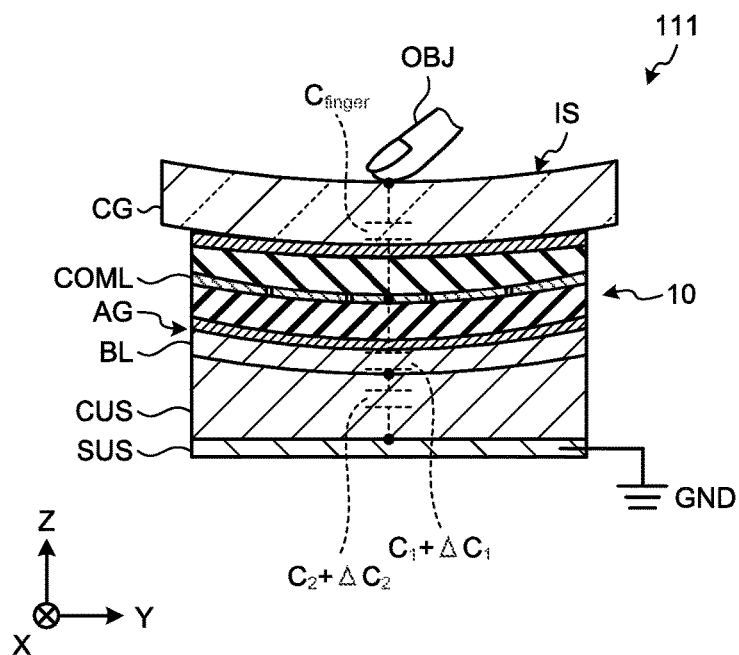
FIG. 25 is a sectional view illustrating the configuration of the display apparatus with a touch detection function according to the comparative example.

FIG. 25 is a sectional view illustrating the configuration of the display apparatus with a touch detection function according to the comparative example. As illustrated in FIG. 25, when the object to be detected OBJ further applies strong force to the input surface IS, the display device 10 with a touch detection function is bent, the thickness of the air layer AG reaches zero, the display device 10 with a touch detection function comes in contact with the backlight apparatus BL, and the cushion layer CUS is compressed and elastically deformed.

When the cushion layer CUS is compressed and elastically deformed, the distance between the cushion layer CUS and the electrode SUS becomes short, and thus the capacitance between the cushion layer CUS and the electrode SUS is increased by $\Delta C_2$ to become $(C_2+\Delta C_2)$. Therefore, the capacitance between the drive electrode COML and the electrode SUS becomes the capacitance $C_3=1/(1/(C_1+\Delta C_1)+1/(C_2+\Delta C_2))$. The display apparatus 111 with a touch detection function detects the force on the basis of the capacitance $C_3$ between the drive electrode COML and the electrode SUS.

Figure 26:
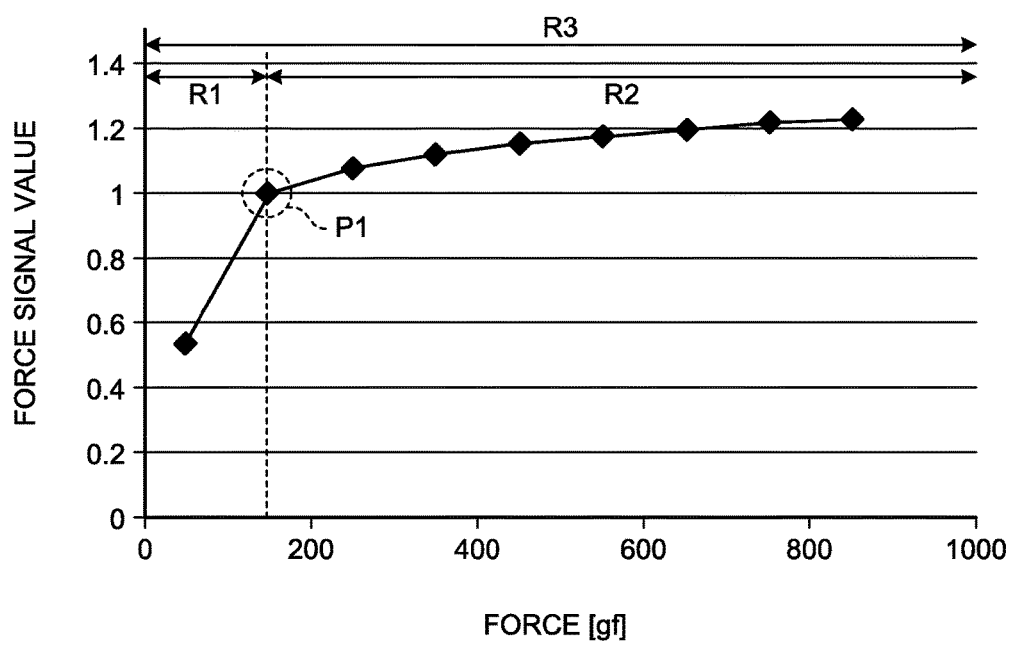
FIG. 26 is a graph illustrating a relationship between force applied to the display apparatus with a touch detection function according to the comparative example and a force signal value.

FIG. 26 is a graph for describing a relationship between force applied to the display apparatus with a touch detection function and a force signal value according to the comparative example. In FIG. 26, the horizontal axis represents the force (g weight) applied to the input surface IS. The vertical axis represents a force signal value detected on the basis of the capacitance between the drive electrode COML and the electrode SUS. The force signal value is a signal value on the basis of the detection signal Vdet3 output from the drive electrode COML according to the basic principle of the self-capacitive touch detection.

In a first range R1 of force in which only the air layer AG becomes thin and the cushion layer CUS is not deformed, the relationship between the force and the force signal value becomes linear.

Similarly, in second range R2 of force in which the thickness of the air layer AG reaches zero and the cushion layer CUS is elastically deformed according to force, the relationship between the force and the force signal value becomes linear.

However, permittivity of the air layer AG and permittivity of the cushion layer CUS are different. The degree of change of the thickness of the air layer AG with respect to the force and the degree of change of the thickness of the cushion layer CUS with respect to the force are different. Examples of the degree of change of the thickness of the cushion layer CUS with respect to the force include Young's modulus. The cushion layer CUS is less easily deformed than the air layer AG. Therefore, an inflection point P1 occurs in the relationship between the force and the force signal value in a boundary between the first range R1 and the second range R2. Therefore, in the entire range R3 that is a combination of the first range R1 and the second range R2, the relationship between the force and the force signal value is not linear. Therefore, the display apparatus 111 with a touch detection function cannot favorably detect the force. That is, the display apparatus 111 with a touch detection function cannot improve detection accuracy of the force.

In FIG. 26, the scales of the vertical axis are normalized, where the force signal value at the inflection point P1 is "1".

3-2. Principle of Force Detection

Figure 27:
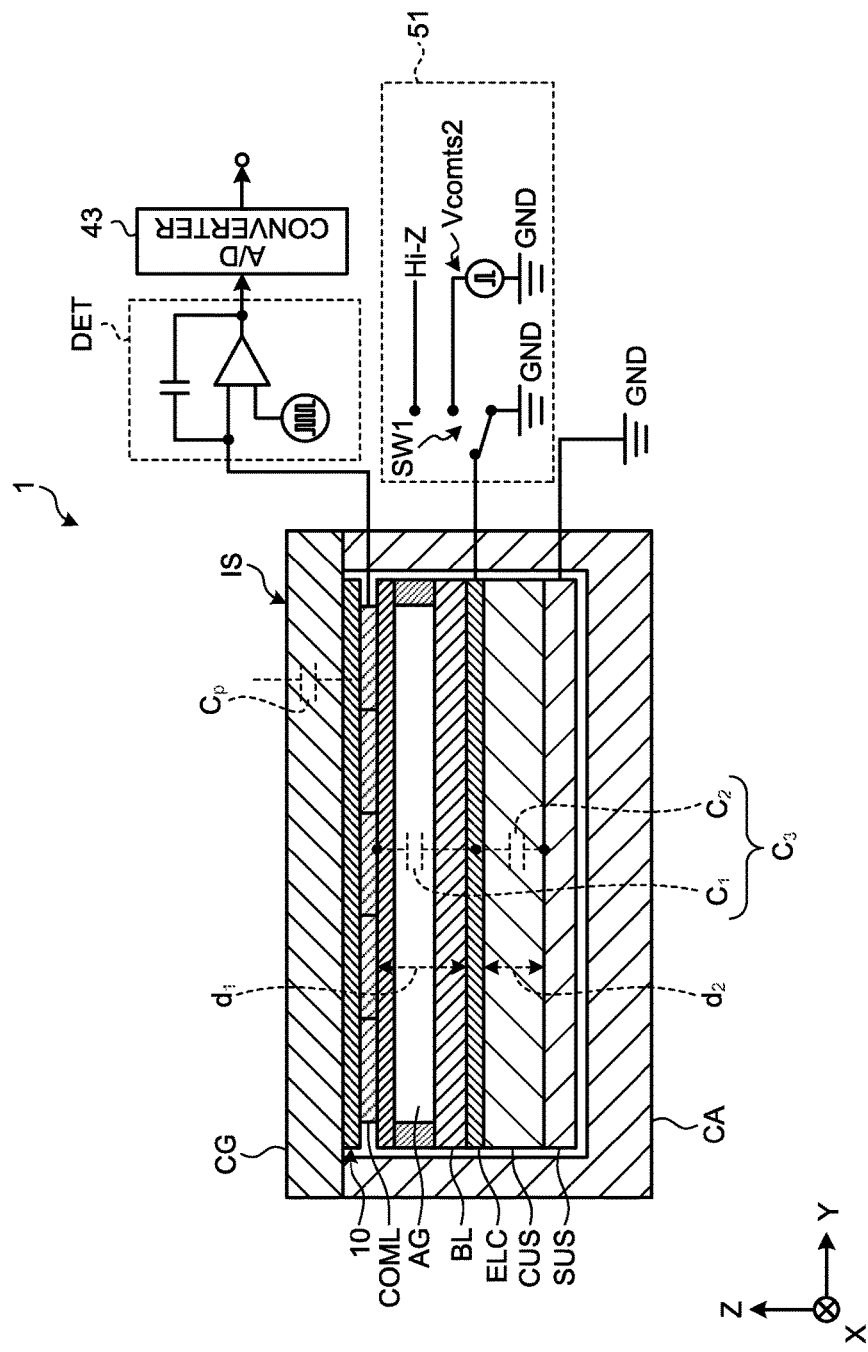
FIG. 27 is a diagram illustrating a principle of force detection of the display apparatus with a touch detection function according to the embodiment.

FIG. 27 is a diagram illustrating a principle of force detection of the display apparatus with a touch detection function according to the embodiment. FIG. 27 illustrates the display apparatus 1 with a touch detection function when the object to be detected OBJ does not apply the force to the input surface IS.

The drive electrode COML of the display apparatus 1 with a touch detection function is coupled with the voltage detector DET (see FIG. 8). An output signal of the voltage detector DET corresponds to the detection signal Vdet3 according to the basic principle of the self-capacitive touch detection. The A/D converter 43 (see FIG. 2) performs analog-to-digital conversion on the detection signal Vdet3, and the converted detection signal Vdet3 is input to the force detection controller 50 (see FIG. 1). The voltage detector DET and the A/D converter 43 can be used in the touch detection controller 40 (see FIG. 1) and the force detection controller 50.

The intermediate electrode ELC is coupled with a potential controller 51. The potential controller 51 includes a switch SW1 having three modes including a first mode for causing the potential of the intermediate electrode ELC to be the reference potential, a second mode for causing the potential of the intermediate electrode ELC to be high impedance, and a third mode for outputting the signal having the same phase and the same amplitude as the drive signal Vcomts2 to the intermediate electrode ELC. The potential controller 51 may be included in the force detection controller 50.

Suppose that a space between the drive electrode COML and the intermediate electrode ELC when the object to be detected OBJ does not apply the force to the input surface IS is denoted as $d_1$, and a space between the intermediate electrode ELC and the electrode SUS when the object to be detected OBJ does not apply the force to the input surface IS is denoted as $d_2$.

Parasitic capacitance $C_p$ due to a member included in the display apparatus 1 with a touch detection function exists in the drive electrode COML. When the object to be detected OBJ does not apply the force to the input surface IS, reference first capacitance $C_1$ exists between the drive electrode COML and the intermediate electrode ELC, reference second capacitance $C_2$ exists between the intermediate electrode ELC and the electrode SUS, and reference third capacitance $C_3$ exists between the drive electrode COML and the electrode SUS. The reference third capacitance $C_3$ is series coupling of the reference first capacitance $C_1$ and the reference second capacitance $C_2$. That is, $C_3=1/(1/C_1+1/C_2)$ is established.

When the potential controller 51 causes the potential of the intermediate electrode ELC to be the reference potential, the reference second capacitance $C_2$ is shielded by the intermediate electrode ELC. Therefore, capacitance $C_{GND\_base}$ caused in the drive electrode COML and detected by the voltage detector DET is expressed by the following expression (1):

$$C_{GND\_base}=C_p+C_1 \qquad (1)$$

When the potential controller 51 causes the potential of the intermediate electrode ELC to be high impedance, capacitance $C_{float\_base}$ caused in the drive electrode COML and detected by the voltage detector DET is expressed by the following expression (2):

$$C_{float\_base}=C_p+C_3 \qquad (2)$$

When the potential controller 51 outputs the signal having the same phase and the same amplitude as the drive signal Vcomts2 to the intermediate electrode ELC, both ends of the reference first capacitance $C_1$ have the same phase and the same potential, the reference first capacitance $C_1$ can be considered to be zero, and the reference second capacitance $C_2$ is shielded by the intermediate electrode ELC. Therefore, capacitance $C_{Guard\_base}$ caused in the drive electrode COML and detected by the voltage detector DET is expressed by the following expression (3):

$$C_{Guard\_base}=C_p \qquad (3)$$

In this disclosure, "the same potential" is the same potential or substantially the same potential, and "zero" is zero or substantially zero.

The reference first capacitance $C_1$ can be calculated by the following expression (4) derived from the expressions (1) and (3):

$$C_1=C_{GND\_base}-C_{Guard\_base} \qquad (4)$$

The reference third capacitance $C_3$ can be calculated by the following expression (5) derived from the expressions (2) and (3):

$$C_3=C_{float\_base}-C_{Guard\_base} \qquad (5)$$

Since $C_3=1/(1/C_1+1/C_2)$ is established, $1/C_2=1/C_3-1/C_1$ is established. Therefore, the reference second capacitance $C_2$ can be calculated by the following expression (6):

$$C_2=1/(1/C_3-1/C_1) \qquad (6)$$

As described above, the potential controller 51 causes the potential of the intermediate electrode ELC to be the reference potential, causes the potential of the intermediate electrode ELC to be high impedance, and outputs the signal having the same phase and the same amplitude as the drive signal Vcomts2 to the intermediate electrode ELC. Therefore, the force detection controller 50 can calculate the reference first capacitance $C_1$ and the reference second capacitance $C_2$ by the expressions (4) and (6).

Figure 28:
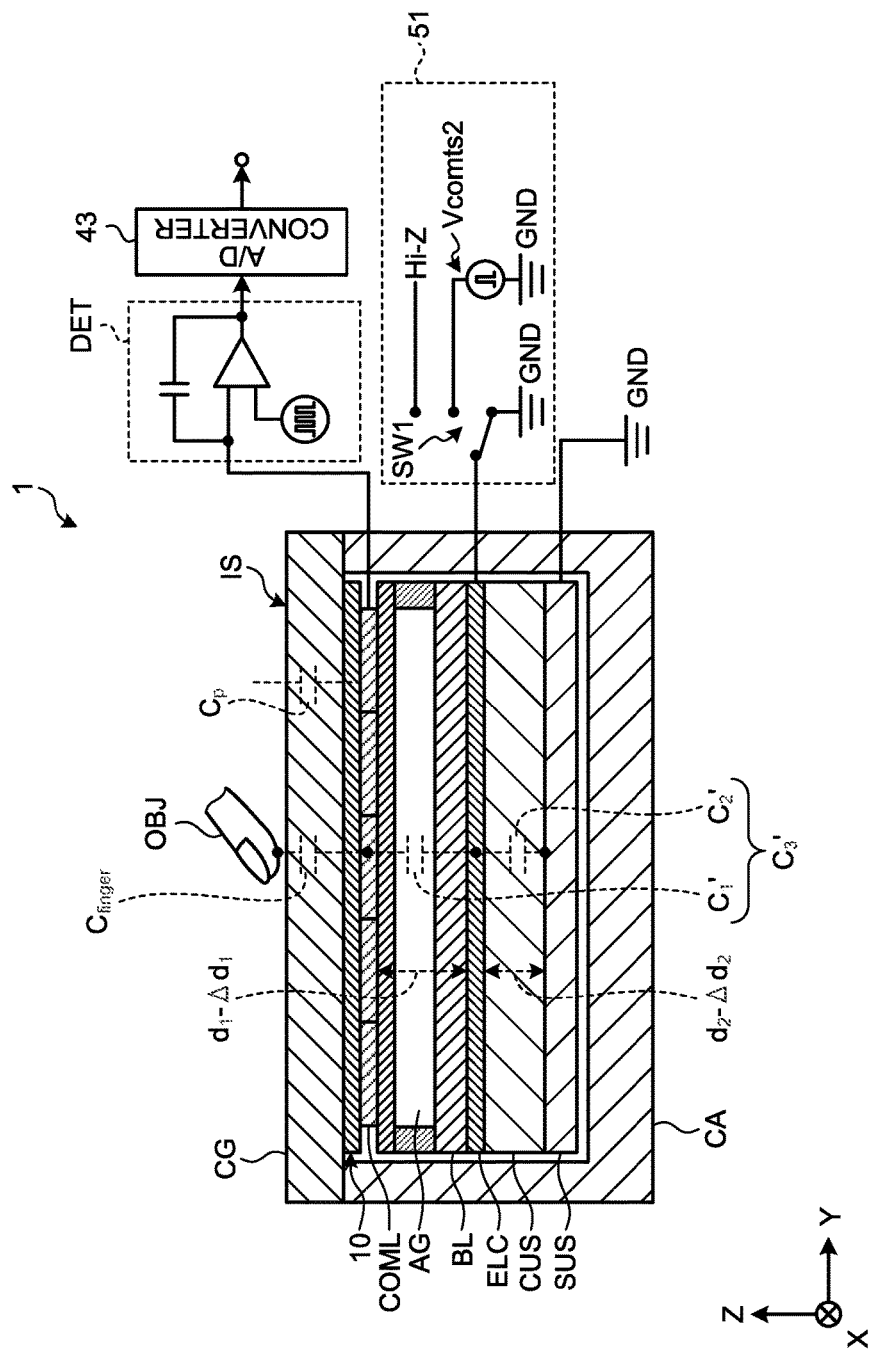
FIG. 28 is a diagram illustrating a principle of force detection of the display apparatus with a touch detection function according to the embodiment.

FIG. 28 is a diagram illustrating a principle of force detection of the display apparatus with a touch detection function according to the embodiment. FIG. 28 illustrates the display apparatus 1 with a touch detection function when the object to be detected OBJ applies the force to the input surface IS. As illustrated in FIG. 28, when the object to be detected OBJ applies the force to the input surface IS, the capacitance $C_{finger}$ occurs between the object to be detected OBJ and the drive electrode COML.

Suppose that a change amount of the space between the drive electrode COML and the intermediate electrode ELC when the object to be detected OBJ applies the force to the input surface IS is denoted as $\Delta d_1$. The space between drive electrode COML and the intermediate electrode ELC when the object to be detected OBJ applies the force to the input surface IS is expressed by $d_1-\Delta d_1$.

Suppose that a change amount of the space between the intermediate electrode ELC and the electrode SUS when the object to be detected OBJ applies the force to the input surface IS is denoted as $\Delta d_2$. The space between the intermediate electrode ELC and the electrode SUS when the object to be detected OBJ applies the force to the input surface IS is expressed by $d_2-\Delta d_2$.

When the object to be detected OBJ applies the force to the input surface IS, first capacitance at force application $C_1'$ exists between the drive electrode COML and the intermediate electrode ELC, second capacitance at force application $C_2'$ exists between the intermediate electrode ELC and the electrode SUS, and third capacitance at force application $C_3'$ exists between the drive electrode COML and the electrode SUS. The third capacitance at force application $C_3'$ is series coupling of the first capacitance at force application $C_1'$ and the second capacitance at force application $C_2'$. That is, $C_3'=1/(1/C_1'+1/C_2')$ is established.

When the potential controller 51 causes the potential of the intermediate electrode ELC to be the reference potential, the second capacitance at force application $C_2'$ is shielded by the intermediate electrode ELC. Therefore, capacitance $C_{GND\_finger}$ caused in the drive electrode COML and detected by the voltage detector DET is expressed by the following expression (7):

$$C_{GND\_finger}=C_p+C_1'+C_{finger} \qquad (7)$$

When the potential controller 51 causes the potential of the intermediate electrode ELC to be high impedance, capacitance $C_{float\_finger}$ caused in the drive electrode COML and detected by the voltage detector DET is expressed by the following expression (8):

$$C_{float\_finger}=C_p+C_3'+C_{finger} \qquad (8)$$

When the potential controller 51 outputs the signal having the same phase and the same amplitude as the drive signal Vcomts2 to the intermediate electrode ELC, both ends of the first capacitance at force application $C_1'$ have the same phase and the same potential, the first capacitance at force application $C_1'$ can be considered to be zero, and the second capacitance at force application $C_2'$ is shielded by the intermediate electrode ELC. Therefore, capacitance $C_{Guard\_finger}$ caused in the drive electrode COML and detected by the voltage detector DET is expressed by the following expression (9):

$$C_{Guard\_finger} = C_p + C_{finger} \quad (9)$$

The force detection controller 50 can calculate the first capacitance at force application $C_1'$ by the following expression (10) derived from the expressions (7) and (9):

$$C_1' = C_{GND\_finger} - C_{Guard\_finger} \quad (10)$$

The force detection controller 50 can calculate the third capacitance at force application $C_3'$ by the following expression (11) derived from the expressions (8) and (9):

$$C_3' = C_{float\_finger} - C_{Guard\_finger} \quad (11)$$

Since $C_3' = 1/(1/C_1' + 1/C_2')$ is established, $1/C_2' = 1/C_3' - 1/C_1'$ is established. Therefore, the force detection controller 50 can calculate the second capacitance at force application $C_2'$ by the following expression (12):

$$C_2' = 1/(1/C_3' - 1/C_1') \quad (12)$$

As described above, the potential controller 51 causes the potential of the intermediate electrode ELC to be the reference potential and causes the potential of the intermediate electrode ELC to be high impedance, and outputs the signal having the same phase and the same amplitude as the drive signal Vcomts2 to the intermediate electrode ELC. Therefore, the force detection controller 50 can calculate the first capacitance at force application $C_1'$ and the second capacitance at force application $C_2'$ by the expressions (10) and (12).

Therefore, the force detection controller 50 can calculate a first influence amount $C_{force\_C1}$ on the basis of the expressions (4) and (10). The first influence amount $C_{force\_C1}$ is the amount of influence added to the capacitance between the drive electrode COML and the intermediate electrode ELC when the object to be detected OBJ applies the force to the input surface IS. The force detection controller 50 can calculate a second influence amount $C_{force\_C2}$ on the basis of the expressions (6) and (12). The second influence amount $C_{force\_C2}$ is the amount of influence added to the capacitance between the intermediate electrode ELC and the electrode SUS when the object to be detected OBJ applies the force to the input surface IS. A method of calculating the first influence amount $C_{force\_C1}$ and the second influence amount $C_{force\_C2}$ will be described below.

Therefore, the force detection controller 50 can calculate an influence amount, that is, the force signal value $C_{force}$ by a multiply-accumulate operation of the first influence amount $C_{force\_C1}$ and the second influence amount $C_{force\_C2}$. The influence amount (force signal value $C_{force}$) is the amount of influence added to the capacitance between the drive electrode COML and the electrode SUS when the object to be detected OBJ applies the force to the input surface IS. The multiply-accumulate operation is expressed by the following expression (13):

$$C_{force} = \alpha \cdot C_{force\_C1} + \beta \cdot C_{force\_C2} \quad (13)$$

In the expression (13), $\alpha$ is a predetermined first constant and $\beta$ is a predetermined second constant.

Figure 29:
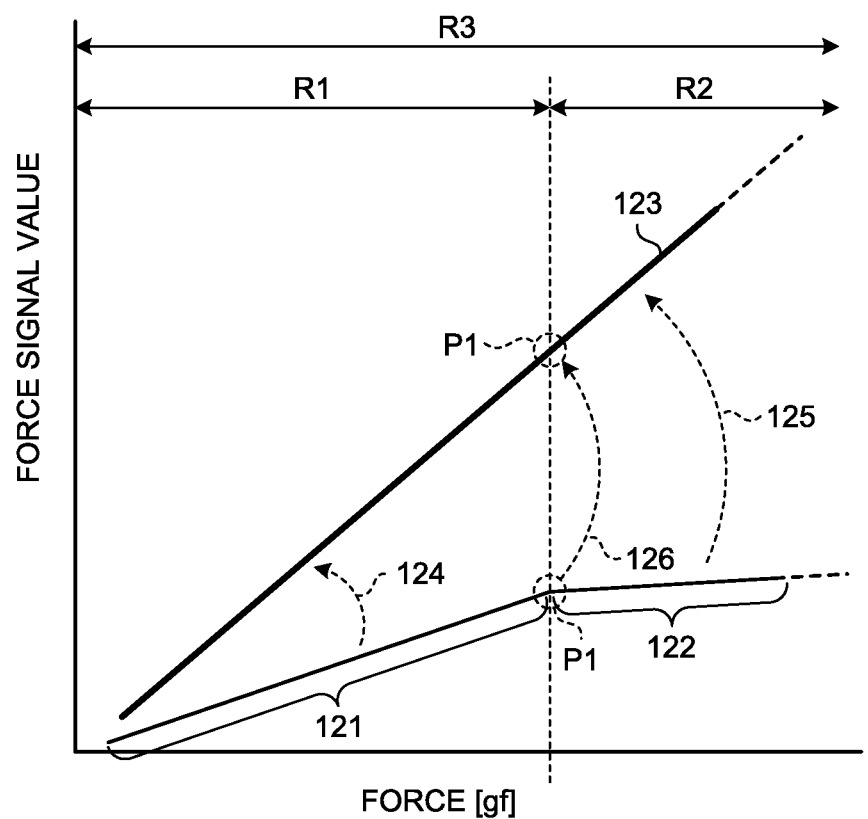
FIG. 29 is a graph for describing a principle of force detection of the display apparatus with a touch detection function according to the embodiment.

FIG. 29 is a graph for describing a principle of force detection of the display apparatus with a touch detection function according to the embodiment. The first constant $\alpha$ in the expression (13) is a value that changes an inclination of a line 121 toward an inclination of a target straight line 123 in a first range R1 of force in which only the air layer AG becomes thin and the cushion layer CUS is not deformed. The line 121 indicates a relationship between the force and a force signal value. According to the first term $\alpha \cdot C_{force\_C1}$ on the right side of the expression (13), the line 121 is shifted in the direction of an arrow 124 to overlap with the target straight line 123.

The second constant $\beta$ in the expression (13) is a value that changes an inclination of a line 122 toward the inclination of the target straight line 123 in the second range R2 of force in which the thickness of the air layer AG reaches zero and the cushion layer CUS is elastically deformed according to the force. The line 122 is indicates the relationship between the force and the force signal value. According to the second term $\beta \cdot C_{force\_C2}$ on the right side of the expression (13), the line 122 is shifted in the direction of an arrow 125 to overlap with the target straight line 123.

The inflection point P1 is shifted in the direction of an arrow 126 to overlap with the target straight line 123.

The inclination of the target straight line 123 can be an arbitrary inclination. The first constant $\alpha$ can be determined in advance on the basis of the inclination of the target straight line 123 and the inclination of the line 121. The second constant $\beta$ can be determined in advance on the basis of the inclination of the target straight line 123 and the inclination of the line 122.

Therefore, the relationship between the force and the force signal value overlaps with the target straight line 123 in the entire range R3 that is a combination of the first range R1 and the second range R2. That is, the display apparatus 1 with a touch detection function can make the relationship between the force and the force signal value linear. Therefore, the display apparatus 1 with a touch detection function can favorably detect the force. That is, the display apparatus 1 with a touch detection function can improve the detection accuracy of the force.

3-2-1. First Calculation Method

In a first calculation method, calculation of a difference between the reference first capacitance C1 and the first capacitance at force application C1' is performed to obtain the first influence amount $C_{force\_C1}$. That is, the first influence amount $C_{force\_C1}$ can be calculated by the following expression (14):

$$C_{force\_C1} = C_1 - C_1' \quad (14)$$

To be specific, the force detection controller 50 can calculate the first influence amount $C_{force\_C1}$ by subtracting the right side of the expression (10) from the right side of the expression (4).

Similarly, in the first calculation method, calculation of a difference between the reference second capacitance C2 and the second capacitance at force application C2' is performed to obtain the second influence amount $C_{force\_C2}$. That is, the second influence amount $C_{force\_C2}$ can be calculated by the following expression (15):

$$C_{force\_C2} = C_2 - C_2' \quad (15)$$

To be specific, the force detection controller 50 can calculate the second influence amount $C_{force\_C2}$ by subtracting the right side of the expression (12) from the right side of the expression (6).

Typically, capacitance C is defined by the following expression (16), using a counter area S of both electrodes, permittivity ∈ of a substance between both electrodes, and a distance d between both electrodes:

$$C = \in \cdot S/d \quad (16)$$

Therefore, the first influence amount $C_{force\_C1}$ $(=C_1-C_1')$ can be expressed by the following expression (17):

$$C_{force\_C1} = C_1 - C_1' = -\frac{\varepsilon_1 S \Delta d_1}{d_1(d_1 - \Delta d_1)} \quad (17)$$

where the permittivity of the air layer AG is $\in_1$.

Similarly, the second influence amount $C_{force\_C2}$ $(=C_2-C_2')$ can be expressed by the following expression (18):

$$C_{force\_C2} = C_2 - C_2' = -\frac{\varepsilon_2 S \Delta d_2}{d_2(d_2 - \Delta d_2)} \quad (18)$$

where the permittivity of the cushion layer CUS is $\in_2$.

The right side of the expression (17) includes a space $d_1$ between the drive electrode COML and the intermediate electrode ELC when the object to be detected OBJ does not apply the force to the input surface IS. That is, a calculated value of the expression (14) depends on the space $d_1$ of the force detector SE2. The space $d_1$ of the force detector SE2 has an individual difference. Therefore, the calculated value of the expression (14) is affected by the individual difference of the force detector SE2.

Similarly, the right side of the expression (18) includes a space $d_2$ between the intermediate electrode ELC and the electrode SUS when the object to be detected OBJ does not apply the force to the input surface IS. That is, a calculated value of the expression (15) depends on the space $d_2$ of the force detector SE2. The space $d_2$ of the force detector SE2 has an individual difference. Therefore, the calculated value of the expression (15) is affected by the individual difference of the force detector SE2.

That is, in the first calculation method, the force signal value $C_{force}$ calculated by the expression (13) is affected by the individual difference of the force detector SE2.

3-2-2. Second Calculation Method

In a second calculation method, calculation of a difference between a reciprocal of the capacitance C1 and a reciprocal of the capacitance C1' is performed to obtain the first influence amount $C_{force\_C1}$. That is, the first influence amount $C_{force\_C1}$ can be calculated by the following expression (19):

$$C_{force\_C1} = 1/C_1 - 1/C_1' \quad (19)$$

To be specific, the force detection controller 50 can calculate the first influence amount $C_{force\_C1}$ by subtracting the reciprocal on the right side of the expression (10) from the reciprocal on the right side of the expression (4).

Similarly, in the second calculation method, calculation of a difference between a reciprocal of the capacitance C2 and a reciprocal of the capacitance C2' is performed to obtain the second influence amount $C_{force\_C2}$. That is, the second influence amount $C_{force\_C2}$ can be calculated by the following expression (20):

$$C_{force\_C2} = 1/C_2 - 1/C_2' \quad (20)$$

To be specific, the force detection controller 50 can calculate the second influence amount $C_{force\_C2}$ by subtracting the reciprocal on the right side of the expression (12) from the reciprocal on the right side of the expression (6).

Typically, the capacitance C is defined by the above-described expression (16). Therefore, the first influence amount $C_{force\_C1}$ $(=1/C_1-1/C_1')$ is expressed by the following expression (21):

$$C_{force\_C1} = \frac{1}{C_1} - \frac{1}{C_1'} = \frac{\Delta d_1}{\varepsilon_1 S} \quad (21)$$

where the permittivity of the air layer AG is $\in_1$.

Similarly, the second influence amount $C_{force\_C2}$ $(=1/C_2-1/C_2')$ is expressed by the following expression (22):

$$C_{force\_C2} = \frac{1}{C_2} - \frac{1}{C_2'} = \frac{\Delta d_2}{\varepsilon_2 S} \quad (22)$$

where the permittivity of the cushion layer CUS is $\in_2$.

The right side of the expression (21) does not include the space $d_1$ between the drive electrode COML and the intermediate electrode ELC when the object to be detected OBJ does not apply the force to the input surface IS. That is, a calculated value of the expression (21) does not depend on the space $d_1$ of the force detector SE2. Therefore, a calculated value of the expression (19) is not affected by the individual difference of the force detector SE2.

Similarly, the right side of the expression (22) does not include the space $d_2$ between the intermediate electrode ELC and the electrode SUS when the object to be detected OBJ does not apply the force to the input surface IS. That is, a calculated value of the expression (22) does not depend on the space $d_2$ of the force detector SE2. Therefore, a calculated value of the expression (20) is not affected by the individual difference of the force detector SE2.

That is, in the second calculation method, the force signal value $C_{force}$ calculated by the expression (13) is not affected by the individual difference of the force detector SE2.

Therefore, the second calculation method can detect more favorably the force than the first calculation method. That is, the second calculation method can further improve the detection accuracy of the force than the first calculation method.

When the second calculation method is employed, the force signal value $C_{force}$ of the expression (13) is expressed by the multiply-accumulate operation in the following expression (23):

$$C_{force} = \alpha C_{force\_C1} + \beta C_{force\_C2} = \alpha \frac{\Delta d_1}{\varepsilon_1 S} + \beta \frac{\Delta d_2}{\varepsilon_2 S} \quad (23)$$

4. Configuration and Operation of Force Detection Controller

Figure 30:
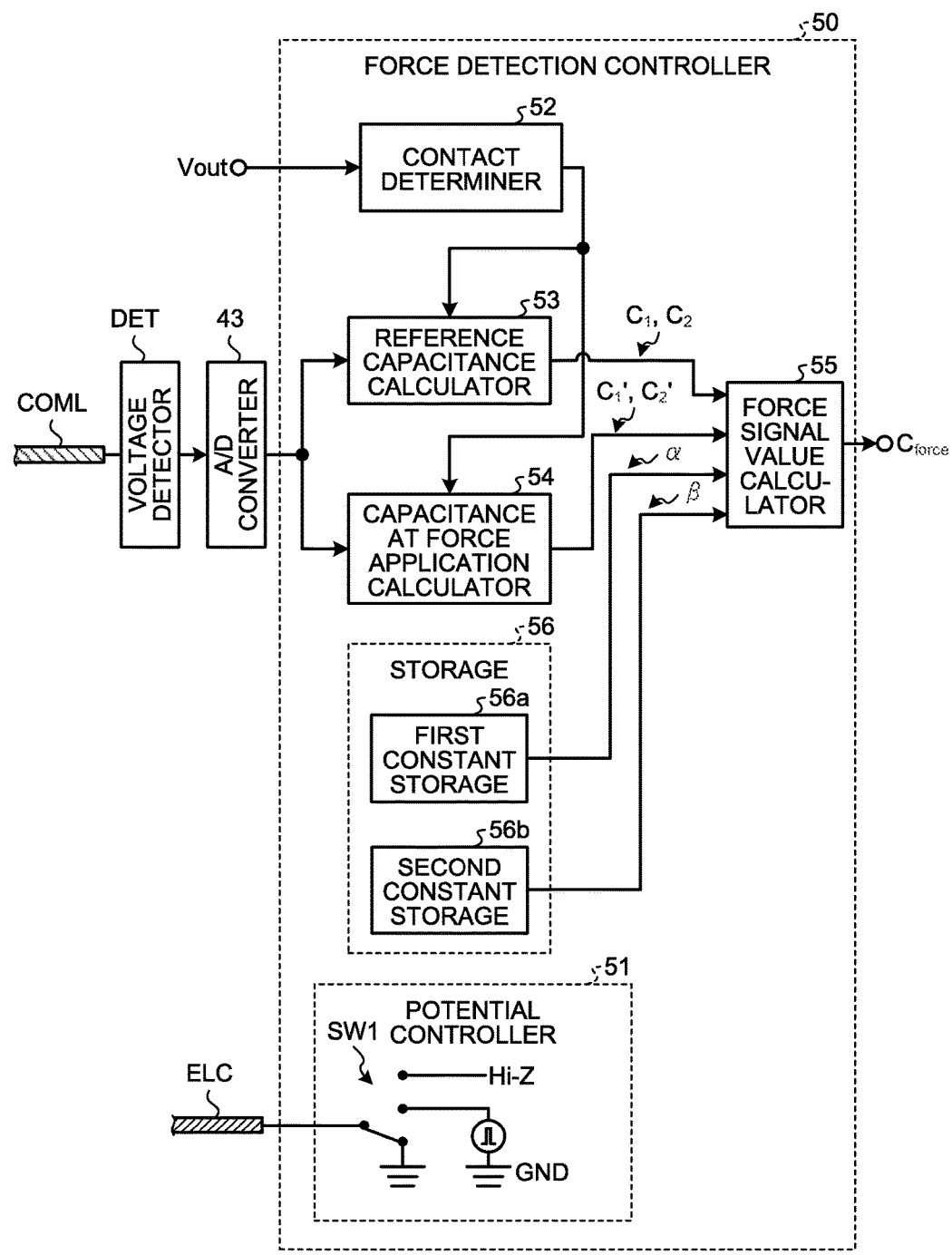
FIG. 30 is a diagram illustrating function blocks of a force detection controller of the display apparatus with a touch detection function according to the embodiment.

FIG. 30 is a diagram illustrating function blocks of a force detection controller of the display apparatus with a touch detection function according to the embodiment. The force detection controller 50 includes the potential controller 51, a contact determiner 52, a reference capacitance calculator 53, a capacitance at force application calculator 54, a force signal value calculator 55, and a storage 56. The storage 56 includes a first constant storage 56a that stores the first constant α and a second constant storage 56b that stores the second constant β.

The contact determiner 52, the reference capacitance calculator 53, the capacitance at force application calculator 54, and the force signal value calculator 55 can be realized by execution of programs by the COG 19, the touch IC 49, or the host HST. Alternatively, the contact determiner 52, the reference capacitance calculator 53, the capacitance at force application calculator 54, and the force signal value calculator 55 can be realized by execution of programs by two or more of the COG 19, the touch IC 49, and the host HST in cooperation with one another.

The switch SW1 of the potential controller 51 may be controlled by the host HST or may be controlled on the basis of a timing signal of image display or touch detection.

The contact determiner 52 determines whether the object to be detected OBJ is in contact with or in proximity to the input surface IS on the basis of the signal Vout output from the touch detection controller 40 (see FIG. 2).

The reference capacitance calculator 53 calculates the reference first capacitance $C_1$ that is the first capacitance when the force is not applied and the reference second capacitance $C_2$ that is the second capacitance when the force is not applied, on the basis of the capacitance caused in the drive electrode COML when the potential of the intermediate electrode ELC is caused to be the reference potential or high impedance, or when the signal having the same phase and the same amplitude as the drive signal Vcomts2 is applied to the intermediate electrode ELC. The reference capacitance calculator 53 outputs the reference first capacitance $C_1$ and the reference second capacitance $C_2$ to the force signal value calculator 55.

The capacitance at force application calculator 54 calculates the first capacitance at force application $C_1'$ that is the first capacitance when the force is applied and the second capacitance at force application $C_2'$ that is the second capacitance when the force is applied, on the basis of the capacitance caused in the drive electrode COML when the potential of the intermediate electrode ELC is caused to be the reference potential or high impedance, or when the signal having the same phase and the same amplitude as the drive signal Vcomts2 is applied to the intermediate electrode ELC. The capacitance at force application calculator 54 outputs the first capacitance at force application $C_1'$ and the second capacitance at force application $C_2'$ to the force signal value calculator 55.

The force signal value calculator 55 calculates the first influence amount $C_{force\_C1}$ on the basis of the reference first capacitance $C_1$ and the first capacitance at force application $C_1'$. The force signal value calculator 55 calculates the second influence amount $C_{force\_C2}$ on the basis of the reference second capacitance $C_2$ and the second capacitance at force application $C_2'$. The force signal value calculator 55 calculates the force signal value $C_{force}$ on the basis of the first influence amount $C_{force\_C1}$ and the second influence amount $C_{force\_C2}$.

Examples of the storage 56 include a volatile memory and a non-volatile memory. Examples of the volatile memory include a random access memory (RAM). Examples of the non-volatile memory include a flash memory (registered trademark). When the storage 56 is the volatile memory, the first constant α and the second constant β may be transferred from the host HST to the storage 56 at initialization (for example, at power-on or return from sleep of the display apparatus 1 with a touch detection function). When the storage 56 is the non-volatile memory, the first constant α and the second constant β may be written in the storage 56 at shipment of the display apparatus 1 with a touch detection function.

Figure 31:
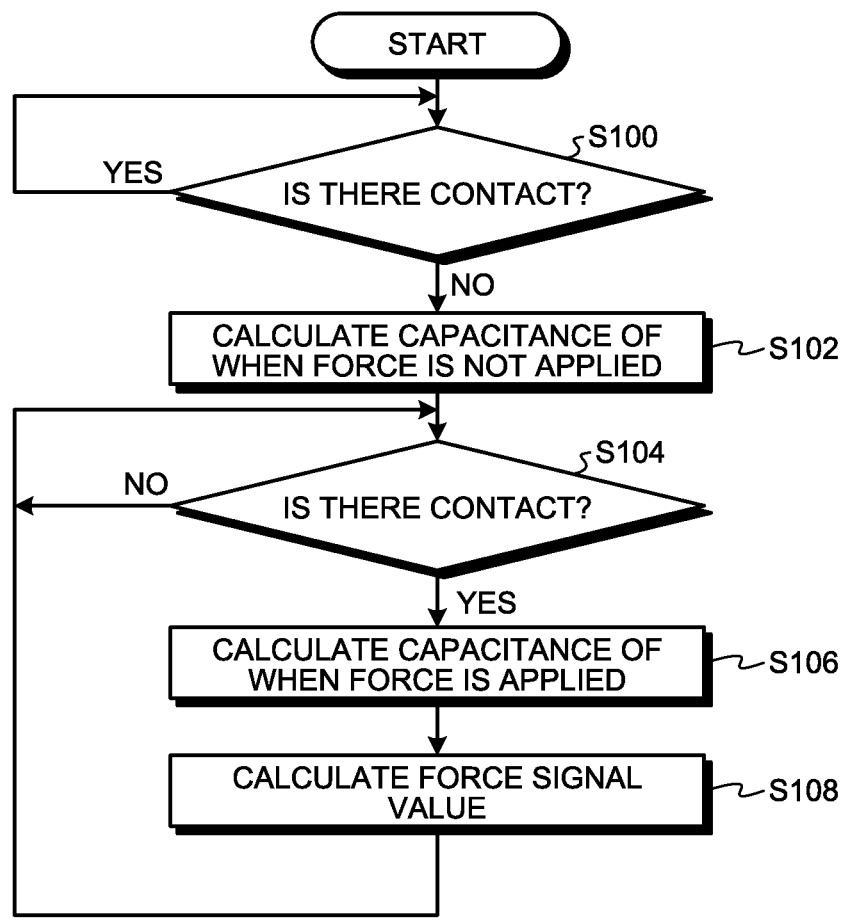
FIG. 31 is a flowchart illustrating processing executed by the force detection controller of the display apparatus with a touch detection function according to the embodiment.

FIG. 31 is a flowchart illustrating processing executed by the force detection controller of the display apparatus with a touch detection function according to the embodiment.

In Step S100, the contact determiner 52 determines whether the object to be detected OBJ is in contact with or in proximity to the input surface IS. When the contact determiner 52 determines that the object to be detected OBJ is in contact with or in proximity to the input surface IS (Yes in Step S100), the processing stays at Step S100. When the contact determiner 52 determines that the object to be detected OBJ is neither in contact with nor in proximity to the input surface IS, that is, the force is not applied to the input surface IS (No in Step S100), the processing proceeds to Step S102.

In Step S102, the reference capacitance calculator 53 calculates capacitance caused when the force is not applied. To be specific, when the potential controller 51 causes the potential of the intermediate electrode ELC to be the reference potential, the reference capacitance calculator 53 calculates the capacitance $C_{GND\_base}$ caused in the drive electrode COML.

When the potential controller 51 causes the potential of the intermediate electrode ELC to be high impedance, the reference capacitance calculator 53 calculates the capacitance $C_{float\_base}$ caused in the drive electrode COML.

When the potential controller 51 outputs the signal having the same phase and the same amplitude as the drive signal Vcomts2 to the intermediate electrode ELC, the reference capacitance calculator 53 calculates the capacitance $C_{Guard\_base}$ caused in the drive electrode COML.

Then, the reference capacitance calculator 53 calculates the reference first capacitance $C_1$ using the expression (4). The reference capacitance calculator 53 calculates the reference second capacitance $C_2$ using the expression (6).

In Step S104, the contact determiner 52 determines whether the object to be detected OBJ is in contact with or in proximity to the input surface IS. When the contact determiner 52 determines that the object to be detected OBJ is neither in contact with nor in proximity to the input surface IS, that is, the force is not applied to the input surface IS (No in Step S104), the processing stays at in Step S104. When the contact determiner 52 determines that the object to be detected OBJ is in contact with or in proximity to the input surface IS (Yes in Step S104), the processing proceeds to Step S106.

In Step S106, the capacitance at force application calculator 54 calculates the capacitance caused when the force is applied. To be specific, when the potential controller 51 causes the potential of the intermediate electrode ELC to be the reference potential, the capacitance at force application calculator 54 calculates the capacitance $C_{GND\_finger}$ caused in the drive electrode COML.

When the potential controller 51 causes the potential of the intermediate electrode ELC to be high impedance, the capacitance at force application calculator 54 calculates the capacitance $C_{float\_finger}$ caused in the drive electrode COML.

When the potential controller 51 outputs the signal having the same phase and the same amplitude as the drive signal Vcomts2 to the intermediate electrode ELC, the capacitance at force application calculator 54 calculates the capacitance $C_{Guard\_finger}$ caused in the drive electrode COML.

Then, the capacitance at force application calculator 54 calculates the first capacitance at force application $C_1'$ using the expression (10). The capacitance at force application calculator 54 calculates the second capacitance at force application $C_2'$ using the expression (12).

In Step S108, the force signal value calculator 55 calculates the force signal value that indicates the force applied to the input surface IS. To be specific, the force signal value calculator 55 calculates the first influence amount $C_{force\_C1}$ using the expressions (14) and (19).

The force signal value calculator 55 calculates the second influence amount $C_{force\_C2}$ using the expression (15) or (20).

Then, the force signal value calculator 55 calculates the force signal value $C_{force}$ using the expression (13). The force signal value $C_{force}$ is output to, for example, the host HST. The force detection controller 50 advances the processing to Step S104.

In FIG. 31, first, existence or non-existence of contact is determined (Step S100). When it is determined that there is no contact, the capacitance when the force is not applied is calculated (Step S102). After that, existence or non-existence of contact is determined (Step S104). When it is determined that there is contact, the capacitance when the force is applied is calculated (Step S106). However, the order is not limited thereto. For example, the processing may be performed such that existence or non-existence of contact is determined, and when it is determined that there is contact, the capacitance when the force is applied is calculated. After that, the processing may be performed such that existence or non-existence of contact is determined, and when it is determined that there is no contact, the capacitance when the force is not applied is calculated.

Figure 32:
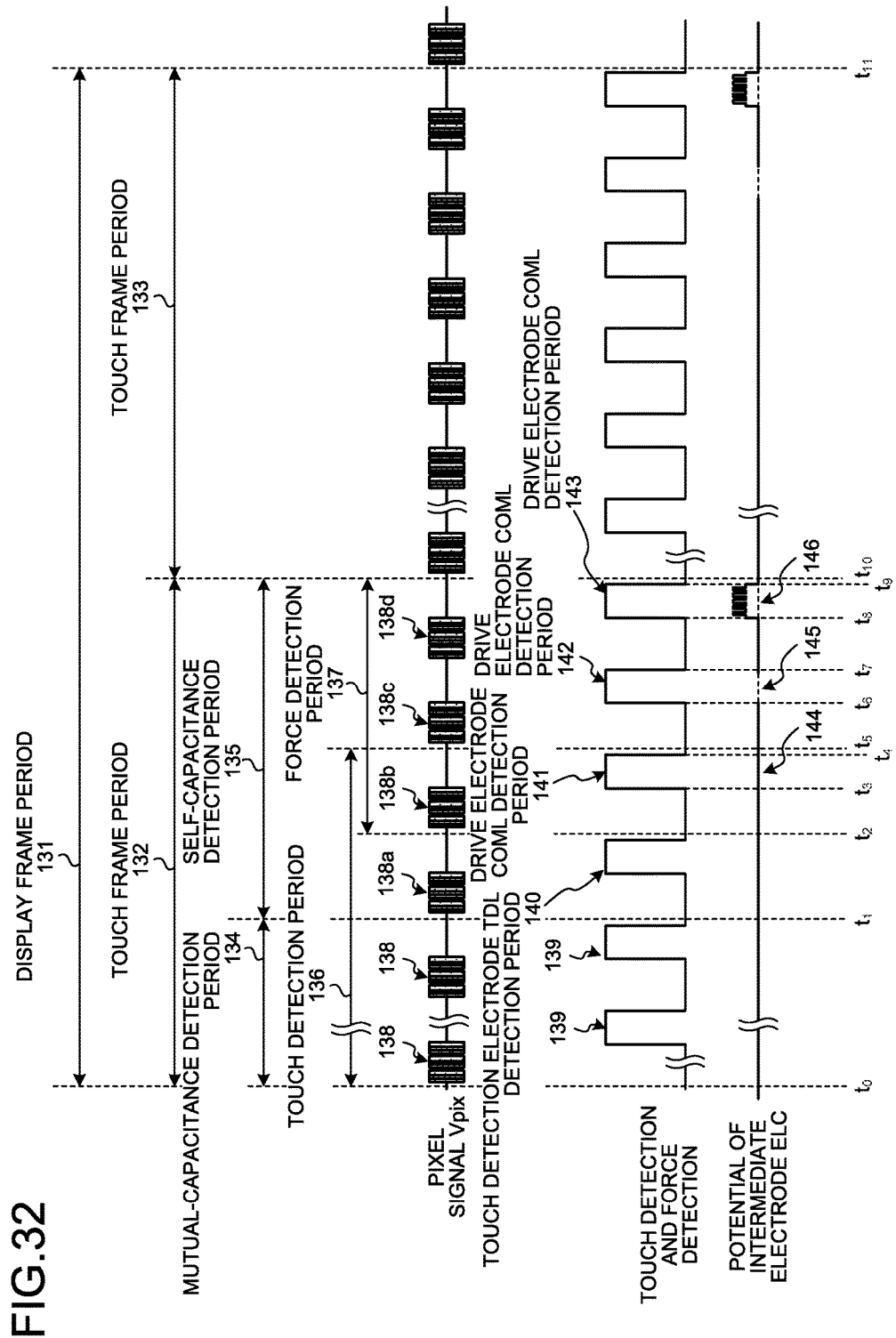
FIG. 32 is a timing chart illustrating an example of operation timing of the display apparatus with a touch detection function according to the embodiment.

FIG. 32 is a timing chart illustrating an example of operation timing of the display apparatus with a touch detection function according to the embodiment.

A display frame period 131 is a period in which one image (one frame) is displayed. The display frame period 131 starts at timing $t_0$ and ends at timing $t_{11}$. The display frame period 131 includes two touch frame periods 132 and 133 in which touch detection and force detection are performed. The display frame period 131 may include one touch frame period only, or may include three or more touch frame periods.

The touch frame period 132 starts at the timing $t_0$ and ends at timing $t_{10}$. The touch frame period 133 starts at the timing $t_{10}$ and ends at timing $t_{11}$. The operation timing in the touch frame period 133 is the same as the operation timing in the touch frame period 132, and thus description will be given about the touch frame period 132 only.

The touch frame period 132 includes a mutual-capacitance detection period 134 and a self-capacitance detection period 135. The mutual-capacitance detection period 134 is a period in which the mutual-capacitance between the drive electrode COML and the touch detection electrode TDL is detected on the basis of the basic principle of the mutual-capacitive touch detection. The self-capacitance detection period 135 is a period in which the self-capacitance of the drive electrode COML and the touch detection electrode TDL is detected on the basis of the basic principle of the self-capacitive touch detection. The mutual-capacitance detection period 134 starts at the timing $t_0$ and ends at timing $t_1$. The self-capacitance detection period 135 starts at the timing $t_1$ and ends at the timing $t_{10}$.

The touch frame period 132 includes a touch detection period 136 and a force detection period 137. The touch detection period 136 is a period in which the object to be detected OBJ in contact with or in proximity to the input surface IS is detected. The force detection period 137 is a period in which the force applied by the object to be detected OBJ to the input surface IS is detected. A part of the touch detection period 136 and a part of the force detection period 137 overlap with each other.

The touch detection period 136 starts at the timing $t_0$, and ends at timing $t_5$ beyond the timing $t_1$. The timing $t_0$ is the same as the start timing of the mutual-capacitance detection period 134, and the timing $t_1$ is the start timing of the self-capacitance detection period 135. That is, the touch detection period 136 extends over the mutual-capacitance detection period 134 and the self-capacitance detection period 135.

The force detection period 137 starts at timing $t_2$ during the self-capacitance detection period 135 and during the touch detection period 136. The force detection period 137 ends at the timing $t_{10}$ beyond the timing $t_5$. The timing $t_{10}$ is the same as the end timing of the self-capacitance detection period 135, and the timing $t_5$ is the end timing of the touch detection period 136.

In the mutual-capacitance detection period 134, a display period 138 and a capacitance detection period 139 are alternately performed. The display period 138 is a period in which the pixel signal Vpix is applied to the display device DP such that the display device DP displays an image. The capacitance detection period 139 is a period in which the mutual-capacitance between the drive electrode COML and the touch detection electrode TDL is detected. The mutual-capacitance between the drive electrode COML and the touch detection electrode TDL detected in the capacitance detection period 139 is used for the touch detection in the touch detection controller 40.

After the self-capacitance detection period 135 starts at the timing $t_1$, the self-capacitance of the touch detection electrode TDL is detected in a touch detection electrode TDL detection period 140 after a next display period 138a ends. The self-capacitance of the touch detection electrode TDL detected in the touch detection electrode TDL detection period 140 is used for the touch detection in the touch detection controller 40.

After the force detection period 137 starts at the timing $t_2$, the self-capacitance of the drive electrode COML is detected in a drive electrode COML detection period 141 after a next display period 138b ends. The drive electrode COML detection period 141 starts at timing $t_3$ and ends at timing $t_4$. The self-capacitance of the drive electrode COML detected in the drive electrode COML detection period 141 is used for the touch detection in the touch detection controller 40 and the touch detection in the force detection controller 50.

The touch detection controller 40 performs the touch detection on the basis of the mutual-capacitance between the drive electrode COML and the touch detection electrode TDL detected in a plurality of the capacitance detection periods 139, the self-capacitance of the touch detection electrode TDL detected in the touch detection electrode TDL detection period 140, and the self-capacitance of the drive electrode COML detected in the drive electrode COML detection period 141. The touch detection controller 40 can favorably reduce an influence of moisture beads and the like and can favorably detect a stylus pen or the like, by considering the self-capacitance of the touch detection electrode TDL and the self-capacitance of the drive electrode COML, in addition to the mutual-capacitance between the drive electrode COML and the touch detection electrode TDL.

The potential controller 51 causes the potential of the intermediate electrode ELC to be the reference potential in a reference potential period 144 in time with the drive electrode COML detection period 141. The reference potential period 144 starts at the timing $t_3$ and ends at the timing $t_4$. The timing $t_3$ is the same as the start timing of the drive electrode COML detection period 141, and the timing $t_4$ is the same as the end timing of the drive electrode COML detection period 141.

The drive electrode COML detection period 141 (reference potential period 144) is an example of "first period" in the present invention.

When the object to be detected OBJ is neither in contact with nor in proximity to the input surface IS in the drive electrode COML detection period 141 (reference potential period 144), the reference capacitance calculator 53 calculates the capacitance $C_{GND\_base}$ caused in the drive electrode COML. When the object to be detected OBJ is in contact with or in proximity to the input surface IS in the drive electrode COML detection period 141 (reference potential period 144), the capacitance at force application calculator 54 calculates the capacitance $C_{GND\_finger}$ caused in the drive electrode COML.

After the drive electrode COML detection period 141 ends, the self-capacitance of the drive electrode COML is detected in a drive electrode COML detection period 142 after a next display period 138*c* ends. The drive electrode COML detection period 142 starts at timing $t_6$ and ends at timing $t_7$.

The potential controller 51 causes the potential of the intermediate electrode ELC to be high impedance in a high impedance period 145 in time with a drive electrode COML detection period 142. The high impedance period 145 starts at the timing $t_6$ and ends at the timing $t_7$. The timing $t_6$ is the same as the start timing of the drive electrode COML detection period 142, and the timing $t_7$ is the same as the end timing of the drive electrode COML detection period 142.

The drive electrode COML detection period 142 (high impedance period 145) is an example of "second period" in the present invention.

When the object to be detected OBJ is neither in contact with nor in proximity to the input surface IS in the drive electrode COML detection period 142 (high impedance period 145), the reference capacitance calculator 53 calculates the capacitance $C_{float\_base}$ caused in the drive electrode COML. When the object to be detected OBJ is in contact with or in proximity to the input surface IS in the drive electrode COML detection period 142 (high impedance period 145), the capacitance at force application calculator 54 calculates the capacitance $C_{float\_finger}$ caused in the drive electrode COML.

After the drive electrode COML detection period 142 ends, the self-capacitance of the drive electrode COML is detected in a drive electrode COML detection period 143 after the next display period 138*d* ends. The drive electrode COML detection period 143 starts at timing $t_8$ and ends at timing $t_9$.

The potential controller 51 outputs the signal having the same phase and the same amplitude as the drive signal Vcomts2 to the intermediate electrode ELC in a drive signal period 146 in time with the drive electrode COML detection period 143. The drive signal period 146 starts at the timing $t_8$ and ends at the timing $t_9$. The timing $t_8$ is the same as the start timing of the drive electrode COML detection period 143, and the timing $t_9$ is the same as the end timing of the drive electrode COML detection period 143.

The drive electrode COML detection period 143 (drive signal period 146) is an example of "third period" in the present invention.

When the object to be detected OBJ is neither in contact with nor in proximity to the input surface IS in the drive electrode COML detection period 143 (drive signal period 146), the reference capacitance calculator 53 calculates the capacitance $C_{Guard\_base}$ caused in the drive electrode COML. When the object to be detected OBJ is in contact with or in proximity to the input surface IS in the drive electrode COML detection period 143 (drive signal period 146), the capacitance at force application calculator 54 calculates the capacitance $C_{Guard\_finger}$ caused in the drive electrode COML.

The force detection controller 50 calculates the force signal value $C_{force}$ using the expressions (4), (6), (10), (12), and (13) on the basis of the self-capacitance of the drive electrode COML detected in the drive electrode COML detection period 141 (reference potential period 144), the drive electrode COML detection period 142 (high impedance period 145), and the drive electrode COML detection period 143 (drive signal period 146).

Figure 33:
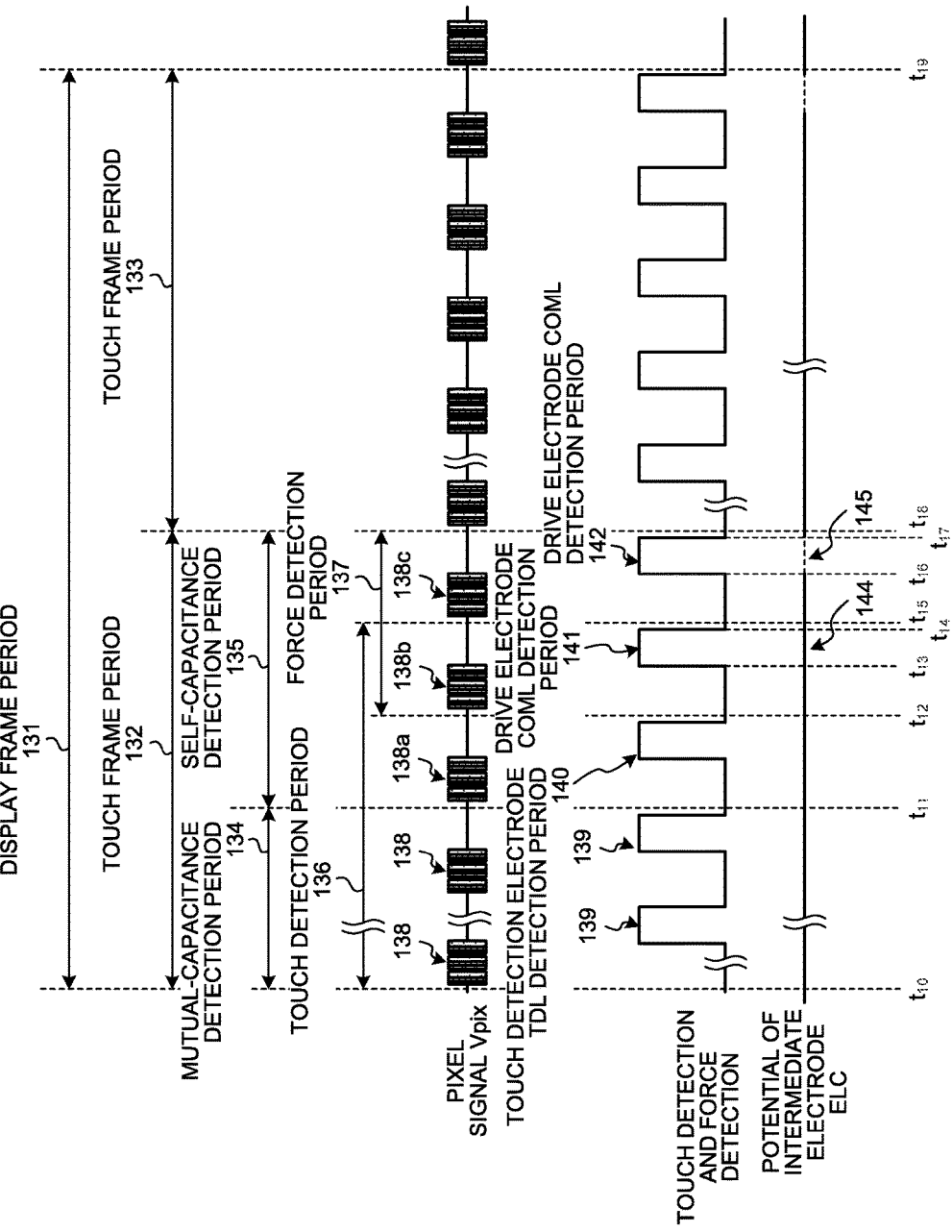
FIG. 33 is a timing chart illustrating another example of operation timing of the display apparatus with a touch detection function according to the embodiment.

FIG. 33 is a timing chart illustrating another example of operation timing of the display apparatus with a touch detection function according to the embodiment.

The display frame period 131 is a period in which one image (one frame) is displayed. The display frame period 131 starts at the timing $t_{10}$ and ends at timing $t_{19}$. The display frame period 131 includes the two touch frame periods 132 and 133 in which the touch detection and the force detection are performed. The display frame period 131 may include one touch frame period only, or may include three or more touch frame periods.

The touch frame period 132 starts at the timing $t_{10}$ and ends at timing $t_{18}$. The touch frame period 133 starts at the timing $t_{18}$ and ends at the timing $t_{19}$. The operation timing of the touch frame period 133 is the same as the operation timing of the touch frame period 132, and thus description will be given about the touch frame period 132 only.

The timing $t_{10}$ to timing $t_{17}$ of the timing chart illustrated in FIG. 33 are the same as the timing $t_0$ to timing $t_7$ of the timing chart illustrated in FIG. 32, and thus description is omitted.

The force detection period 137 ends at the timing $t_{18}$ after the drive electrode COML detection period 142 in the timing chart illustrated in FIG. 33. That is, the display period 138*d* and the drive electrode COML detection period 143 included in the timing chart illustrated in FIG. 32 are not included in the timing chart illustrated in FIG. 33. Therefore, the force detection period 137 is shortened by the display period 138*d* and the drive electrode COML detection period 143.

Similarly, the self-capacitance detection period 135 is also shortened by the display period 138*d* and the drive electrode COML detection period 143. Similarly, the touch frame period 132 is shortened by the display period 138*d* and the drive electrode COML detection period 143. Therefore, the display frame period 131 is shortened by twice the display period 138*d* and the drive electrode COML detection period 143.

With this configuration, the force detection controller 50 can shorten the display frame period 131, can shorten the touch frame period 132, can shorten the self-capacitance detection period 135, and can shorten the force detection period 137.

The potential controller 51 causes the potential of the intermediate electrode ELC to be the reference potential in the reference potential period 144 in time with the drive electrode COML detection period 141. The reference potential period 144 starts at timing $t_{13}$ and ends at timing $t_{14}$. The timing $t_{13}$ is the same as the start timing of the drive electrode COML detection period 141, and the timing $t_{14}$ is the same as the end timing of the drive electrode COML detection period 141.

The drive electrode COML detection period 141 (reference potential period 144) is an example of the "first period" in the present invention.

When the object to be detected OBJ is neither in contact with nor in proximity to the input surface IS in the drive electrode COML detection period 141 (reference potential period 144), the reference capacitance calculator 53 calculates the capacitance $C_{GND\_base}$ caused in the drive electrode COML. When the object to be detected OBJ is in contact with or in proximity to the input surface IS in the drive electrode COML detection period 141 (reference potential period 144), the capacitance at force application calculator 54 calculates the capacitance $C_{GND\_finger}$ caused in the drive electrode COML.

The potential controller 51 causes the potential of the intermediate electrode ELC to be high impedance in a high impedance period 145 in time with a drive electrode COML detection period 142. The high impedance period 145 starts at the timing $t_{16}$ and ends at the timing $t_{17}$. The timing $t_{16}$ is the same as the start timing of the drive electrode COML detection period 142, and the timing $t_{17}$ is the same as the end timing of the drive electrode COML detection period 142.

The drive electrode COML detection period 142 (high impedance period 145) is an example of the "second period" of the present invention.

When the object to be detected OBJ is neither in contact with nor in proximity to the input surface IS in the drive electrode COML detection period 142 (high impedance period 145), the reference capacitance calculator 53 calculates the capacitance $C_{float\_base}$ caused in the drive electrode COML. When the object to be detected OBJ is in contact with or in proximity to the input surface IS in the drive electrode COML detection period 142 (high impedance period 145), the capacitance at force application calculator 54 calculates the capacitance $C_{float\_finger}$ caused in the drive electrode COML.

By the way, the potential controller 51 outputs the signal having the same phase and the same amplitude as the drive signal Vcomts2 to the intermediate electrode ELC, in place of causing the potential of the intermediate electrode ELC to be the reference potential or high impedance, in one of or in both the drive electrode COML detection period 141 (reference potential period 144) and the drive electrode COML detection period 142 (high impedance period 145) at every predetermined periodic timing.

When the potential controller 51 outputs the signal having the same phase and the same amplitude as the drive signal Vcomts2 to the intermediate electrode ELC, and the object to be detected OBJ is neither in contact with nor in proximity to the input surface IS, in the drive electrode COML detection period 141 (reference potential period 144), the reference capacitance calculator 53 calculates the capacitance $C_{Guard\_base}$ caused in the drive electrode COML. When the potential controller 51 outputs the signal having the same phase and the same amplitude as the drive signal Vcomts2 to the intermediate electrode ELC, and the object to be detected OBJ is in contact with or in proximity to the input surface IS, in the reference potential period 144, the capacitance at force application calculator 54 calculates the capacitance $C_{Guard\_finger}$ caused in the drive electrode COML.

When the potential controller 51 outputs the signal having the same phase and the same amplitude as the drive signal Vcomts2 to the intermediate electrode ELC, and the object to be detected OBJ is neither in contact with nor in proximity to the input surface IS, in the drive electrode COML detection period 142 (high impedance period 145), the reference capacitance calculator 53 calculates the capacitance $C_{Guard\_base}$ caused in the drive electrode COML. When the potential controller 51 outputs the signal having the same phase and the same amplitude as the drive signal Vcomts2 to the intermediate electrode ELC, and the object to be detected OBJ is in contact with or in proximity to the input surface IS, in the drive electrode COML detection period 142 (high impedance period 145), the capacitance at force application calculator 54 calculates the capacitance $C_{Guard\_finger}$ caused in the drive electrode COML.

That is, at every predetermined periodic timing, the force detection controller 50 calculates the capacitance $C_{Guard\_base}$ or the capacitance $C_{Guard\_finger}$ in the drive electrode COML detection period 141 (reference potential period 144) or the drive electrode COML detection period 142 (high impedance period 145). At timings other than the predetermined periodic timing, the force detection controller 50 calculates the capacitance $C_{GND\_base}$, the capacitance $C_{GND\_finger}$, the capacitance $C_{float\_base}$, or the capacitance $C_{float\_finger}$ in the drive electrode COML detection period 141 (reference potential period 144) or the drive electrode COML detection period 142 (high impedance period 145).

The force detection controller 50 calculates the force signal value $C_{force}$ using the expressions (4), (6), (10), (12), and (13), on the basis of the self-capacitance of the drive electrode COML detected in the drive electrode COML detection period 141 (reference potential period 144) and the drive electrode COML detection period 142 (high impedance period 145).

The display apparatus 1 with a touch detection function can make the relationship between the force and the force signal value $C_{force}$ linear in the entire range. For example, the host HST can receive the force signal value $C_{force}$ having the relationship with the force being linear in the entire range. Therefore, the display apparatus 1 with a touch detection function can favorably detect the force. That is, the display apparatus 1 with a touch detection function can improve the detection accuracy of the force.

5. Modification 5-1. First Modification

Figure 34:
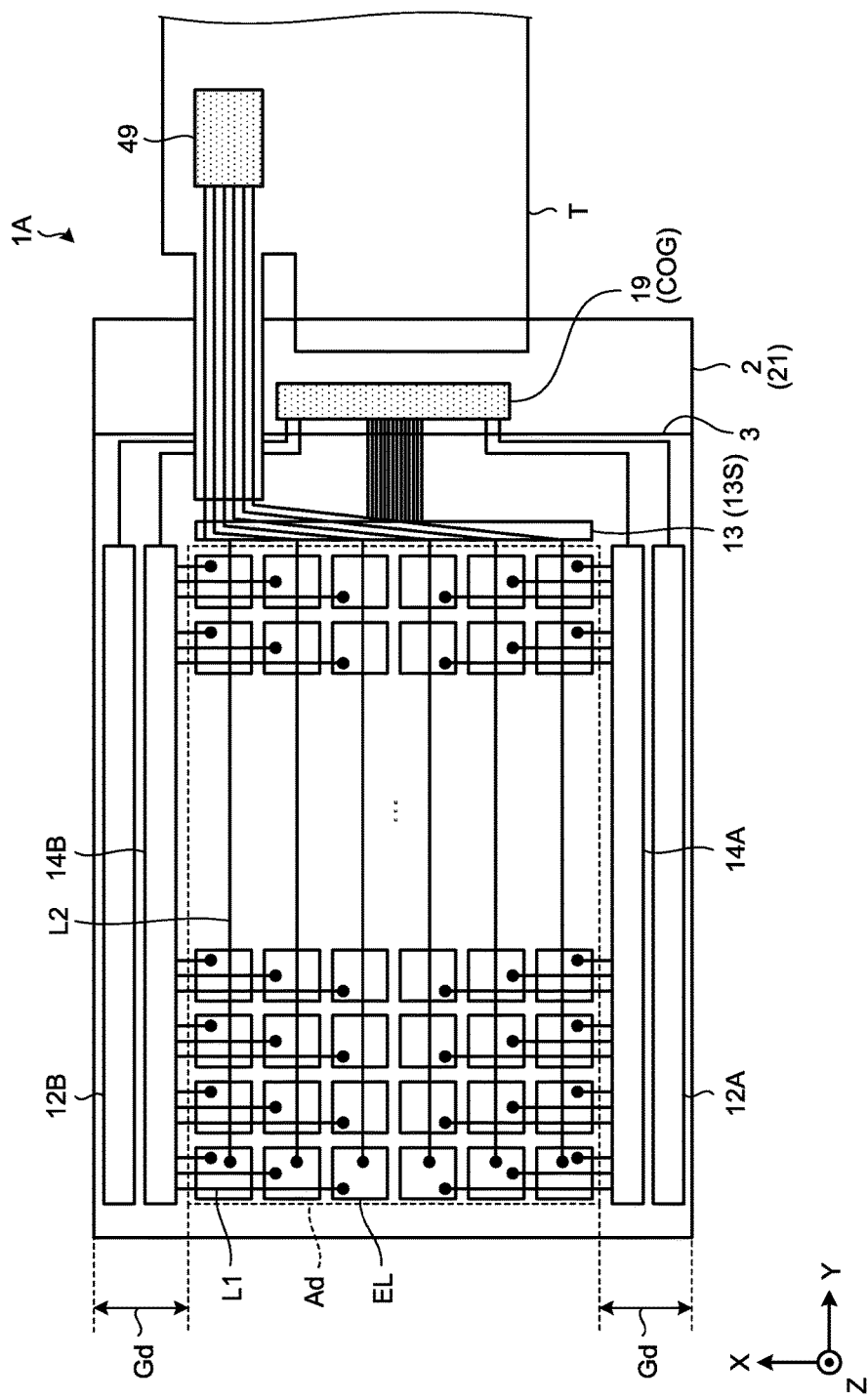
FIG. 34 is a diagram illustrating an example of a module in which a display apparatus with a touch detection function is mounted according to a first modification.

FIG. 34 is a diagram illustrating an example of a module in which a display apparatus with a touch detection function is mounted according to a first modification. In the first modification, the same elements as those in the embodiment are denoted with the same reference signs, and descriptions thereof are appropriately omitted.

A display apparatus 1A with a touch detection function according to the first modification performs touch detection on the basis of a self-capacitive basic principle. In a case of the self-capacitive touch detection, a plurality of electrodes EL provided in a matrix (row-column configuration) may be used as electrodes that function as both the touch detection electrodes TDL and the drive electrodes COML. In this case, the plurality of electrodes EL are coupled with the drive electrode scanners 14A and 14B and the touch detection controller 40 through coupling portions such as wiring L1 and L2. FIG. 34 illustrates only the wiring L2 provided for a part of the electrodes EL. In reality, the wiring L2 or similar coupling portions are individually provided for all the electrodes EL.

In the first modification, the electrode EL is an example of "first electrode" of the present invention.

Although the shape and the size of the electrode EL are arbitrary, the size of the electrode EL may correspond to the size of a pixel, for example. In this case, one of electrodes making up the pixel (for example, a pixel electrode 22 or a drive electrode COML as a counter electrode in the pixel of a liquid crystal display apparatus) may be used as the electrode EL. That is, the electrode EL may be used as an electrode provided in each of a plurality of pixels of a display apparatus.

Figure 35:
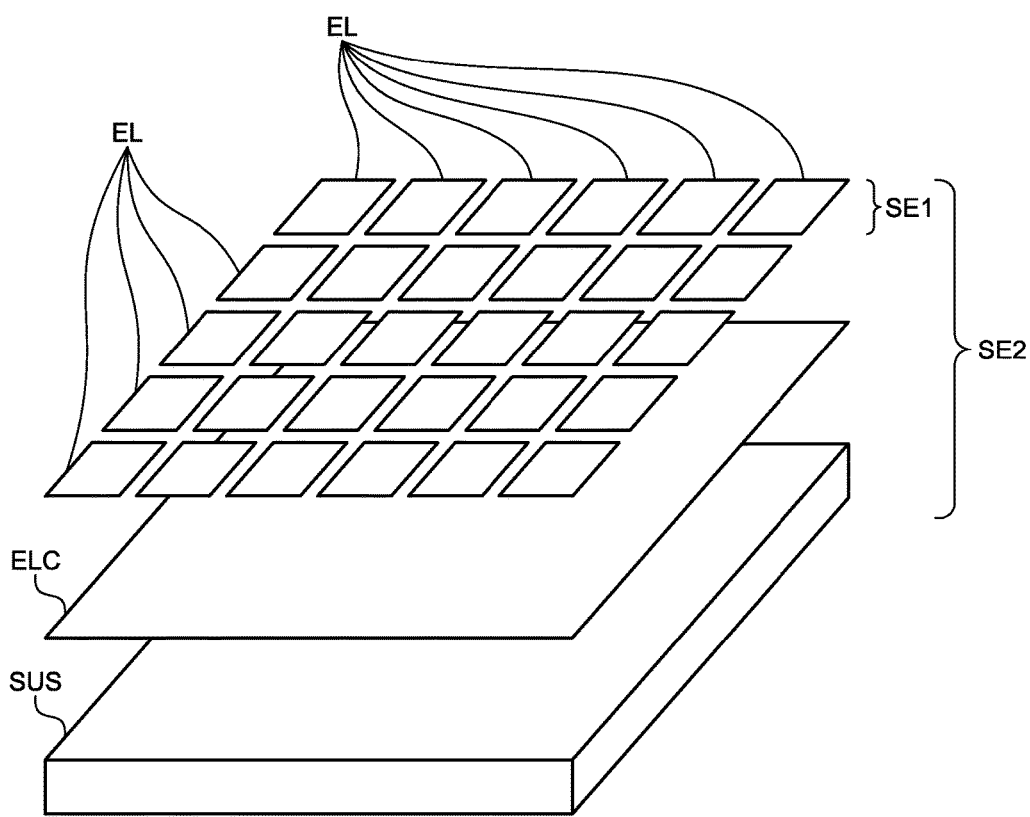
FIG. 35 is a perspective view illustrating electrodes and intermediate electrodes of the display apparatus with a touch detection function according to the first modification.

FIG. 35 is a perspective view illustrating electrodes and intermediate electrodes of the display apparatus with a touch detection function according to the first modification. A plurality of electrodes EL make up the touch detector SE1 of FIG. 1. The plurality of electrodes EL, an intermediate electrode ELC, and an electrode SUS are included in the configuration of the force detector SE2 of FIG. 1.

The intermediate electrode ELC may overlap with the plurality of electrodes EL in plan view. That is, the size of the intermediate electrode ELC may be the same as or larger than a touch detection region consisting of the plurality of electrodes EL.

The electrode SUS may overlap with the intermediate electrode ELC in plan view. That is, the size of the electrode SUS may be the same as or larger than the size of the intermediate electrode ELC.

5-2. Second Modification

Figure 36:
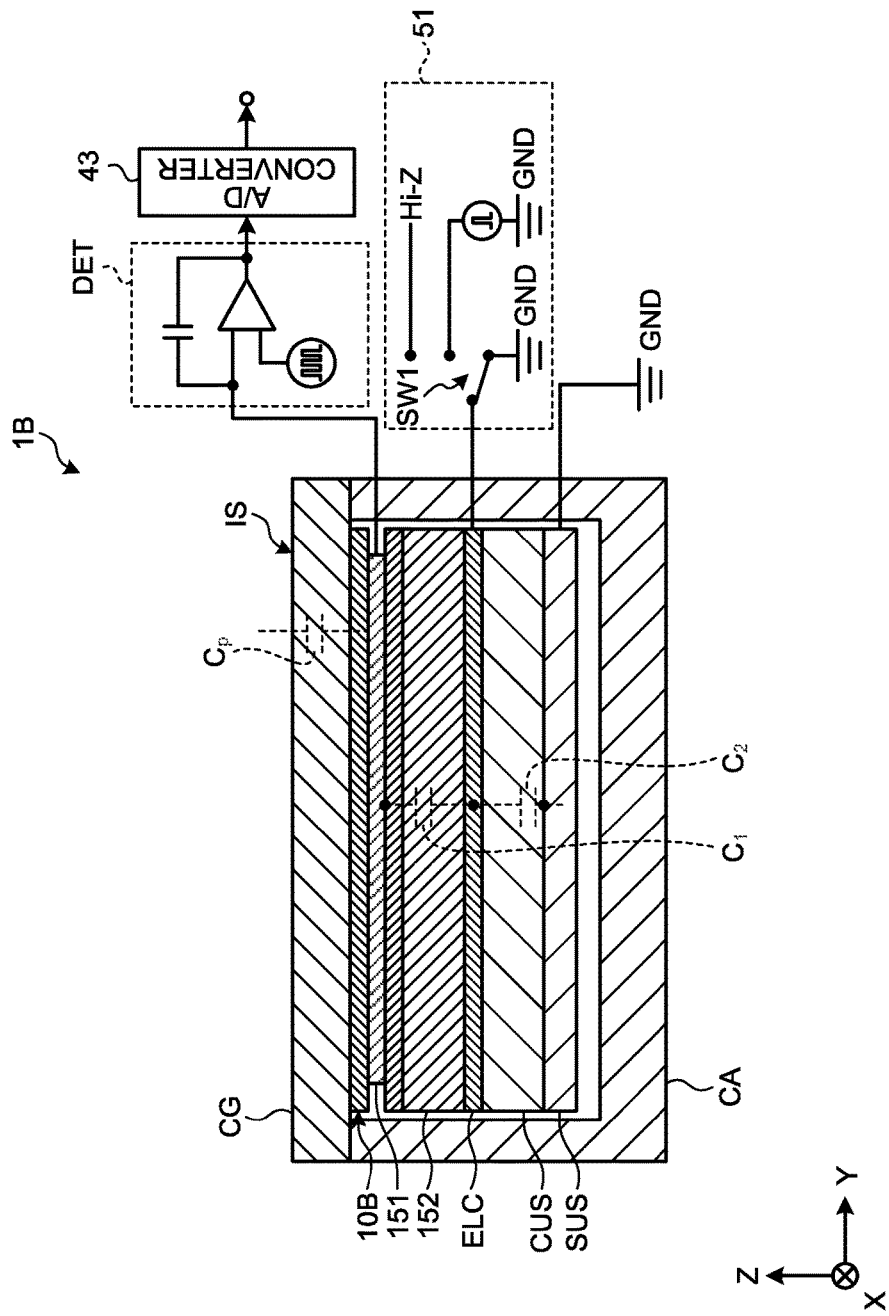
FIG. 36 is a diagram illustrating a configuration of a display apparatus with a touch detection function according to a second modification.

FIG. 36 is a diagram illustrating a configuration of a display apparatus with a touch detection function according to a second modification. In the second modification, the same elements as those in the embodiment are denoted with the same reference signs, and descriptions thereof are appropriately omitted.

In a display apparatus 1B with a touch detection function according to the second modification, a display device 10B with a touch detection function includes an organic electro-luminescence display apparatus as display device. The organic electro-luminescence display apparatus does not require a backlight apparatus. Therefore, the display apparatus 1B with a touch detection function does not include a backlight apparatus BL.

As the lighting apparatus, the display apparatus 1B with a touch detection function may include a frontlight apparatus that irradiates a front surface of the display device 10B with a touch detection function with light.

In the display apparatus 1B with a touch detection function, an anode or a cathode 151 of the organic electro-luminescence display apparatus can be used in place of a drive electrode COML.

In the second modification, the anode or the cathode 151 of the display device 10B with a touch detection function is an example of "first electrode" of the present invention.

The display apparatus 1B with a touch detection function includes a cushion layer 152, in place of an air layer AG, between the display device 10B with a touch detection function and an intermediate electrode ELC.

In the second modification, the cushion layer 152 is an example of "first layer" of the present invention.

5-3. Third Modification

Figure 37:
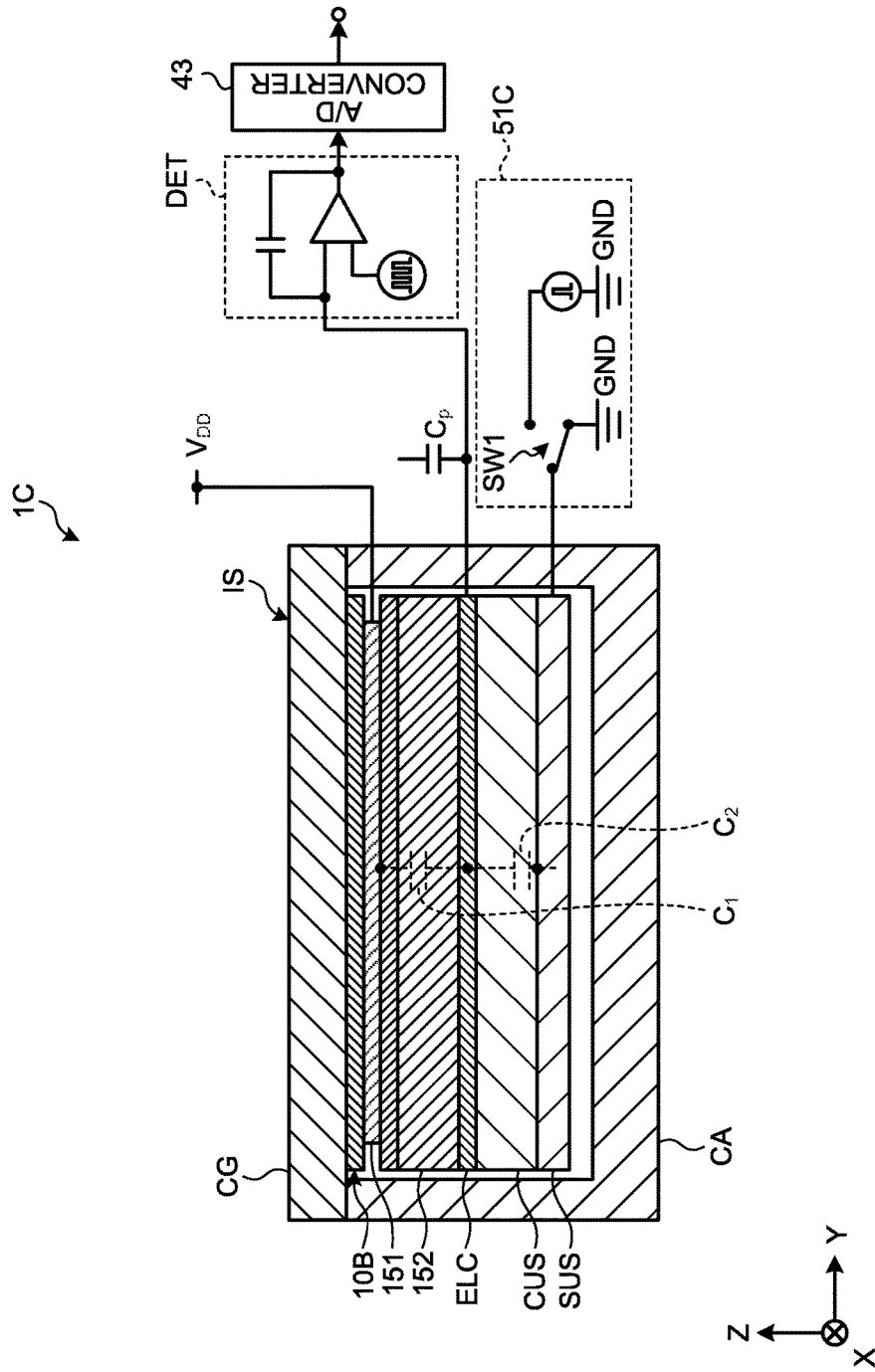
FIG. 37 is a diagram illustrating a configuration of a display apparatus with a touch detection function according to a third modification.

FIG. 37 is a diagram illustrating a configuration of a display apparatus with a touch detection function according to a third modification. In the third modification, the same elements as those in the embodiment are denoted with the same reference signs, and descriptions thereof are appropriately omitted.

In a display apparatus 1C with a touch detection function according to the third modification, a potential of an anode or a cathode 151 of a display device 10B with a touch detection function is set to a positive second reference potential (for example, a power source potential $V_{DD}$).

A voltage detector DET is coupled with an intermediate electrode ELC and detects a voltage of the intermediate electrode ELC. That is, in the display apparatus 1C with a touch detection function, the intermediate electrode ELC corresponds to a detection electrode, and a drive signal Vcomts2 is supplied to the intermediate electrode ELC.

A potential controller 51C includes a switch SW1 having two modes including a first mode for causing a potential of the electrode SUS to be a reference potential, and a second mode for outputting a signal having the same phase and the same amplitude as the drive signal Vcomts2 to the intermediate electrode ELC.

5-3-1. Principle of Force Detection

The electrode SUS is coupled with the potential controller 51C. The potential controller 51C includes the switch SW1 having two modes including a first mode for causing the potential of the electrode SUS to be the reference potential, and a second mode for outputting the signal having the same phase and the same amplitude as the drive signal Vcomts2 to the intermediate electrode ELC.

Parasitic capacitance $C_p$ due to a member included in the display apparatus 1C with a touch detection function exists in the intermediate electrode ELC. While an object to be detected OBJ does not apply force to an input surface IS, reference first capacitance $C_1$ exists between the anode or the cathode 151 and the intermediate electrode ELC, and reference second capacitance $C_2$ exists between the intermediate electrode ELC and the electrode SUS.

When the object to be detected OBJ does not apply the force to the input surface IS, and the potential controller 51C causes the potential of the electrode SUS to be the reference potential, capacitance $C_{GND\_base}$ caused in a drive electrode COML, which is detected by the voltage detector DET, is expressed by the following expression (24):

$$C_{GND\_base}=C_p+C_1+C_2 \tag{24}$$

The capacitance $C_{GND\_base}$ is an example of "third capacitance" of the present invention.

When the potential controller 51C outputs the signal having the same phase and the same amplitude as the drive signal Vcomts2 to the electrode SUS, both ends of the reference second capacitance $C_2$ have the same phase and the same potential, and the reference second capacitance $C_2$ can be considered to be zero. Therefore, capacitance $C_{Guard\_base}$ caused in the drive electrode COML, which is detected by the voltage detector DET, is expressed by the following expression (25):

$$C_{Guard\_base}=C_p+C_1 \tag{25}$$

The capacitance $C_{Guard\_base}$ is an example of "fourth capacitance" of the present invention.

When the object to be detected OBJ applies the force to the input surface IS, first capacitance at force application $C_1'$ exists between the drive electrode COML and the intermediate electrode ELC. Second capacitance at force application $C_2'$ exists between the intermediate electrode ELC and the electrode SUS.

When the object to be detected OBJ applies the force to the input surface IS, and the potential controller 51C causes the potential of the electrode SUS to be the reference potential, capacitance $C_{GND\_finger}$ caused in the drive electrode COML, which is detected by the voltage detector DET, is expressed by the following expression (26):

$$C_{GND\_finger}=C_p+C_1'+C_2' \tag{26}$$

The capacitance $C_{GND\_finger}$ is an example of "fifth capacitance" of the present invention.

When the object to be detected OBJ applies the force to the input surface IS, and the potential controller 51C outputs the signal having the same phase and the same amplitude as the drive signal Vcomts2 to the electrode SUS, both ends of the reference second capacitance $C_2$ have the same phase and the same potential, and the reference second capacitance $C_2$ can be considered to be zero. Therefore, the capacitance $C_{Guard\_finger}$ caused in the drive electrode COML, which is detected by the voltage detector DET, is expressed by the following expression (27):

$$C_{Guard\_finger}=C_p+C_1' \qquad (27)$$

The capacitance $C_{Guard\_finger}$ is an example of "sixth capacitance" of the present invention.

The reference second capacitance $C_2$ can be calculated by the following expression (28) with the expressions (24) and (25):

$$C_2=C_{GND\_base}-C_{Guard\_base} \qquad (28)$$

The second capacitance at force application $C_2'$ can be calculated by the following expression (29) with the expressions (26) and (27):

$$C_2'=C_{GND\_finger}-C_{Guard\_finger} \qquad (29)$$

A force detection controller 50C described below can calculate a first influence amount $C_{force\_C1}$ on the basis of the expressions (25) and (27). The first influence amount $C_{force\_C1}$ is the amount of influence added to the capacitance between the anode or the cathode 151 and the intermediate electrode ELC when the object to be detected OBJ applies the force to the input surface IS. The force detection controller 50C can calculate a second influence amount $C_{force\_C2}$ on the basis of the expressions (28) and (29). The second influence amount $C_{force\_C2}$ is the amount of influence added to the capacitance between the intermediate electrode ELC and the electrode SUS when the object to be detected OBJ applies the force to the input surface IS.

As a method of calculating the first influence amount $C_{force\_C1}$, calculation of an increase amount $\Delta C_1$ of the capacitance between the anode or the cathode 151 and the intermediate electrode ELC can be considered. That is, the first influence amount $C_{force\_C1}$ can be calculated by the following expression (30):

$$C_{force\_C1}=\Delta C_1'=-C_1 \qquad (30)$$

To be specific, the force detection controller 50C can calculate the first influence amount $C_{force\_C1}$ by the following expression (31) obtained by subtracting the right side of the expression (25) from the right side of the expression (27):

$$C_{force\_C1}=\Delta C_1=-C_1'-C_1=C_{Guard\_finger}-C_{Guard\_base} \qquad (31)$$

Similarly, as a method of calculating the second influence amount $C_{force\_C2}$, calculation of an increase amount $\Delta C_2$ of the capacitance between the intermediate electrode ELC and the electrode SUS can be considered. That is, the second influence amount $C_{force\_C2}$ can be calculated by the following expression (32):

$$C_{force\_C2}=\Delta C_2=C_2'-C_2 \qquad (32)$$

To be specific, the force detection controller 50C can calculate the second influence amount $C_{force\_C2}$ by the following expression (33) obtained by subtracting the right side of the expression (28) from the right side of the expression (29):

$$C_{force\_C2}=\Delta C_2=C_2'-C_2=C_{GND\_finger}-C_{Guard\_finger}-C_{GND\_base}+C_{Guard\_base} \qquad (33)$$

Therefore, the force detection controller 50C can calculate an influence amount, that is, a force signal value $C_{force}$ by a multiply-accumulate operation of the first influence amount $C_{force\_C1}$ and the second influence amount $C_{force\_C2}$. The influence amount (force signal value $C_{force}$) is the amount of influence added to the capacitance between the anode or the cathode 151 and the electrode SUS when the object to be detected OBJ applies the force to the input surface IS. The multiply-accumulate operation can be expressed by the following expression (34):

$$C_{force}=\alpha \cdot C_{force\_C1}+\beta \cdot C_{force\_C2} \qquad (34)$$

Therefore, the force detection controller 50C can favorably detect the force, similarly to the force detection controller 50 of the embodiment. That is, the force detection controller 50C can improve detection accuracy of the force.

Figure 38:
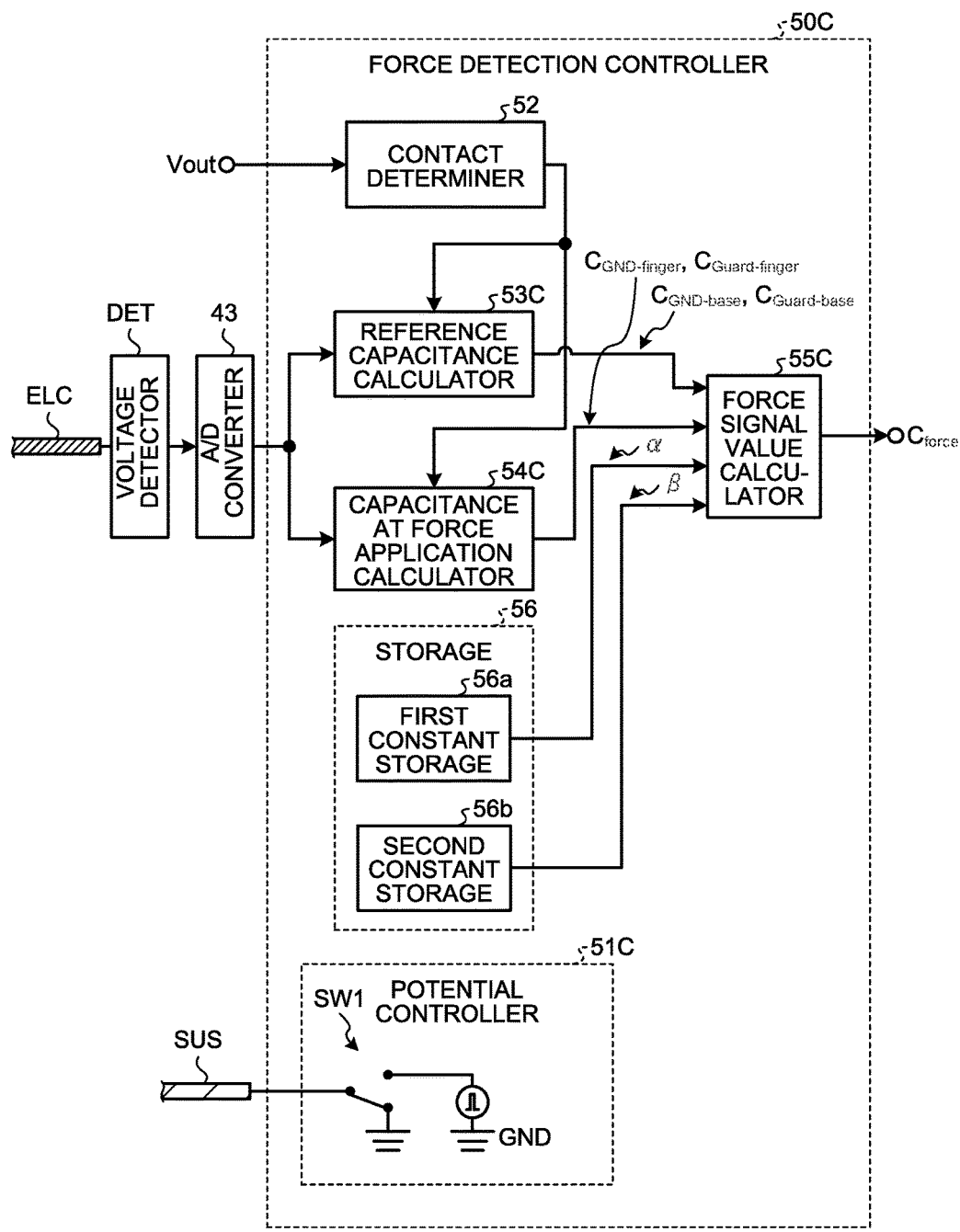
FIG. 38 is a diagram illustrating function blocks of a force detection controller of the display apparatus with a touch detection function according to the third modification.

FIG. 38 is a diagram illustrating function blocks of a force detection controller of the display apparatus with a touch detection function according to the third modification. The force detection controller 50C according to the third modification includes a potential controller 51C, a contact determiner 52, a reference capacitance calculator 53C, a capacitance at force application calculator 54C, a force signal value calculator 55C, and a storage 56.

The contact determiner 52, the reference capacitance calculator 53C, the capacitance at force application calculator 54C, and the force signal value calculator 55C can be realized by execution of programs by an COG 19, a touch IC 49, or a host HST. Alternatively, the contact determiner 52, the reference capacitance calculator 53C, the capacitance at force application calculator 54C, and the force signal value calculator 55C can be realized by execution of the programs by two or more of the COG 19, the touch IC 49, and the host HST in association with one another.

The reference capacitance calculator 53C calculates the capacitance $C_{GND\_base}$ or the capacitance $C_{Guard\_base}$ on the basis of the capacitance caused in the intermediate electrode ELC when the potential of the electrode SUS is caused to be the reference potential, or when the signal having the same phase and the same amplitude as the drive signal Vcomts2 is applied to the electrode SUS. The reference capacitance calculator 53C outputs the calculated capacitance $C_{GND\_base}$ or the calculated $C_{Guard\_base}$ to the force signal value calculator 55C.

The capacitance at force application calculator 54C calculates the capacitance $C_{GND\_finger}$ or the capacitance $C_{Guard\_finger}$ on the basis of the capacitance caused in the intermediate electrode ELC when the potential of the electrode SUS is caused to be the reference potential, or when the signal having the same phase and the same amplitude as the drive signal Vcomts2 is applied to the electrode SUS. The capacitance at force application calculator 54C outputs the calculated capacitance $C_{GND\_finger}$ or the calculated capacitance $C_{Guard\_finger}$ to the force signal value calculator 55C.

The force signal value calculator 55C calculates the first influence amount $C_{force\_C1}$ on the basis of the capacitance $C_{Guard\_finger}$ and the capacitance $C_{Guard\_base}$. The force signal value calculator 55C calculates the second influence amount $C_{force\_C2}$ on the basis of the capacitance $C_{GND\_finger}$, the capacitance $C_{Guard\_finger}$, the capacitance $C_{GND\_base}$, and the capacitance $C_{Guard\_base}$. Then, the force signal value calculator 55C calculates the force signal value $C_{force}$ by the expression (34) on the basis of the first influence amount $C_{force\_C1}$ and the second influence amount $C_{force\_C2}$.

An operation flow of the force detection controller 50C is similar to the operation flow (see FIG. 31) of the force detection controller 50 according to the embodiment, and thus description is omitted.

Favorable embodiments of the present invention have been described. However, the present invention is not limited by these embodiments. The content disclosed in the embodiments is merely an example, and various modifications can be made without departing from the gist of the present invention. The appropriate modifications made without departing from the gist of the present invention obviously belong to the technical scope of the present invention.

What is claimed is:

1. A force detection apparatus comprising:
a first electrode facing an input surface to which an object to be detected applies a force;
a second electrode facing the first electrode across a first layer, wherein the first layer is deformable by the force;
a conductor facing the second electrode across a second layer, wherein the second layer is deformable by the force; and
a force detection controller calculates a force signal value indicating the force, based on a first influence amount and a second influence amount, the first influence amount being an amount of influence added by the force to first capacitance between the first electrode and the second electrode, and the second influence amount being an amount of influence added by the force to second capacitance between the second electrode and the conductor,
wherein only the first layer becomes thin without deforming the second layer that is farther to the input surface than the first layer when applying the force less than a predetermined magnitude to the input surface, and
wherein the first layer and the second layer become elastically deformed when applying the force no less than the predetermined magnitude to the input surface causes.

2. The force detection apparatus according to claim 1,
wherein the conductor is coupled with a reference potential, and
wherein the force detection controller includes:
a potential controller that sets a potential of the second electrode to be the reference potential, causing the potential of the second electrode to be high impedance, and that applies, to the second electrode, a signal that is substantially the same as a drive signal to be applied to the first electrode;
a reference capacitance calculator that calculates reference first capacitance and reference second capacitance, based on capacitance caused in the first electrode when the potential of the second electrode is caused to be the reference potential or the high impedance, or when the signal that is substantially the same as the drive signal is applied to the second electrode, the reference first capacitance being the first capacitance occurring when the force is not applied, and the reference second capacitance being the second capacitance occurring when the force is not applied;
a capacitance at force application calculator that calculates first capacitance at force application and second capacitance at force application, based on capacitance caused in the first electrode when the potential of the second electrode is caused to be the reference potential or the high impedance, or when the signal that is substantially the same as the drive signal is applied to the second electrode, the first capacitance at force application being the first capacitance occurring when the force is applied, and the second capacitance at force application being the second capacitance occurring when the force is applied; and
a force signal value calculator that calculates the first influence amount based on the reference first capacitance and the first capacitance at force application, calculates the second influence amount based on the reference second capacitance and the second capacitance at force application, and calculates the force signal value based on the first influence amount and the second influence amount.

3. The force detection apparatus according to claim 2,
wherein the force signal value calculator calculates the force signal value according to a sum of a product of the first influence amount and a predetermined first constant, and a product of the second influence amount and a predetermined second constant.

4. The force detection apparatus according to claim 3,
wherein the force signal value calculator subtracts the first capacitance at force application from the reference first capacitance to calculate the first influence amount, and
wherein the force signal value calculator subtracts the second capacitance at force application from the reference second capacitance to calculate the second influence amount.

5. The force detection apparatus according to claim 3,
wherein the force signal value calculator subtracts a reciprocal of the first capacitance at force application from a reciprocal of the reference first capacitance to calculate the first influence amount, and
wherein the force signal value calculator subtracts a reciprocal of the second capacitance at force application from a reciprocal of the reference second capacitance to calculate the second influence amount.

6. The force detection apparatus according to claim 2,
wherein the potential controller has a first period in which the potential controller causes the potential of the second electrode to be the reference potential, a second period in which the potential controller causes the potential of the second electrode to be the high impedance, and a third period in which the potential controller applies, to the second electrode, the signal that is substantially the same as the drive signal to be applied to the first electrode.

7. The force detection apparatus according to claim 2,
wherein the potential controller has a first period in which the potential controller causes the potential of the second electrode to be the reference potential, and a second period in which the potential controller causes the potential of the second electrode to be the high impedance, and
wherein the potential controller applies, to the second electrode, the signal that is substantially the same as the drive signal to be applied to the first electrode, in place of causing the potential of the second electrode to be the reference potential or the high impedance, in one of or in both the first period and the second period at predetermined periodic timing.

8. The force detection apparatus according to claim 1, further comprising:
a liquid crystal display device that displays an image toward the input surface;
a lighting apparatus that is arranged between the first layer and the second electrode, and emits light toward the liquid crystal display device; and
a substrate that supplies power to the lighting apparatus, wherein the first electrode is provided in the liquid crystal display device, wherein the substrate extends to a force detection region where the force is detected, and wherein the second electrode is arranged on the substrate.

9. The force detection apparatus according to claim 1, further comprising:

a liquid crystal display device that displays an image toward the input surface;

a lighting apparatus that is arranged between the first layer and the second electrode, and emits light toward the liquid crystal display device; and a substrate that supplies power to the lighting apparatus, wherein the first electrode is provided in the liquid crystal display device, and wherein the second electrode is arranged on a back surface of the lighting apparatus, and is coupled with the substrate.

10. The force detection apparatus according to claim 1, wherein the first electrode is coupled with a second reference potential, and wherein the force detection controller includes:

a potential controller that sets a potential of the conductor to be a reference potential, and that applies, to the conductor, a signal that is substantially the same as a drive signal to be applied to the second electrode;

a reference capacitance calculator that calculates third capacitance and fourth capacitance, the third capacitance being caused in the second electrode when the potential of the conductor is caused to be the reference potential while the force is not applied, and the fourth capacitance being caused in the second electrode when the signal that is substantially the same as the drive signal is applied to the conductor while the force is not applied;

a capacitance at force application calculator that calculates fifth capacitance and sixth capacitance, the fifth capacitance being caused in the second electrode when the potential of the conductor is caused to be the reference potential while the force is applied, and the sixth capacitance being caused in the second electrode when the signal that is substantially the same as the drive signal is applied to the conductor while the force is applied; and a force signal value calculator that calculates the first influence amount based on the fourth capacitance and the sixth capacitance, calculates the second influence amount based on the third capacitance, the fourth capacitance, the fifth capacitance, and the sixth capacitance, and calculates the force signal value based on the first influence amount and the second influence amount.

11. The force detection apparatus according to claim 10, wherein the force signal value calculator calculates the force signal value according to a sum of a product of the first influence amount and a predetermined first constant, and a product of the second influence amount and a predetermined second constant.

12. The force detection apparatus according to claim 11, wherein the force signal value calculator subtracts the fourth capacitance from the sixth capacitance to calculate the first influence amount, and wherein the force signal value calculator calculates the second influence amount using a following expression:

$$A = B - C - D + E$$

where A represents the second influence amount, B represents the fifth capacitance, C represents the sixth capacitance, D represents the third capacitance, and E represents the fourth capacitance.

13. The force detection apparatus according to claim 10, further comprising an organic electro-luminescence display device that displays an image toward the input surface, wherein the first electrode is one of an anode and a cathode that form an organic electro-luminescence element.

* * * * *